(12) United States Patent
Konishi

(10) Patent No.: US 9,006,006 B2
(45) Date of Patent: Apr. 14, 2015

(54) MANUFACTURING METHOD FOR LIGHT-EMITTING DEVICE COMPRISING MULTI-STEP CURED SILICON RESIN

(75) Inventor: Masahiro Konishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/348,742

(22) PCT Filed: Jun. 25, 2012

(86) PCT No.: PCT/JP2012/066174
§ 371 (c)(1),
(2), (4) Date: Mar. 31, 2014

(87) PCT Pub. No.: WO2013/080596
PCT Pub. Date: Jun. 6, 2013

(65) Prior Publication Data
US 2015/0004726 A1    Jan. 1, 2015

(30) Foreign Application Priority Data

Nov. 29, 2011 (JP) .................................. 2011-260936
Jan. 31, 2012 (JP) .................................. 2012-019150

(51) Int. Cl.
H01L 21/00       (2006.01)
H01L 33/56       (2010.01)
H01L 33/50       (2010.01)
H01L 33/58       (2010.01)

(52) U.S. Cl.
CPC .............. *H01L 33/56* (2013.01); *H01L 33/502* (2013.01); *H01L 33/58* (2013.01); *H01L 2933/005* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| 5,635,115 | A  | 6/1997  | Konishi et al. |
| 6,319,425 | B1 | 11/2001 | Tasaki et al.  |
| 2002/0030292 | A1 | 3/2002 | Tasaki et al. |
| 2006/0118973 | A1 | 6/2006 | Harada et al. |
| 2006/0186431 | A1 | 8/2006 | Miki et al. |
| 2008/0194061 | A1 | 8/2008 | Medendorp |
| 2009/0020779 | A1 | 1/2009 | Yamada et al. |

(Continued)

FOREIGN PATENT DOCUMENTS

| CN | 101834235 | 9/2010 |
| EP | 0 684 648 A2 | 11/1995 |

(Continued)

OTHER PUBLICATIONS

International Search Report, mailed Sep. 25, 2012, directed to International Application No. PCT/JP2012/066174, 4 pgs.

*Primary Examiner* — Davienne Monbleau
*Assistant Examiner* — Shaka White
(74) *Attorney, Agent, or Firm* — Morrison & Foerster LLP

(57) ABSTRACT

A light-emitting device production method includes a positioning step of positioning, in a light-emitting element, a sealing member at least containing a silicone resin semi-cured at a room temperature ($T_0$) by primary cross-linking and a fluorescent material, the silicone resin decreasing in viscosity reversibly in a temperature region between the room temperature ($T_0$) and a temperature lower than a secondary cross-linking temperature ($T_1$), and being totally cured non-reversibly in a temperature region equal to or higher than the secondary cross-linking temperature ($T_1$).

25 Claims, 34 Drawing Sheets

(56) References Cited

U.S. PATENT DOCUMENTS

| | | |
|---|---|---|
| 2009/0272995 A1 | 11/2009 | Ito et al. |
| 2010/0022040 A1 | 1/2010 | Konishi et al. |
| 2010/0148378 A1 | 6/2010 | Katayama et al. |
| 2012/0028388 A1* | 2/2012 | Katayama ............... 438/27 |
| 2012/0083056 A1* | 4/2012 | Shinbori et al. ........... 438/27 |
| 2012/0112211 A1 | 5/2012 | Fujii et al. |
| 2013/0125365 A1 | 5/2013 | Goto et al. |

FOREIGN PATENT DOCUMENTS

| | | |
|---|---|---|
| JP | 08-45972 | 2/1996 |
| JP | 2002-327126 | 11/2002 |
| JP | 2006-140362 | 6/2006 |
| JP | 2006-229054 A | 8/2006 |
| JP | 2007-91960 | 4/2007 |
| JP | 2007-235104 | 9/2007 |
| JP | 2008-211205 | 9/2008 |
| JP | 2008-252119 | 10/2008 |
| JP | 2009-010109 | 1/2009 |
| JP | 2009-259868 A | 11/2009 |
| JP | 2010-027974 A | 2/2010 |
| JP | 2010-159411 | 7/2010 |
| JP | 2010-285593 A | 12/2010 |
| JP | 2011-138831 A | 7/2011 |
| JP | 2011-138985 | 7/2011 |
| JP | 2011-202099 | 10/2011 |
| JP | 2012-102167 | 5/2012 |
| WO | WO-2010/032179 A1 | 3/2010 |
| WO | WO-2011/102272 A1 | 8/2011 |

* cited by examiner

F I G. 4
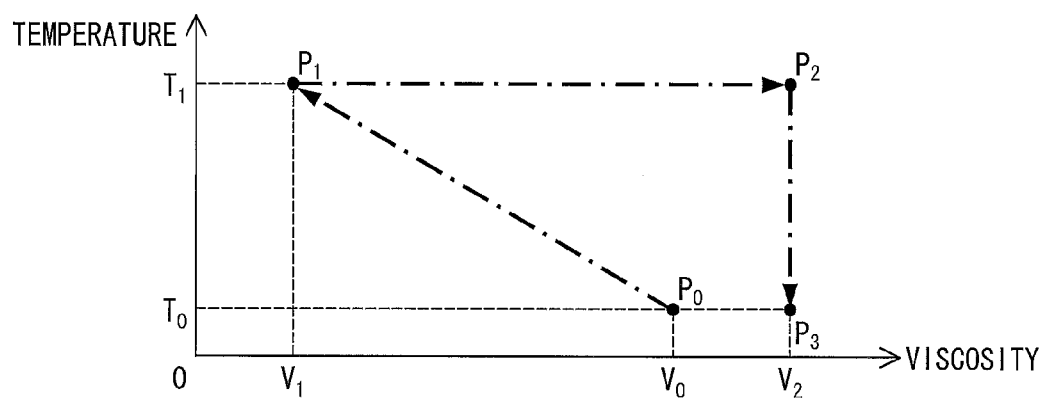

FIG. 8

| | CONVENTIONAL CASTING SEALING METHOD | SEAT RESIN METHOD OF THE PRESENT EMBODIMENT |
|---|---|---|
| CHROMATICITY DISTRIBUTION WIDTH | 15 RANKS (15 DIVISIONS)<br>X : 304/1000<br>y : 443/1000 | 3 RANKS (3 DIVISIONS)<br>X : 131/1000<br>y : 127/1000 |
| SURFACE STATE | NATURAL STANDING OF LIQUID SURFACE | TRANSCRIPTION OF SURFACE SHAPE OF HEATING PLATE (TRANSCRIPTION OF SURFACE OF RELEASE PAPER) |
| PRODUCTION EFFICIENCY/MOLDING TIME | ONLY CASTING<br>4 HEADS 207 SECONDS<br>6 HEADS 138 SECONDS<br>6 HEADS 0.17 SECOND/pcs | TACT 120 SECONDS COMPLETION OF PRIMARY CURING<br>DURING SIMULTANEOUS PRESSING OF THREE SUBSTRATES<br>0.049 SECOND/pcs |
| AMOUNT OF WASTE RESIN AND WASTE FLUORESCENT MATERIAL (WITH RESPECT TO 100 PARTS OF SEALING RESIN) | 50 PARTS | 10 PARTS |

F I G. 1 0
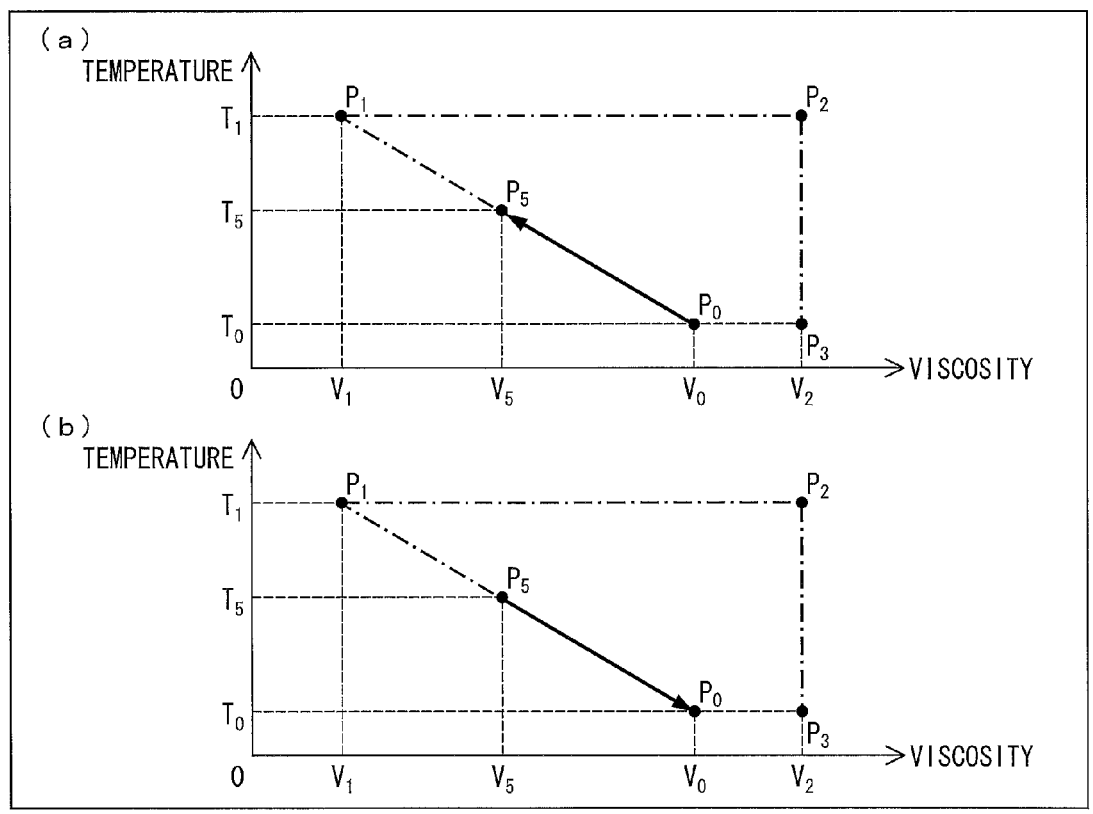

F I G. 1 1
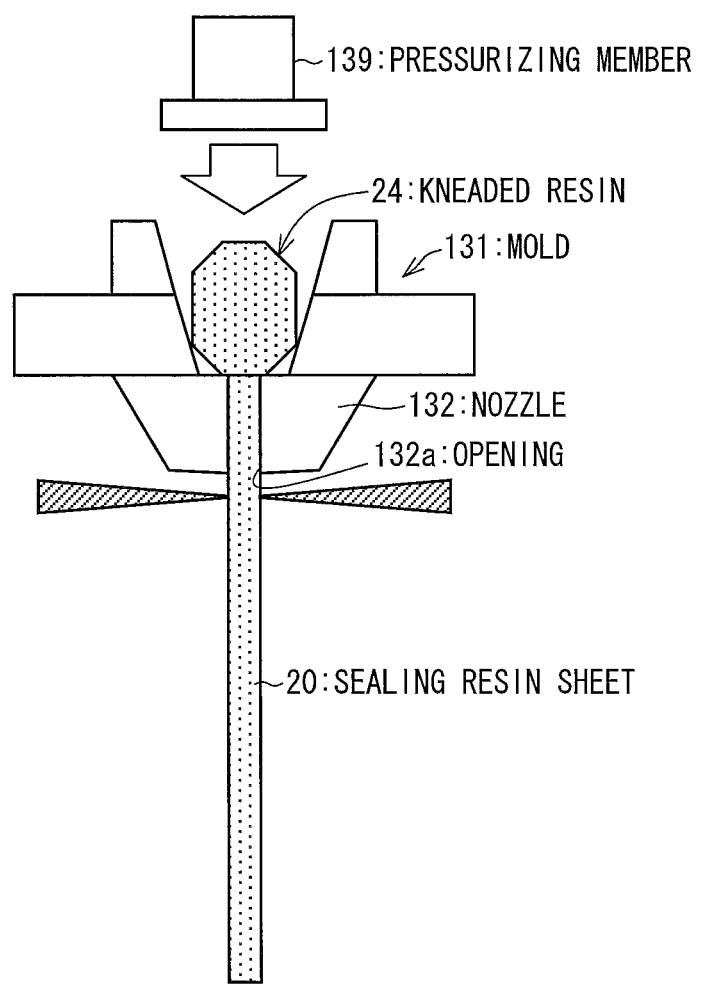

F I G. 1 5
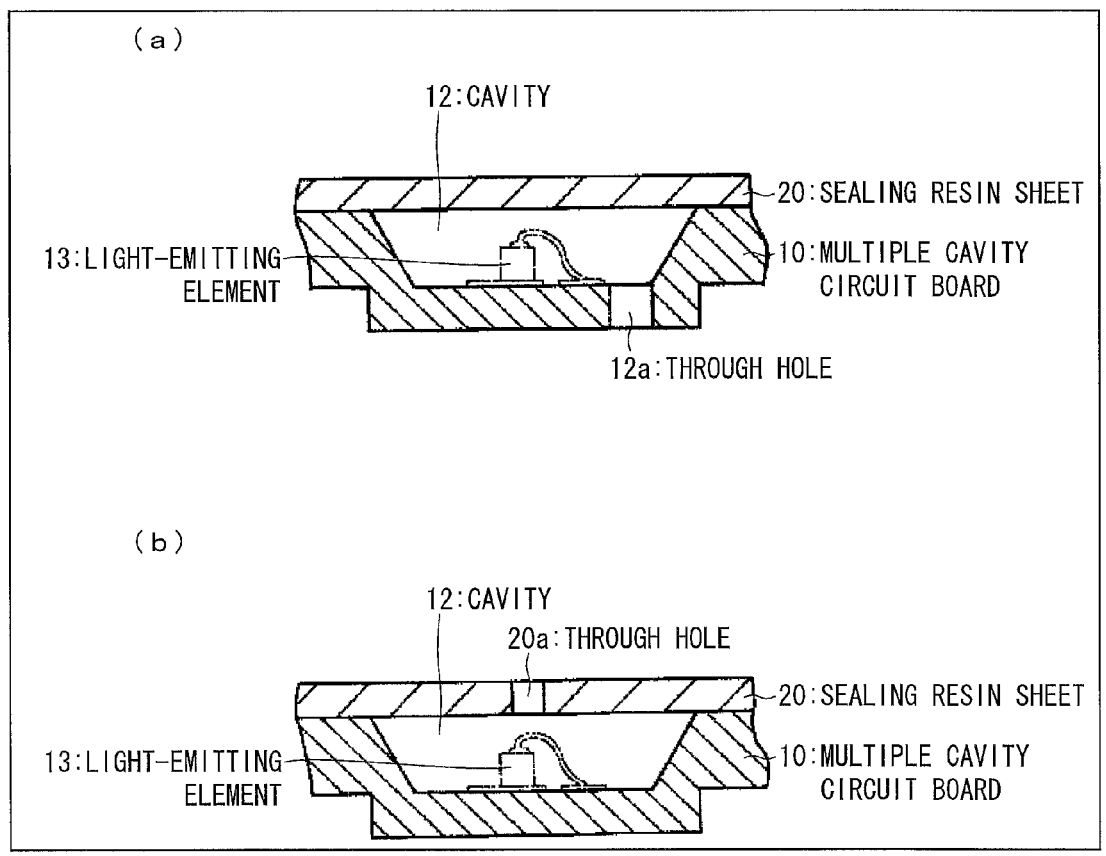

F I G. 2 2
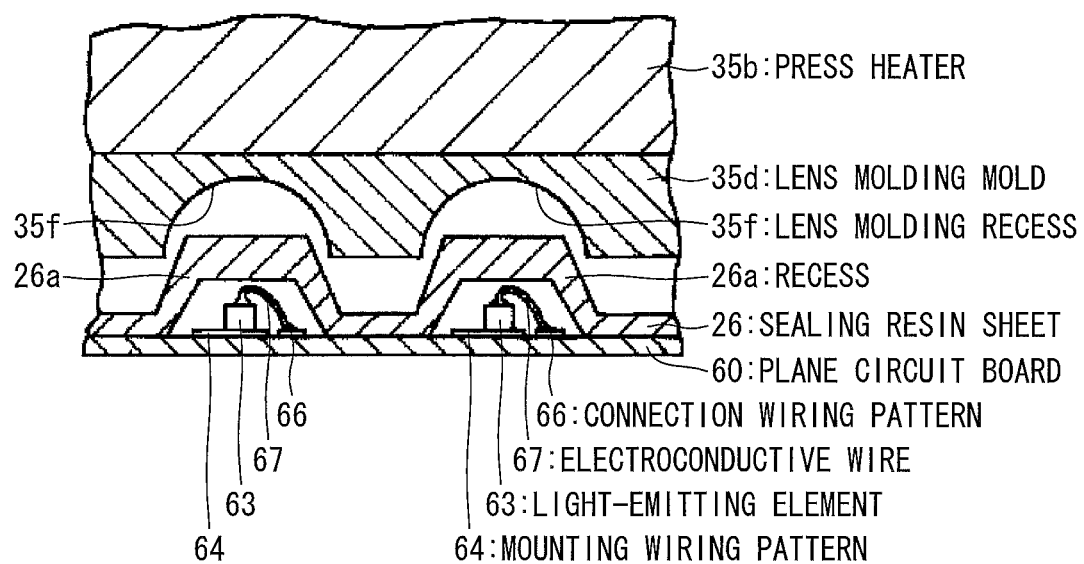

F I G. 2 5
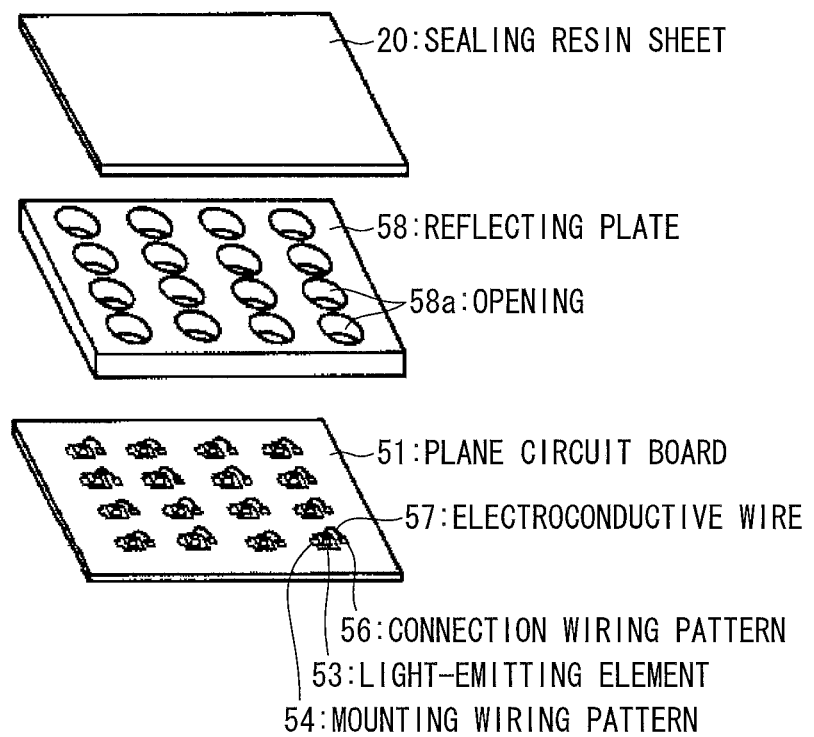

F I G. 2 6
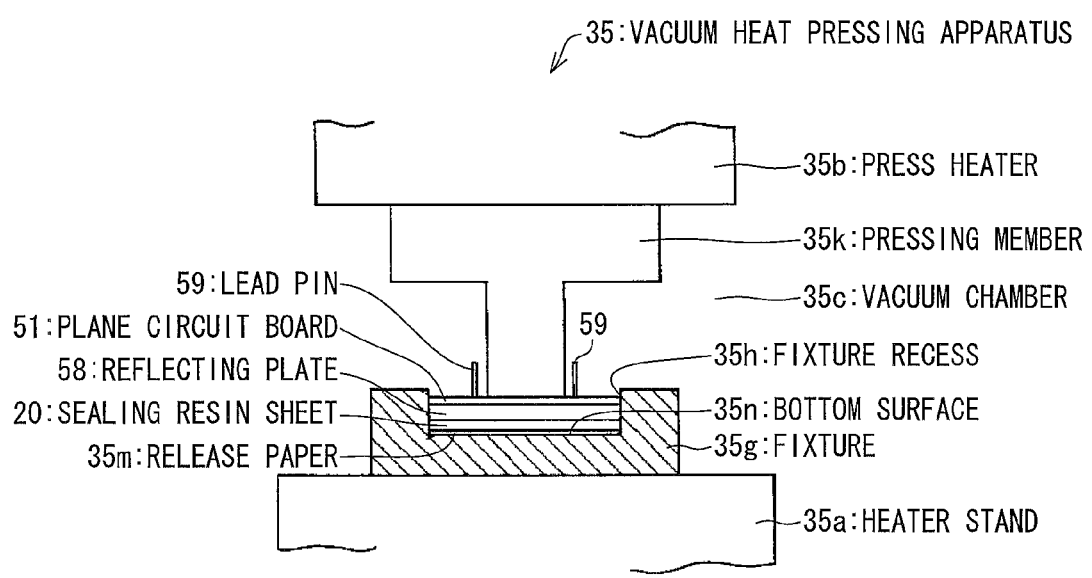

FIG. 29

|  | CONVENTIONAL CASTING SEALING METHOD | SEAT RESIN METHOD OF EMBODIMENT 1 | POWDER APPLICATION METHOD OF THE PRESENT EMBODIMENT |
|---|---|---|---|
| CHROMATICITY DISTRIBUTION WIDTH | 15 RANKS (15 DIVISIONS) X : 304/1000 y : 443/1000 | 3 RANKS (3 DIVISIONS) X : 131/1000 y : 127/1000 | 1 RANK X : 10/1000 y : 10/1000 |
| SURFACE STATE | NATURAL STANDING OF LIQUID SURFACE | TRANSCRIPTION OF SURFACE SHAPE OF HEATING PLATE (TRANSCRIPTION OF SURFACE OF RELEASE PAPER) | NATURAL STANDING OF LIQUID SURFACE |
| PRODUCTION EFFICIENCY/ MOLDING TIME | ONLY CASTING 4 HEADS 207 SECONDS 6 HEADS 138 SECONDS (6 HEADS 0.17 SECOND/pcs) | TACT 120 SECONDS COMPLETION OF PRIMARY CURING DURING SIMULTANEOUS PRESSING OF THREE SUBSTRATES 0.049 SECOND/pcs |  |
| AMOUNT OF WASTE RESIN AND WASTE FLUORESCENT MATERIAL (WITH RESPECT TO 100 PARTS OF SEALING RESIN) | 50 PARTS | 10 PARTS | 0 (ZERO) PART IN PRINCIPLE |

PRIOR ART

F I G. 3 4
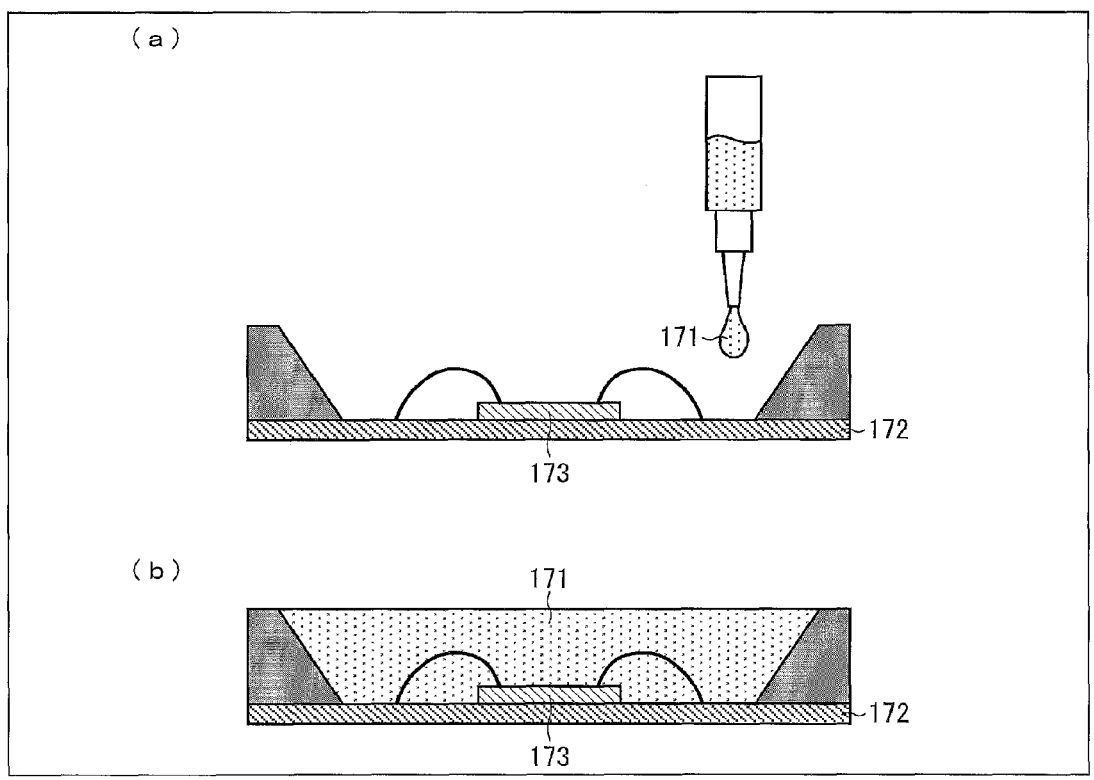
PRIOR ART

MANUFACTURING METHOD FOR LIGHT-EMITTING DEVICE COMPRISING MULTI-STEP CURED SILICON RESIN

CROSS-REFERENCE TO RELATED APPLICATIONS

This application is a national stage application under 35 USC 371 of International Application No. PCT/JP2012/066174, filed Jun. 25, 2012, which claims the priority of Japanese Applications No. 2011-260936, filed Nov. 29, 2011, and 2012-019150, filed Jan. 31, 2012, the contents of which prior applications are incorporated herein by reference.

FIELD OF THE INVENTION

The present invention relates to a method for producing a light-emitting device in which a fluorescent material is used.

BACKGROUND OF THE INVENTION

A light-emitting device in which an LED chip and a fluorescent material are used, the fluorescent material emitting fluorescence by being excited by light emission by the LED chip, is classified into the following known types according to how to provide the fluorescent material in a vicinity of the LED chip.

The known types include a two-stage sealing type (Patent Literature 1) in which an LED chip 151 is sealed by carrying out compression molding with respect to a sealing resin 153 containing a fluorescent material 152, and the sealing resin 153 is sealed by further carrying out compression molding with respect to a sealing resin 154 that is transparent (see (a) of FIG. 33).

A light-emitting device of this type deteriorates in productivity since compression molding needs to be carried out two times. Further, compression molding carried out two times requires two molds, and respective shapes of the sealing resin 153 containing the fluorescent material 152 and the sealing resin 154 are determined while the sealing resins 153 and 154 are being subjected to compression molding. Therefore, a change in size of the LED chip 151 changes an amount of the sealing resin 153 containing the fluorescent material 152 (a relative thickness of the sealing resin 153) (see (b) of FIG. 33). This may cause a change in color of emitted light. Therefore, in order to obtain an unchanged color of the emitted light, it is necessary to adjust a concentration (contained amount) of the fluorescent material 152 or to change the shape of the sealing resin 153 by replacing the mold with another mold.

The known types also include a precipitation type (Patent Literature 2) in which an LED chip is sealed by carrying out compression molding with respect to a sealing resin containing a fluorescent material, and precipitating the fluorescent material contained in the sealing resin so as to spread the fluorescent material in a vicinity of the LED chip.

This type makes it difficult to cause the fluorescent material to be precipitated and spread in a stable amount. This is (i) because it is difficult for resins for compression molding (most of which contain silicone), which are higher in viscosity than resins for transfer potting, to precipitate the fluorescent material and (ii) because a resin is cured in a short time during compression molding, so that the resin is cured before the fluorescent material is precipitated.

The known types also include a sheet covering type in which an LED chip 161 is sealed by carrying out compression molding with respect to a transparent sealing resin 162 and covering a vicinity of the transparent sealing resin 162 with a resin sheet 164 containing a fluorescent material 163 (see (c) of FIG. 33).

According to this type, light emitted by the LED chip 161 is partially reflected in an inner surface of the resin sheet 64 containing the fluorescent material 163 and returns inward, so that a loss occurs in the light. This reduces a light extraction efficiency.

Patent Literature 3 proposes a technique, which is irrelevant to a fluorescent material, for covering an LED chip connected to a substrate with a heat-curable film (an epoxy resin composition), and sealing the LED chip by heat-curing the heat-curable film. Patent Literature 4 proposes a technique in which a sealing sheet having (i) an outermost resin layer (e.g., a polycarbodiimide layer), (ii) an optical diffusion layer containing light diffusion particles (e.g., a polycarbodiimide layer), and (iii) a resin layer having a low refractive index (e.g., an epoxy resin layer) is stacked by use of a vacuum laminator on a wiring circuit board mounted with an optical semiconductor element, so as to be pressure-molded by use of a stamper.

Note here that in order to seal an LED chip by use of silicone containing a fluorescent material, normally, a substrate 172 is filled with silicone 171 that is in a liquid state and contains a fluorescent material (see (a) of FIG. 34) and then an LED chip 173 is sealed by heating the silicone 171 by use of an oven or the like (see (b) of FIG. 34). This causes a problem (i) such that a concentration of the fluorescent material contained in the silicone 171 sensitively changes in accordance with an environment in which each process is carried out and (ii) such that a viscosity of the silicone 171 changes in accordance with an ambient environment.

In order to solve this problem, Patent Literature 5, for example discloses a technique for molding, into sheet semi-cured silicone, liquid silicone in which a fluorescent material is mixed. According to the technique disclosed in Patent Literature 5, molding, into sheet semi-cured silicone, of liquid silicone in which a fluorescent material is mixed allows an improvement in treatment of silicone, and prevents a change in viscosity in accordance with an ambient environment.

Patent Literature 1
 Japanese Patent Application Publication, Tokukai, No. 2008-211205A (Publication Date: Sep. 11, 2008)
Patent Literature 2
 Japanese Patent Application Publication, Tokukai, No. 2006-229054A (Publication Date: Aug. 31, 2006)
Patent Literature 3
 Japanese Patent Application Publication, Tokukai, No. 2009-010109A (Publication Date: Jan. 15, 2009)
Patent Literature 4
 Japanese Patent Application Publication, Tokukai, No. 2006-140362A (Publication Date: Jun. 1, 2006)
Patent Literature 5
 Japanese Patent Application Publication, Tokukai, No. 2010-159411A (Publication Date: Jul. 22, 2010)

SUMMARY OF THE INVENTION

However, according to the technique disclosed in Patent Literature 5, liquid silicone in which a fluorescent material is mixed is molded into sheet semi-cured silicone. Therefore, the fluorescent material, which is larger in specific gravity than silicone, flows and is precipitated in the liquid silicone, so that the fluorescent material is unevenly dispersed in a sheet obtained by the molding. Accordingly, in a case where a plurality of light-emitting devices are produced by use of this sheet, the plurality of light-emitting devices contain the fluorescent material in different amounts. This causes a blur in color of emitted light and/or a variation in characteristic among the plurality of light-emitting devices. Therefore, a conventional method has a problem such that many light-emitting devices outside a target chromaticity range are produced, so that a yield rate for products is reduced.

The present invention has been made in view of the problem, and an object of the present invention is to provide a light-emitting device production method that allows (i) equalization of a concentration of a fluorescent material among light-emitting devices and (ii) a smaller variation in chromaticity value which variation is caused by a fluorescent material concentration and a fluorescent material contained amount.

In order to attain the object of the present invention, a light-emitting device production method in accordance with the present invention includes: a mounting step of mounting at least one light-emitting element on a substrate; a positioning step of positioning a sealing member so that the sealing member faces an upper surface of the at least one light-emitting element mounted in the mounting step, the sealing member at least containing a silicone resin semi-cured by primary cross-linking and a fluorescent material; a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature.

According to the light-emitting device production method, a sealing member is positioned so that the sealing member faces an upper surface of the at least one light-emitting element mounted on the substrate, the sealing member at least containing a silicone resin semi-cured by primary cross-linking and a fluorescent material.

Note here that the silicone resin decreases in viscosity reversibly in a temperature region between a room temperature and the temperature lower than the secondary cross-linking temperature, and is totally cured non-reversibly in a temperature region equal to or higher than the secondary cross-linking temperature. Therefore, a viscosity of the silicone resin can be repeatedly controlled by changing a temperature in the temperature region between the room temperature and the temperature lower than the secondary cross-linking temperature.

Accordingly, for example, in a case where the viscosity of the silicone resin is controlled (reduced), during kneading of the fluorescent material with the silicone resin, to an extent that the kneaded fluorescent material is not precipitated, the fluorescent material can be evenly dispersed in the silicone resin.

Hence, according to the light-emitting device production method, it is possible to obtain a sealing member in which the fluorescent material is evenly dispersed in the silicone resin. Therefore, in a case where a light-emitting element is sealed with the sealing member, it is possible to attain a light-emitting device production method that allows (i) equalization of a concentration of a fluorescent material among light-emitting devices and (ii) a smaller variation in chromaticity value which variation is caused by a fluorescent material concentration and a fluorescent material contained amount.

As described earlier, a light-emitting device production method in accordance with the present invention includes: a mounting step of mounting at least one light-emitting element on a substrate; a positioning step of positioning a sealing member so that the sealing member faces an upper surface of the at least one light-emitting element mounted in the mounting step, the sealing member at least containing a silicone resin semi-cured by primary cross-linking and a fluorescent material; a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature.

Therefore, the present invention yields an effect of providing a light-emitting device production method that allows (i) equalization of a concentration of a fluorescent material among light-emitting devices and (ii) a smaller variation in chromaticity value which variation is caused by a fluorescent material concentration and a fluorescent material contained amount.

BRIEF DESCRIPTION OF THE DRAWINGS

FIG. 4 is a graph showing a viscosity characteristic of a silicone resin of which a sealing resin sheet illustrated in FIG. 3(a) is made.

FIG. 8 is a chart showing data on the light-emitting device production method in accordance with Embodiment 1.

FIGS. 10(a) and 10(b) are graphs each showing a viscosity state of a silicone resin in a process illustrated in FIG. 9(a) through 9(e).

FIG. 11 is a cross-sectional view illustrating another method for forming, into a sheet, a kneaded resin illustrated in FIG. 9(c).

FIG. 14(a) is a vertical cross-sectional view of the cavity, FIG. 14(b) is a plan view of the cavity illustrated in FIGS. 14(a), and 14(c) is a transverse cross-sectional view of the cavity illustrated in FIG. 14(a).

FIG. 15(a) is a cross-sectional view illustrating a cavity whose bottom is provided with a through hole, and FIG. 15(b) is a cross-sectional view illustrating a sealing resin sheet provided with a through hole.

FIG. 22 is a cross-sectional view illustrating a state of pressurized pressing in a vacuum heat pressing apparatus.

FIG. 25 schematically shows an example of a method for producing the light-emitting display device illustrated in each of FIG. 24(a) and FIG. 24(b).

FIG. 26 is a cross-sectional view illustrating a state of pressurized pressing in a vacuum heat pressing apparatus.

FIG. 29 is a chart showing data on the light-emitting device production method in accordance with Embodiment 3.

FIG. 34 is a cross-sectional view illustrating a flow of a conventional light-emitting device production method.

DETAILED DESCRIPTION OF THE INVENTION

The following description discusses, with reference to FIGS. 1 through 20, an embodiment related to a light-emitting device production method in accordance with the present invention.

Figure 1:
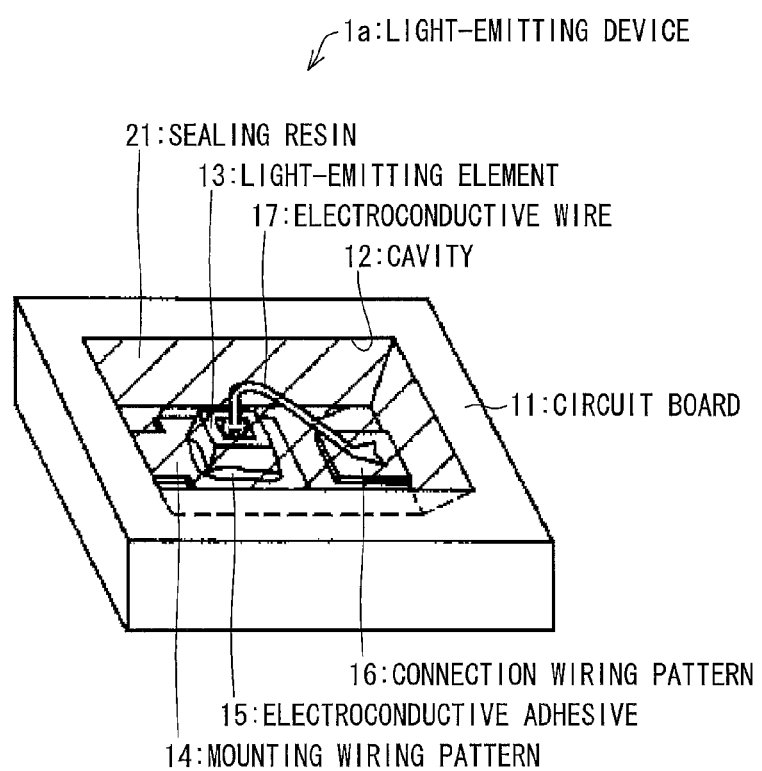
FIG. 1 is a perspective view illustrating a configuration of an appearance of a light-emitting device produced by a light-emitting device production method in accordance with Embodiment 1.

First, the following description discusses, with reference to FIG. 1, a configuration of a light-emitting device 1a in accordance with the present embodiment.

FIG. 1 is a perspective view illustrating a configuration of an appearance of the light-emitting device 1a produced by the light-emitting device production method in accordance with the present embodiment. According to the light-emitting device 1a, a cavity 12 which has a shape of a rectangular parallelepiped and opens upward is provided in a circuit board (substrate) 11 which is an MID (Molded Interconnection Device, three-dimensional injection-molded circuit board) which has a shape of a rectangular parallelepiped having a base approximately 1 mm×1 mm, and a light-emitting element 13 such as an LED is mounted in the cavity 12 (see FIG. 1).

The light-emitting element 13 has a lower surface that is connected (die-bonded), by an electroconductive adhesive 15, to a mounting wiring pattern 14 provided at a bottom of the cavity 12. Furthermore, the light-emitting element 13 has an upper surface that is connected (wire-bonded), via an electroconductive wire 17 made of, for example, a gold wire, to a connection wiring pattern 16 provided at the bottom of the cavity 12.

The cavity 12 of the circuit board 11 is sealed by a sealing resin 21 made of a light-transmissive silicone resin.

Note that how to mount the light-emitting element 13 on the circuit board 11 is not particularly limited. The light-emitting element 13 can be mounted on the circuit board 11 by, for example, a flip chip method instead of a wire bonding method.

Next, the following description discusses, with reference to FIGS. 2 through 8, a method for producing the light-emitting device 1a illustrated in FIG. 1.

FIGS. 2(a) through 2(d) schematically illustrate a process in which light-emitting elements 13 are mounted in respective cavities 12 and which is included in a process for producing the light-emitting device 1a illustrated in FIG. 1. The light-emitting device 1a is produced by use of a multiple cavity circuit board 10 in which the cavities 12 are provided in large numbers vertically and horizontally in a matrix pattern. Use of the multiple cavity circuit board 10 makes it is possible to simultaneously produce light-emitting devices 1a in large numbers. For example, the multiple cavity circuit board 10 has a thickness of 1.0 mm, and the cavities 12 have a depth of 0.6 mm.

First, according to the light-emitting device production method in accordance with the present embodiment, the mounting wiring pattern 14 and the connection wiring pattern 16 are provided at the bottom of each of the cavities 12 (see FIG. 2(a)).

Next, the electroconductive adhesive 15 is applied to the mounting wiring pattern 14 provided at the bottom of each of the cavities 12 of the multiple cavity circuit board 10 (see FIG. 2(b)).

Subsequently, the light-emitting element 13 is die-bonded to the electroconductive adhesive 15 applied to the mounting wiring pattern 14 (FIG. 2(c)). The upper surface of the light-emitting element 13 and the connection wiring pattern 16 provided at the bottom of each of the cavities 12 are wire-bonded via the electroconductive wire 17 made of, for example, a gold wire (see FIG. 2(d)).

After the light-emitting element 13 is thus mounted in each of the cavities 12 of the multiple cavity circuit board 10 by die bonding and wire bonding (a mounting step), the cavities 12 are sealed with a silicone resin containing a fluorescent material.

FIGS. 3(a) through 3(c) schematically illustrate a process in which the cavities 12 are sealed with the sealing resin 21 and which is included in the process for producing the light-emitting device 1a illustrated in FIG. 1. FIG. 4 is a graph showing a viscosity characteristic of the silicone resin of which a sealing resin sheet (sealing member) 20 illustrated in FIG. 3(a) is made. FIGS. 5(a) through 5(d) are graphs each showing a viscosity state of the silicone resin in the process illustrated in FIG. 3(b).

Note that for convenience, the graphs of FIG. 4, and FIGS. 5(a) through 5(d) each show that the viscosity characteristic of the silicone resin changes linearly. However, a silicone resin is not necessarily limited to the silicone resin whose viscosity characteristic changes linearly.

The sealing resin sheet 20, a surface molding release sheet (film) 31, and a weight plate 32 are stacked in this order on the multiple cavity circuit board 10 provided with the cavities 12 in each of which the light-emitting element 13 is mounted (see FIG. 3(a)).

Note here that the present embodiment uses the sealing resin sheet 20 to simultaneously seal the cavities 12 with the sealing resin 21 containing a fluorescent material. The sealing resin sheet 20 is obtained by dispersing the fluorescent material in a silicone resin that is thermoplastic. The silicone resin is in a semi-cured state by being subjected to primary cross-linking, and has a predetermined viscosity. Note that the semi-cured state (B-STAGE) herein refers to a state which lies between a non-cured state (A-STAGE) and a totally-cured state (C-STAGE) and in which the silicone resin has a higher viscosity than in the non-cured state by being subjected to the primary cross-linking.

As shown in FIG. 4, the silicone resin has a viscosity of $V_0$ at a room temperature $T_0$ (see $P_0$ in FIG. 4). The viscosity $V_0$ refers to, for example, a viscosity which allows the silicone resin to maintain a sheet shape so that the sealing resin sheet 20 is easily treated at the room temperature $T_0$.

In a case where the silicone resin is heated from the room temperature $T_0$ to a temperature in a vicinity of a secondary cross-linking temperature $T_1$, the viscosity of the silicone resin gradually decreases, so that the silicone resin has a viscosity of $V_1$ immediately before a temperature of the silicone resin reaches a secondary cross-linking temperature $T_1$ (see $P_1$ of FIG. 4). The viscosity $V_1$ refers to a viscosity at which the silicone resin is melted to be flowable.

The change in viscosity of the silicone resin in a temperature region between the room temperature $T_0$ and a temperature lower than the secondary cross-linking temperature $T_1$ occurs because polymer chains in the silicone resin get entangled with or untied from each other by the Brownian motion, and the change is a heat-reversible change. Accordingly; in a case where the temperature of the silicone resin is decreased from the temperature in the vicinity of the secondary cross-linking temperature $T_1$ to the room temperature $T_0$, the viscosity of the silicone resin increases, and returns to the original viscosity $V_0$ at the room temperature $T_0$. Therefore, it is possible to repeatedly control the viscosity of the silicone resin between the viscosity $V_0$ and the viscosity $V_1$ by changing the temperature of the silicone resin in the temperature region between the room temperature $T_0$ and the temperature lower than the secondary cross-linking temperature $T_1$.

Meanwhile, in a case where the silicone resin is heated at a temperature equal to or higher than the secondary cross-linking temperature $T_1$, the silicone resin is subjected to secondary cross-linking, so that the viscosity of the silicone resin increases from the viscosity $V_1$ to a viscosity $V_2$ (see $P_2$ in FIG. 4). The viscosity $V_2$ refers to a viscosity at which the silicone resin is totally cured.

The change in viscosity of the silicone resin at the secondary cross-linking temperature $T_1$ is a heat-non-reversible change. Therefore, also in a case where the temperature of the silicone resin is decreased from the secondary cross-linking temperature $T_1$ to the room temperature $T_0$, the silicone resin does not change in viscosity, but maintains the totally-cured state (see $P_3$ in FIG. 4).

Various kinds of the fluorescent material are kneaded with the sealing resin sheet 20 in accordance with a required optical characteristic, so that a concentration (contained amount) of the fluorescent material is controlled. In a case where the silicone resin is used, its viscosity can be controlled, provided that the silicone resin is in a state prior to the totally-cured state in which the silicone resin is totally cured by being subjected to secondary cross-linking. This makes it possible to form the sealing resin sheet 20 in which the fluorescent material is evenly dispersed (described later).

In order to cover all the cavities 12 provided in the multiple cavity circuit board 10, the sealing resin sheet 20 is formed to be substantially identical in size to the multiple cavity circuit board 10. Furthermore, it is preferable that the sealing resin sheet 20 be formed to have a thickness of approximately 0.2 to 0.4 mm, which is smaller than a depth (0.6 mm) of the cavities 12.

In order that the sealing resin 21 has a pearskin-finished surface, the surface molding release sheet 31 stacked on the sealing resin sheet 20 is configured to have a pearskin-finished surface with which the sealing resin sheet 20 is in contact. In a case where the surface molding release sheet 31 is used, the light-emitting device 1a can have a higher light extraction efficiency. Furthermore, in a case where a shape of a surface of the surface molding release sheet 31 is changed, a surface of the sealing resin 21 can be processed to be various in design. Note that, in a case where no surface molding release sheet 31 is used, a shape of a surface of the weight plate (mold) 32 may be changed.

Next, as illustrated in FIG. 3(b), the multiple cavity circuit board 10, the sealing resin sheet 20, the surface molding release sheet 31, and the weight plate 32, which are stacked, are set in a vacuum heating furnace 33, and then heated and melted (a melting step).

Figure 5:
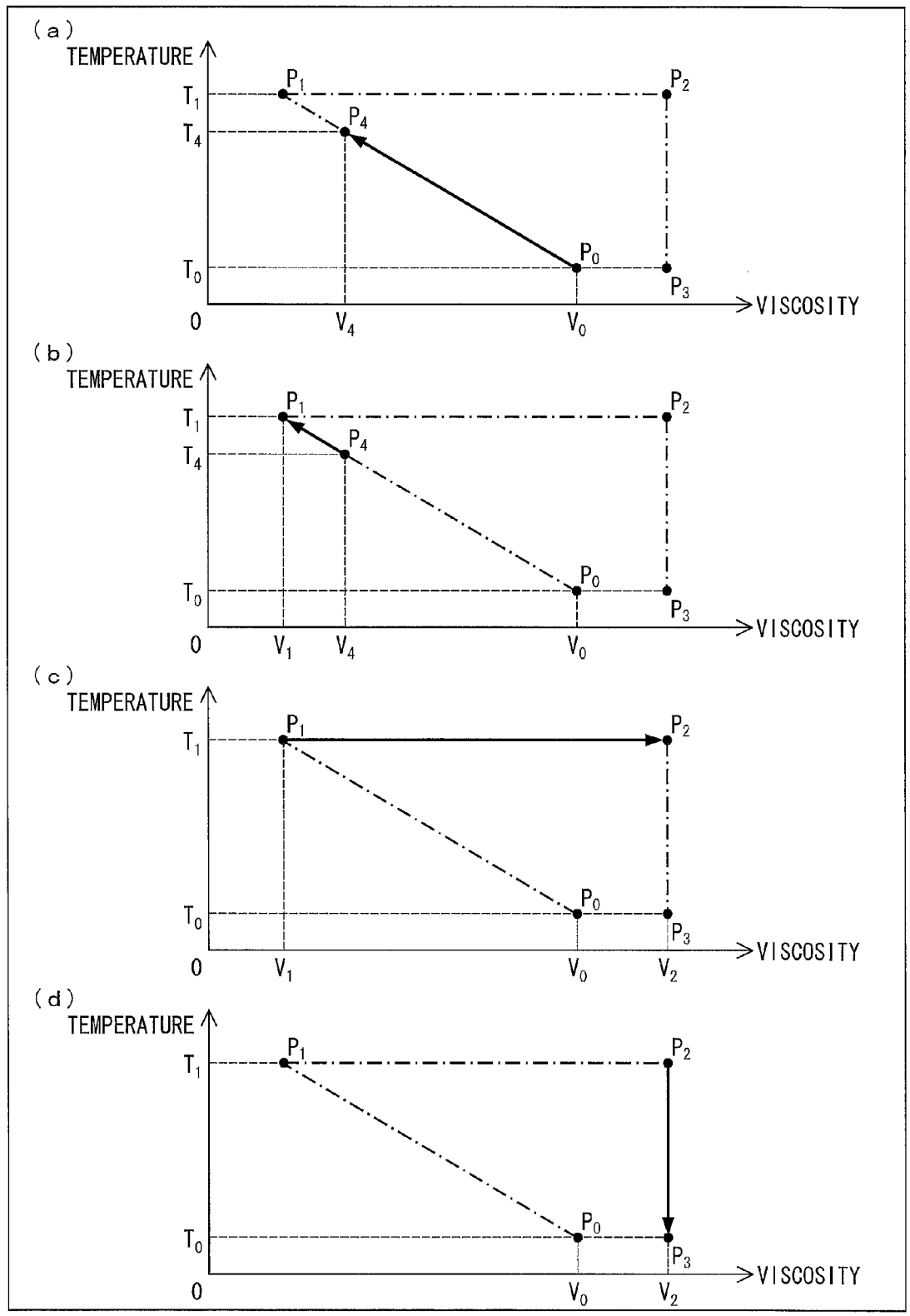
FIGS. 5(a) through 5(d) are graphs each showing a viscosity state of the silicone resin in the process illustrated in FIG. 3(b).
Figure 6:
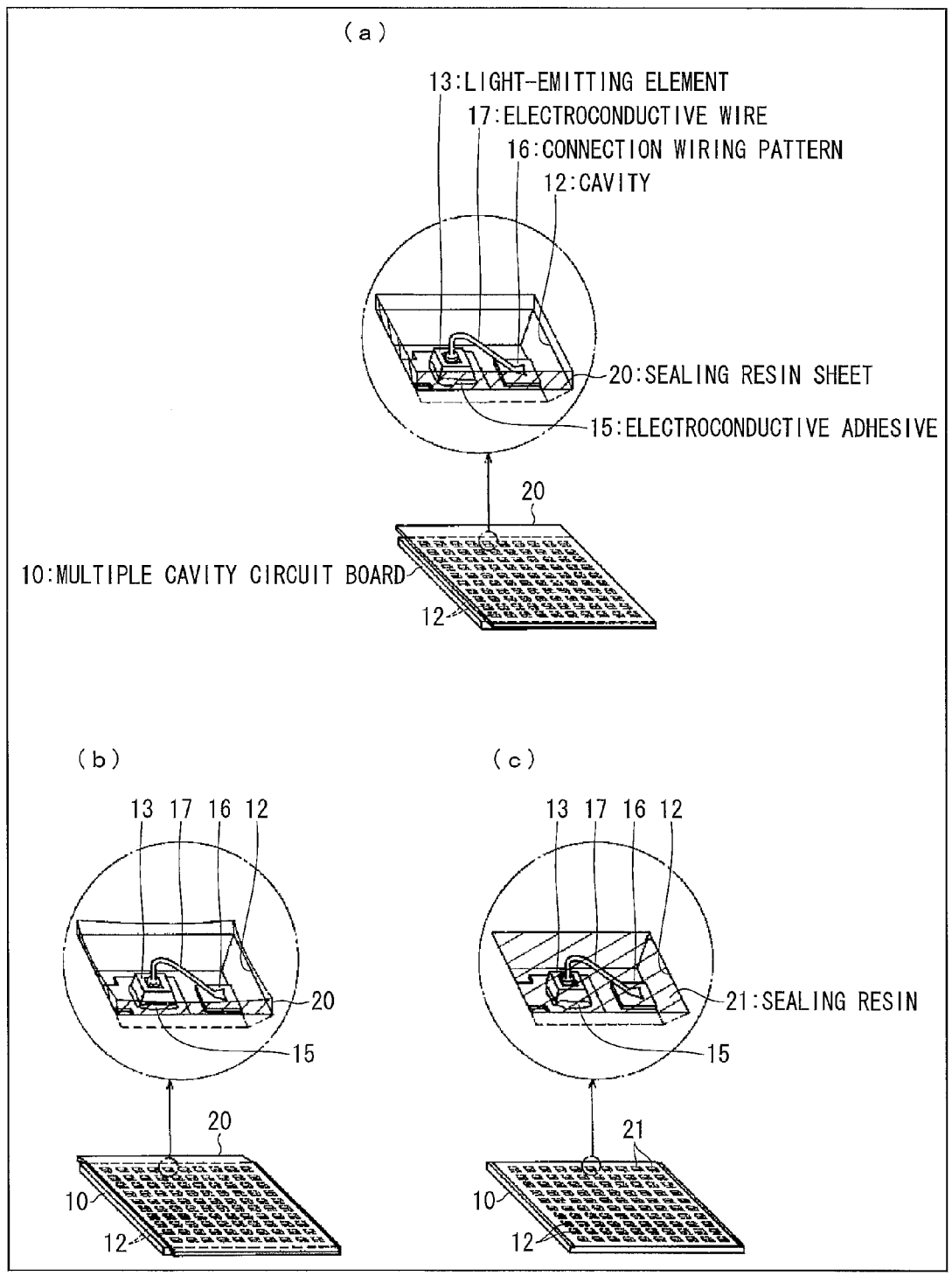
FIGS. 6(a) through 6(c) each schematically illustrate a state of the sealing resin sheet in a vacuum heating furnace illustrated in FIG. 3(b).

In the melting step, as shown in FIG. 5(a), the sealing resin sheet 20 is heated from the room temperature $T_0$ to a temperature $T_4$ (e.g., not lower than 80° C. and lower than 120° C.) which is in a vicinity of the secondary cross-linking temperature $T_1$, so that the viscosity of the silicone resin is decreased to a viscosity $V_4$ at which the silicone resin is flowable (see $P_4$ in FIG. 5).

The vacuum heating furnace 33 is configured to carry out heating while causing an inner part thereof to be in a vacuum state. The sealing resin sheet 20 and the surface molding release sheet 31 which are provided on the multiple cavity circuit board 10 and are in the vacuum state are heated in close contact with each other while being pressed by the weight plate 32. This causes a melted silicone resin to flow into the cavities 12, which can be filled with the melted silicone resin. In this case, a melted silicone resin remaining on a surface, between the respective cavities 12, of the multiple cavity circuit board 10 also flows into the cavities 12. Accordingly, also in a case where the sealing resin sheet 20 is set to have a thickness smaller than the depth of the cavities 12 (approximately ⅗ of the depth of the cavities 12) as described earlier, the cavities 12 are almost full of the melted silicone resin. As a matter of course, the sealing resin sheet 20 may have a larger thickness. However, this case produces, in large amounts, the silicone resin and the fluorescent material which overflow from a rim of the weight plate 32 and are not used to seal the cavities 12. The silicone resin and the fluorescent material which overflow from the rim of the weight plate 32 cannot be reused, and thus need to be disposed of. Accordingly, in view of material costs of the silicone resin and the fluorescent material, it is preferable that the sealing resin sheet 20 be set to have a thickness smaller than the depth of the cavities 12 as described earlier.

The melted silicone resin, which has been filled in the cavities 12, is totally cured by being further heated to a higher temperature (a curing step).

In this curing step, as shown in FIG. 5(b), the sealing resin sheet 20 is heated at a temperature between the temperature $T_4$ and the secondary cross-linking temperature $T_1$ (e.g., not lower than 120° C. and not higher than 170° C.) (see $P_1$ in FIG. 5(b)). According to this, as shown in FIG. 5(c), the silicone resin is subjected to secondary cross-linking, and the silicone resin is totally cured (see $P_2$ in FIG. 5(c)).

Next, as shown in FIG. 3(c), after the silicone resin is totally cured, the multiple cavity circuit board 10 on which the sealing resin sheet 20, the surface molding release sheet 31, and the weight plate 32 are stacked is taken out from the vacuum heating furnace 33, and a temperature of the silicone resin is decreased to the room temperature $T_0$. In this case, as shown in FIG. 5(d), also in a case where the temperature decreases to the room temperature $T_0$, the silicone resin which has been subjected to secondary cross-linking maintains the totally-cured state (see $P_3$ in FIG. 5(d)).

Then, the weight plate 32 and the surface molding release sheet 31 are removed from the multiple cavity circuit board 10 in order. This causes the light-emitting element 13 in each of the cavities 12 to be sealed with the sealing resin 21 having the pearskin-finished surface.

FIGS. 6(a) through 6(c) each schematically illustrate a state of the sealing resin sheet 20 in the vacuum heating furnace 33 illustrated in FIG. 3(b). The sealing resin sheet 20 maintains a sheet shape at the room temperature $T_0$ when being set in the vacuum heating furnace 33 (see FIG. 6(a)). However, the heating started by the vacuum heating furnace 33 causes the sealing resin sheet 20 to decrease in viscosity, so that the sealing resin sheet 20 is in a curved state (see FIG. 6(b)). Then, in a case where the heating is continued until the sealing resin sheet 20 has a temperature of approximately 100° C., the silicone resin melts, and flows into the cavities 12 (see FIG. 6(c)).

In this case, since the sealing resin sheet 20 is pressed by the weight plate 32, the melted silicone resin is evenly filled in the cavities 12 by a tension caused by the silicone resin having flowed into the cavities 12. According to the present embodiment, a heating time of approximately 30 minutes is necessary for the melted silicone resin to be filled in the cavities 12.

After the sealing resin sheet 20 is melted and the melted silicone resin is filled in the cavities 12, the multiple cavity circuit board 10 is heated to a temperature of approximately 150° C. while being contained in the vacuum heat pressing apparatus 33.

In this case, during such a heating process, the melted silicone resin further decreases in viscosity before its temperature reaches the secondary cross-linking temperature $T_1$. Therefore, the melted silicone resin remaining on the surface, between the respective cavities 12, of the multiple cavity circuit board 10 flows into adjacent ones of the cavities 12. This prevents the melted silicone resin from remaining on the surface of the multiple cavity circuit board 10. Therefore, also in a case where the sealing resin sheet 20 is formed to have a thickness smaller than the depth of the cavities 12, the cavities 12 are almost full of the melted silicone resin.

The silicone resin filled in the cavities 12 is totally cured by secondary cross-linking by being heated to a high temperature of 150° C. by the vacuum heating furnace 33. According to the present embodiment, a heating time of 30 minutes is necessary for the melted silicone resin in the cavities 12 to be subjected to secondary cross-linking and then totally cured.

As described above, the melted silicone resin can be filled in the cavities 12 by melting the sealing resin sheet 20 in a state in which the sealing resin sheet 20 is in close contact with the surface of the surface molding release sheet 31. Thereafter, it is possible to form the sealing resin 21 by further heating the melted silicone resin to the secondary cross-linking temperature.

Figure 7:
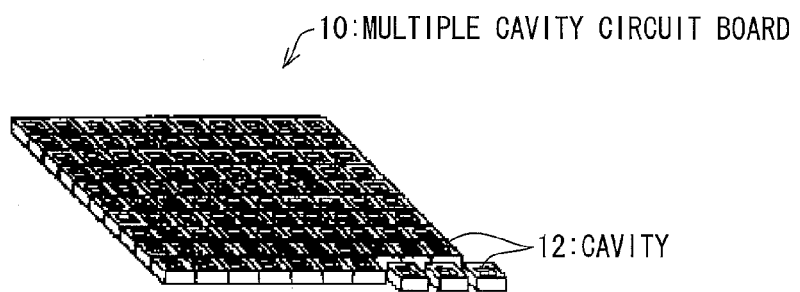
FIG. 7 schematically illustrates a process in which a multiple cavity circuit board illustrated in FIG. 3(c) is divided and which is included in the process for producing the light-emitting device illustrated in FIG. 1.

FIG. 7 schematically illustrates a process in which the multiple cavity circuit board 10 illustrated in FIG. 3(c) is divided and which is included in the process for producing the light-emitting device 1a illustrated in FIG. 1. As illustrated in FIG. 7, after the light-emitting elements 13 in the respective cavities 12 are sealed with the sealing resin 21, the multiple cavity circuit board 10 is divided into the cavities 12 (a dividing step). This makes it possible to obtain, in large numbers, the light-emitting devices 1a, in each of which the sealing resin 21 has the pearskin-finished surface.

Note that in order to produce the light-emitting devices 1a by use of the multiple cavity circuit board 10, the multiple cavity circuit board 10 is divided so as to have a circuit configuration in which the multiple cavity circuit board 10 has a plurality of cavities 12 in which the light-emitting elements 13 in the respective cavities 12 are electrically connected to each other. This makes it possible to obtain a dot-matrix light-emitting device in which a large number of light-emitting elements 13 are provided in a matrix pattern.

As described earlier, the sealing resin sheet 20 stacked on the multiple cavity circuit board 10 is formed to have a thickness of approximately 0.2 to 0.4 mm, whereas the cavities 12 have a depth of 0.6 mm. In a case where the sealing resin sheet 20 has a too large thickness, the melted silicone resin remains on the surface, between the respective cavities 12, of the multiple cavity circuit board 10 after the curing step is ended. If such a silicone resin remaining on the surface of the multiple cavity circuit board 10 is cured, light emitted by the light-emitting element 13 may be scattered by the remaining silicone resin. Therefore, it is preferable that the sealing resin sheet 20 be configured to have a thickness smaller than the depth of the cavities 12.

FIG. 8 is a chart showing data on the light-emitting device production method in accordance with the present embodiment. FIG. 8 also shows, as a comparative example, data obtained by a conventional casting sealing method. Note that the casting sealing method shown in FIG. 8 uses a general silicone resin whose initial state is a liquid state and which is conventionally used as described in the above Technical Problem (see FIG. 34), and the casting sealing method does not use the silicone resin in accordance with the present invention which silicone resin has a viscosity characteristic shown in FIG. 4.

The light-emitting devices 1a produced by a sheet resin method of the present embodiment each have a chromaticity distribution width of 3 ranks (see FIG. 8). As compared with light-emitting devices (each having a chromaticity distribution width of 15 ranks) produced by the conventional casting sealing method, the light-emitting devices 1a produced by the sheet resin method of the present embodiment can less vary in chromaticity value (can be narrower in chromaticity distribution range).

Note here that values of "X" and "Y" shown in each of the sections of chromaticity distribution width in FIG. 8 indicate respective X and Y chromaticity widths within a scope which specifies a given chromaticity range, the X and Y chromaticity widths being obtained when chromaticity values of the light-emitting devices mass-produced by each of the sheet resin method of the present embodiment and the conventional casting sealing method are plotted on a CIE1931 chromaticity diagram. Note also that a value of the rank (division), which value indicates the number of ranks (divisions) over which chromaticity distributions of the mass-produced light-emitting devices extend, shows that variations in chromaticity value are distributed while extending over a plurality of levels (chromaticity ranks) that are adjacent to each other in the scope.

According to the sheet resin method of the present embodiment, it is possible to reduce a range in which the light-emitting devices 1a vary in chromaticity value. This is because, as described earlier, it is possible to equalize fluorescent material contained amounts among the light-emitting devices 1a to a substantially equal amount.

The above description thus shows that, as compared with the light-emitting devices produced by the conventional casting sealing method, a light-emitting device 1a produced by the sheet resin method of the present embodiment has smaller values of X and Y, and a smaller value of the rank (division), so that mass-produced light-emitting devices 1a much less vary in chromaticity value.

Heads of the conventional casting resin method in the section of production efficiency/molding time in FIG. 8 each indicate the number of heads of a dispenser of a fluorescent material application apparatus for use in casting, and show that the plurality of cavities 12 can be simultaneously applied with the fluorescent material (subjected to casting sealing). Furthermore, times in that section each indicate a time required for the application of the fluorescent material layer (casting sealing) (that is, corresponding to a molding time). The time which is converted into a time per cavity 12 (light-emitting device 1a) is 0.17 second/pcts in the case of 6 heads.

Meanwhile, a tact of the sheet resin method of the present embodiment indicates a time for a vacuum heat pressing process to be carried out with respect to a sheet resin (that is, corresponding to the molding time). In a case where three multiple cavity circuit boards 10 are simultaneously subjected to vacuum heat pressing, the tact which is converted into a time per cavity 12 (light-emitting device 1a) is 0.049 second/pcts.

As described above, the sheet resin method of the present embodiment makes the molding time shorter as compared with the conventional casting sealing method. This shows that the sheet resin method of the present embodiment allows an increase in production efficiency.

The number of parts in each of the sections of amount of waste resin and fluorescent material in FIG. 8 quantitatively indicate an amount of a waste resin and a waste fluorescent material in a case where 100 light-emitting devices are produced (that is, 100 parts of the sealing resin 21 are formed) assuming that an amount of the silicone resin and the fluorescent material each contained in the sealing resin 21 of one light-emitting device is one part, the waste resin and the waste fluorescent material each produced during a production process and then disposed of. According to the sheet resin method of the present embodiment, only an amount of the silicone resin and the fluorescent material which overflow from the rim of the weight plate 32 during the vacuum heat pressing process serves as an amount of a waste resin and a waste fluorescent material. In contrast, according to the conventional casting sealing method, precipitation of the fluorescent material in a casting machine (dispenser) causes a change over time in concentration of the fluorescent material for each casting process. Therefore, it is impossible to use all the resin containing the fluorescent material in the casting machine (normally, approximately half of the resin containing the fluorescent material is disposed of). This increases an amount of a waste resin and a waste fluorescent material.

As described above, the sheet resin method of the present embodiment further reduces the amount of the waste resin and the waste fluorescent material as compared with the conventional casting sealing method. This shows that the sheet resin method of the present embodiment is extremely economical.

Furthermore, according to the sheet resin method of the present embodiment, the cavities are simultaneously filled with the silicone resin. This allows an increase in production efficiency and a reduction in amount of the resin and the fluorescent material which are to be disposed of in the production process.

Figure 9:
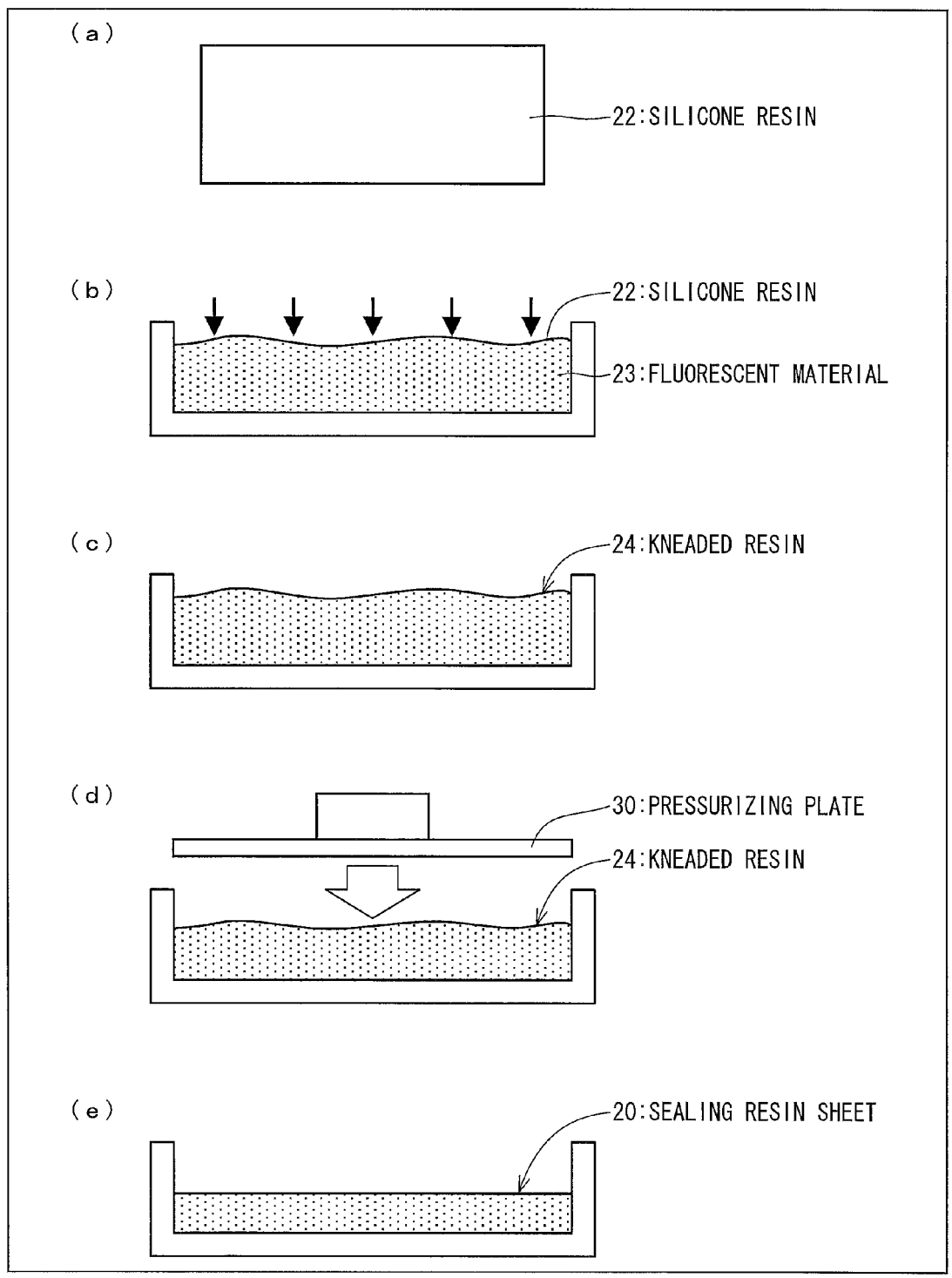
FIGS. 9(a) through 9(e) schematically illustrate a method for producing the sealing resin sheet illustrated in FIG. 3(a).

Next, the following description discusses, with reference to FIGS. 9 through 11, a method for producing the sealing resin sheet 20 which is used in the light-emitting device production method in accordance with the present embodiment.

FIGS. 9(a) through 9(e) schematically illustrate the method for producing the sealing resin sheet 20 illustrated in FIG. 3(a). FIGS. 10(a) and 10(b) are graphs each showing a viscosity state of a silicone resin in a process illustrated in FIGS. 9(a) through 9(e).

Note that for convenience, the graphs of FIGS. 10(a) and 10(b) each show that a viscosity characteristic of the silicone resin changes linearly. However, a silicone resin is not necessarily limited to the silicone resin whose viscosity characteristic changes linearly.

First, a silicone resin 22 illustrated in FIG. 9(a) is subjected to primary cross-linking, and the silicone resin 22 is obtained by removing, by appropriate decompression, the solvent content of a semi-cured material diluted with a solvent such as BTX (benzene, toluene or xylene).

As illustrated in FIG. 10(a), the silicone resin 22 is heated from the room temperature $T_0$ to a temperature $T_5$ (e.g., not lower than 40° C. and lower than 60° C.), so that a viscosity of the silicone resin 22 is decreased to a viscosity $V_5$ at which a fluorescent material can be kneaded with the silicone resin 22 and the fluorescent material thus kneaded is not precipitated (see $P_5$ in FIG. 10(a)).

Next, the fluorescent material and the silicone resin 22 each measured in a predetermined amount are contained in a container, and kneaded by, for example, stirring until the fluorescent material is evenly dispersed in the silicone resin 22 (see FIG. 9(b)). This makes it possible to obtain a kneaded resin 24, which is the silicone resin 22 in which the fluorescent material is evenly dispersed (see FIG. 9(c)).

Note that it is possible to use, as another method for kneading the fluorescent material and the silicone resin 22, a widely used kneading apparatus such as a ball mill using a high-hardness material or a (vacuum heat) kneader. Such a kneading apparatus preferably includes a heating mechanism (temperature regulating mechanism) so that the fluorescent material and the silicone resin 22 subjected to primary cross-linking can be further kneaded (the ball mill or the kneader needs to be decompressed by a vacuum apparatus). In a case where a temperature during the kneading (a temperature range lower than a secondary cross-linking temperature of the silicone resin 22) is regulated, it is possible to appropriately adjust the viscosity of the primary cross-linked silicone resin 22 to an extent that the fluorescent material is not precipitated. This makes it possible to adjust a state in which the fluorescent material is dispersed in the silicone resin 22.

Such a kneading apparatus, which is suitable for kneading a high-viscosity resin material, can knead the fluorescent material and the silicone resin 22 while less reducing the viscosity of the silicone resin 22. Accordingly, it is possible to prevent the fluorescent material from being unevenly dispersed in the silicone resin 22, so that the fluorescent material can be more evenly dispersed in the silicone resin 22. Note that, in a case where such a kneading apparatus is used, the silicone resin 22 with which the fluorescent material is kneaded does not necessarily have a sheet shape. However, it is only necessary that the silicone resin 22 be appropriately processed again from an obtained shape to have a desired shape of a sealing (starting) material for sealing an LED package.

According to the another method for kneading the fluorescent material and the silicone resin 22, the silicone resin 22 which has been subjected to primary cross-linking and is to be introduced into the kneading apparatus may be not only in a resin state in which its viscosity is reduced but also in a powdered state. That is, a sample to be used (primary processed product) for obtaining a sealing resin form (secondary processed product) optimum for a sealing process may be produced by use of the kneading apparatus after dry-blending the fluorescent material and powder of the silicone resin 22 (the primary processed product may be obtained from a dry-blended product). Even in a case where the silicone resin 22 is in the powdered state, the kneading apparatus includes the heating mechanism. Therefore, particles of the silicone resin 22 which has been melted by heat are bonded, and the particles are kneaded while the fluorescent material is being mixed therewith. Note that a method for producing the light-emitting device using the silicone resin 22 in the powdered state will be described later.

Next, as illustrated in FIG. 9(d), the kneaded resin 24 is formed into a sheet by being pressurized by a pressurizing plate 30. Then, as shown in FIG. 10(b), a temperature of the kneaded resin 24 formed into a sheet is reduced from the temperature $T_5$ to the room temperature $T_0$. This makes it possible to produce the sealing resin sheet 20 in which the fluorescent material is evenly dispersed (see FIG. 9(e)).

Note that a solvent remaining in the silicone resin 22 is removed by decompression while the fluorescent material is being kneaded with the silicone resin 22, or removed by drying when the kneaded resin 24 is being formed into a sheet.

Note that the kneaded resin 24 can be formed into a sheet not only by such a press method as described above but also by various melting methods such as a T-die method, a calendar roll method, and a doctor blade method.

FIG. 11 is a cross-sectional view illustrating another method for forming, into a sheet, the kneaded resin 24 illustrated in FIG. 9(c). FIG. 11 illustrates a process for forming the kneaded resin 24 into a sheet by the T-die method.

In a case where the kneaded resin 24 is formed into a sheet by the T-die method, the kneaded resin 24 which is roughly ground to have a predetermined size is positioned on a mold 131 provided with a nozzle 132 having an opening 132a which opens in a certain width (see FIG. 11). The kneaded resin 24, which is pressurized by a pressure member 139, can be formed into a sheet having a width of the opening 132a.

Note that the width of the opening 132a is appropriately changed in accordance with a required thickness of the sealing resin sheet 20.

As described earlier, the light-emitting device production method in accordance with the present embodiment includes: a mounting step of mounting the light-emitting elements 13 in the respective cavities 12 provided in the multiple cavity circuit board 10; a positioning step of stacking the sealing resin sheet 20 on the multiple cavity circuit board 10 so that the sealing resin sheet 20 covers all the cavities 12 in which the respective light-emitting elements 13 are mounted, the sealing resin sheet 20 containing the silicone resin semi-cured by primary cross-linking and the fluorescent material; a melting step of, while heating the sealing resin sheet 20 at the temperature lower than the secondary cross-linking temperature $T_1$ at which the silicone resin is totally cured by secondary cross-linking, pressurizing the sealing resin sheet 20 so that the silicone resin melted is filled in the cavities 12; and a curing step of, while the silicone resin 22 that has been melted and filled in the cavities 12 is in close contact with at least respective upper surfaces of the light-emitting elements 13, heating the sealing resin sheet 20 at a temperature equal to or higher than the secondary cross-linking temperature $T_1$, the silicone resin decreasing in viscosity reversibly in a temperature region between the room temperature $T_0$ and the temperature lower than the secondary cross-linking temperature $T_1$, and being totally cured non-reversibly in a temperature region equal to or higher than the secondary cross-linking temperature $T_1$.

The light-emitting device production method in accordance with the present embodiment uses the silicone resin having the viscosity characteristic described earlier. This makes it possible to repeatedly control the viscosity of the silicone resin by changing the temperature of the silicone resin in the temperature region between the room temperature $T_0$ and the temperature lower than the secondary cross-linking temperature $T_1$.

Accordingly, for example, in a case where the viscosity of the silicone resin is controlled (reduced), during kneading of the fluorescent material with the silicone resin, to an extent that the kneaded fluorescent material is not precipitated, the fluorescent material can be evenly dispersed in the silicone resin. Therefore, it is possible to obtain the sealing resin sheet 20 in which the fluorescent material is evenly dispersed in the silicone resin.

Accordingly, in a case where, in order that the melted silicone resin is totally cured by secondary cross-linking while being in close contact with respective upper surfaces and side surfaces of the light-emitting elements 13, the sealing resin sheet 20 is heated while being positioned so as to face the respective upper surfaces of the light-emitting elements 13 mounted on the multiple cavity circuit board 10, the light-emitting elements 13 can be sealed in a state in which a fluorescent material concentration (fluorescent material contained amount) is substantially equalized among the cavities 12.

Furthermore, according to the light-emitting device production method in accordance with the present embodiment, as compared with the conventional casting sealing method described earlier (a method for separately filling the cavities 12 with a silicone resin that is in a liquid state and contains a fluorescent material), the light-emitting device production method allows the fluorescent material contained in the silicone resin, with which the cavities 12 are filled, to less vary in concentration and contained amount for each of the cavities 12. This can prevent a variation in chromaticity value among the light-emitting devices 1a.

Further, the light-emitting device production method in accordance with the present embodiment allows the melted silicone resin to be simultaneously filled in the cavities 12 without using a special dispenser, a molding machine, or the like for causing the melted silicone resin to be filled in the cavities 12. This allows a remarkable increase in production efficiency of the light-emitting devices.

Therefore, according to the present embodiment, it is possible to attain a light-emitting device production method that allows (i) equalization of a concentration of a fluorescent material among light-emitting devices 1a and (ii) a smaller variation in chromaticity value which variation is caused by a fluorescent material concentration and a fluorescent material contained amount.

Next, the following description discusses, with reference to FIGS. 12 through 20, modifications of the light-emitting device production method in accordance with the present embodiment.

The present embodiment discusses a method in which the multiple cavity circuit board 10 on which the light-emitting elements 13 are mounted, the sealing resin sheet 20, the surface molding release sheet 31, and the weight plate 32 are stacked and heated in a vacuum state by the vacuum heating furnace 33. Alternatively, the method may be replaced with a method that uses no weight plate 32.

Figure 12:
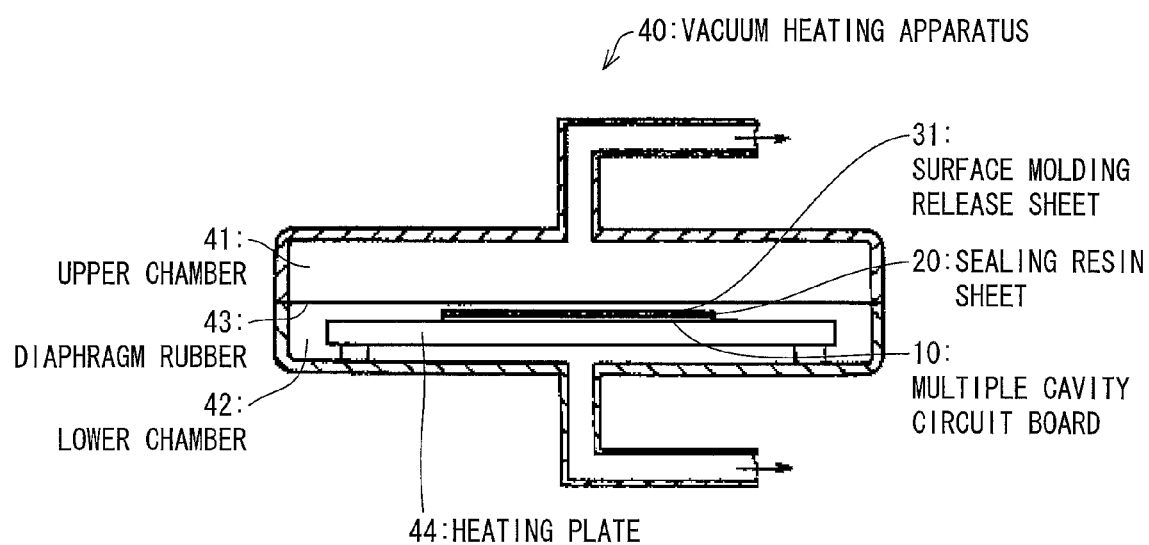
FIG. 12 is a cross-sectional view illustrating an inner structure of a vacuum heating apparatus which is usable for production of the light-emitting device illustrated in FIG. 1.
Figure 13:
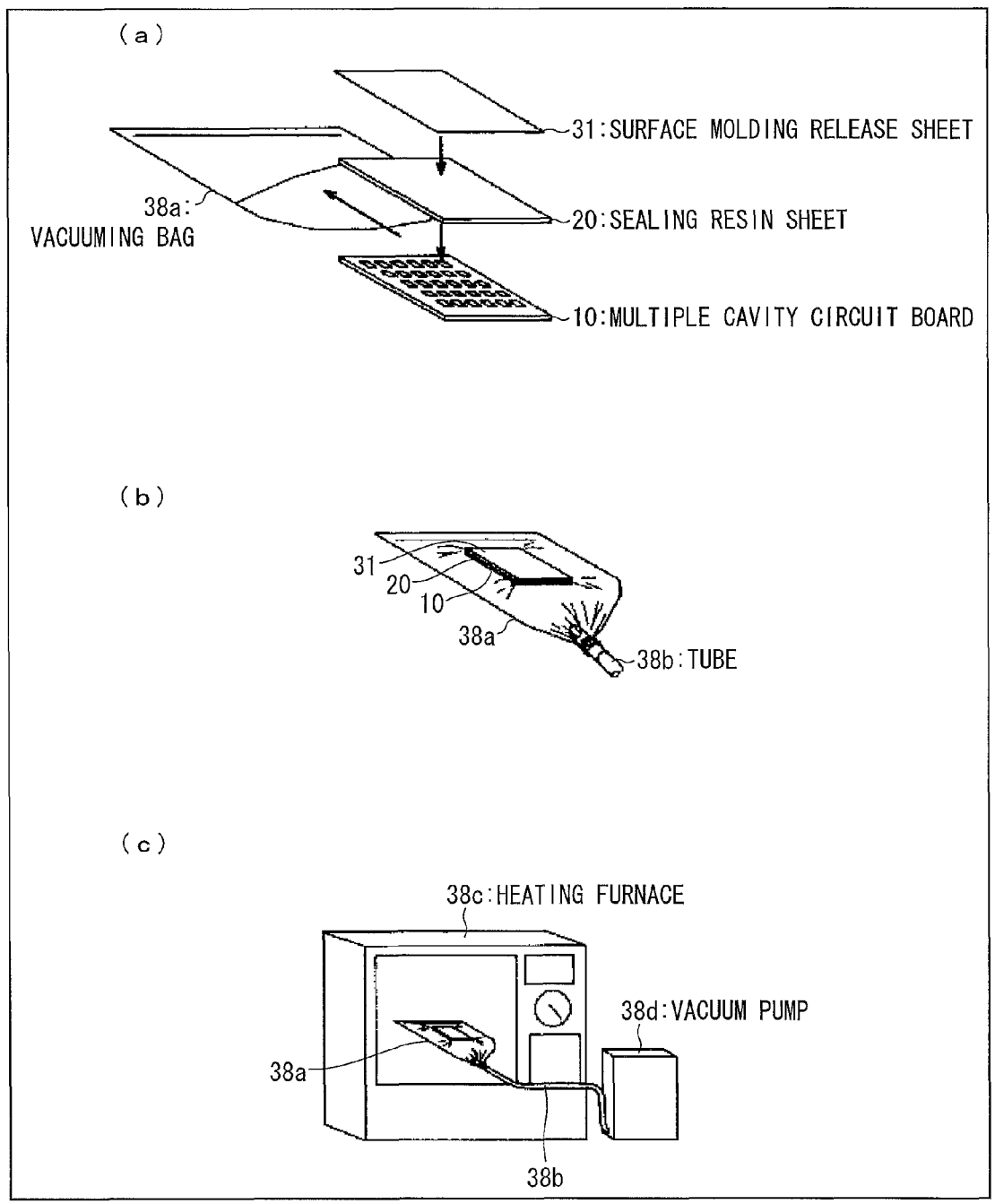
FIGS. 13(a) through 13(c) schematically illustrate a process of a vacuum heating method which is applicable to the light-emitting device production method.
Figure 14:
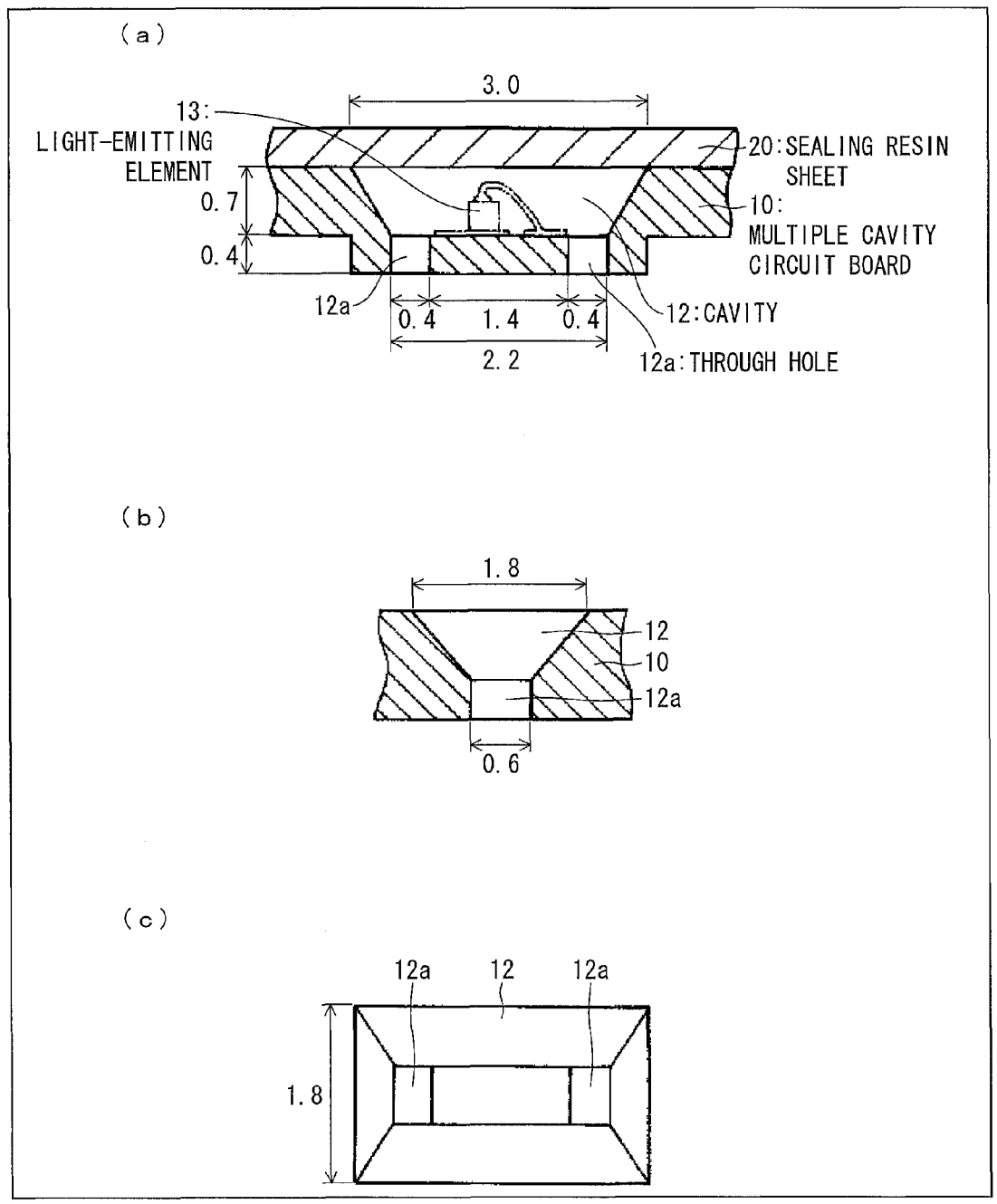
FIGS. 14(a) through 14(c) schematically illustrate a cavity whose bottom is provided with a pair of through holes.
Figure 16:
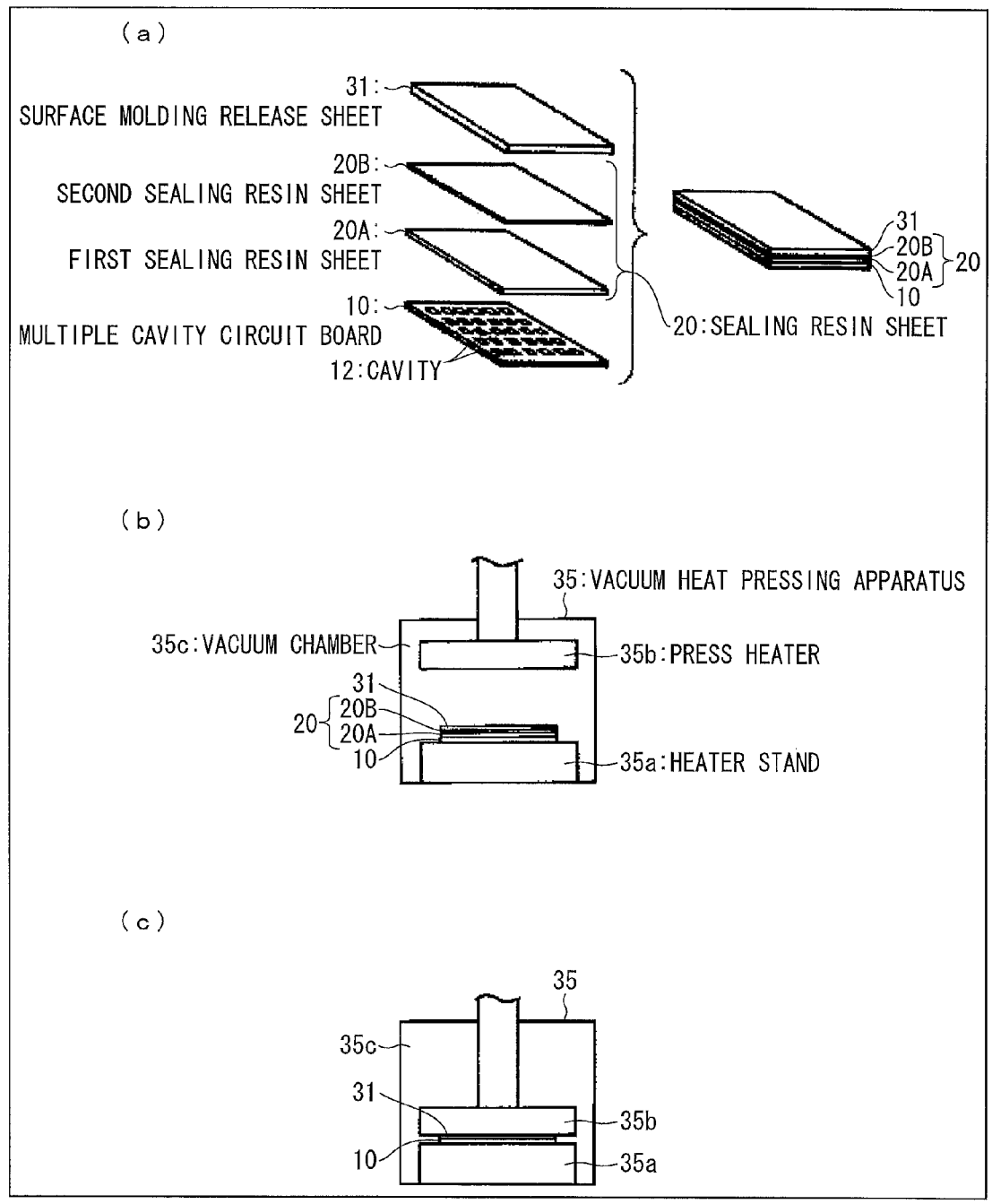
FIGS. 16(a) through 16(c) schematically illustrate a light-emitting device production method for sealing light-emitting elements by stacking two sealing resin sheets which contain a fluorescent material in different amounts.
Figure 17:
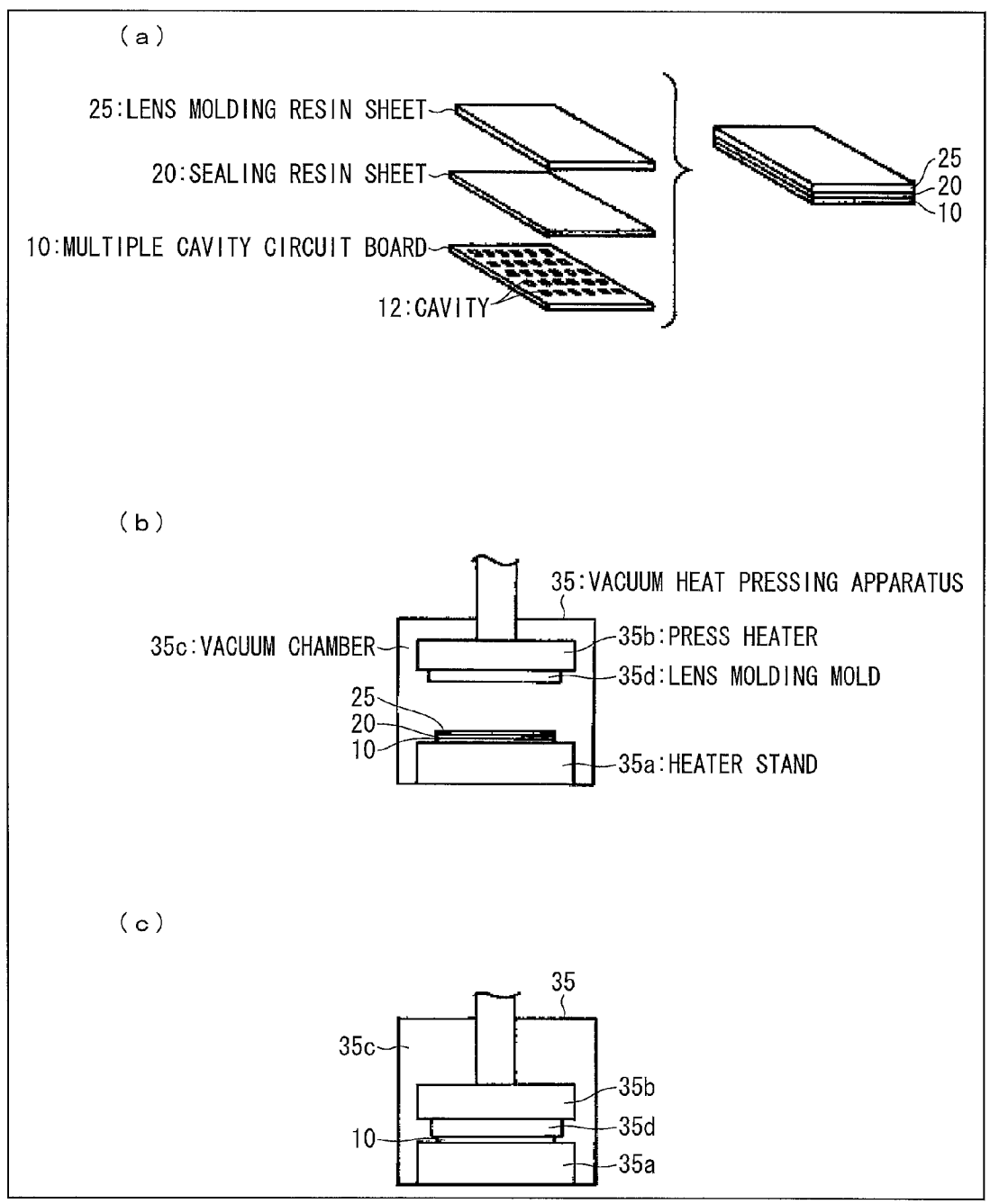
FIGS. 17(a) through 17(c) schematically illustrate a method for producing a light-emitting device having a rod lens.

FIG. 12 is a cross-sectional view illustrating an inner structure of a vacuum heating apparatus 40 which is usable for production of the light-emitting device 1a illustrated in FIG. 1. Without using the weight plate 32, it is possible to stack and heat the multiple cavity circuit board 10, the sealing resin sheet 20, and the surface molding release sheet 31 by the vacuum heating apparatus ("Vacuum Laminator" manufactured by NPC Incorporated) 40 capable of simultaneously carrying out pressurization and heating in a vacuum state (see FIG. 12).

According to the vacuum heating apparatus 40, an upper chamber 41 and a lower chamber 42 are separated from each other by a diaphragm rubber 43. Respective inner parts of the upper chamber 41 and the lower chamber 42 are configured to be in a vacuum state.

A heating plate 44 is provided in the lower chamber 42. The multiple cavity circuit board 10 on which the sealing resin sheet 20 and the surface molding release sheet 31 are stacked is placed on the heating plate 44.

When the multiple cavity circuit board 10 on which the sealing resin sheet 20 and the surface molding release sheet 31 are stacked is placed on the heating plate 44, the respective inner parts of the upper chamber 41 and the lower chamber 42 are made vacuous, and the heating plate 44 is heated, so that the sealing resin sheet 20 is melted.

Then, in a case where only the inner part of the upper chamber 41 is exposed to air while the vacuum state of the inner part of the lower chamber 42 is maintained, the surface molding release sheet 31 is pressure-welded to the multiple cavity circuit board 10 by the diaphragm rubber 43.

According to this, the surface molding release sheet 31 is pressure-welded, by the diaphragm rubber 43 and a vacuum function, to a surface of the silicone resin which is in a melted state and is filled in the cavities 12 of the multiple cavity circuit board 10. Therefore, the silicone resin totally cured can be molded to have a pearskin-finished surface while no air bubble enters the silicone resin in the melted state. Also in this case, regulation of a temperature of the heating plate 44 allows the vacuum heating apparatus 40 to carry out an operation in which the silicone resin is melted so as to be filled in the cavities 12 and then the silicone resin is totally cured by secondary cross-linking.

FIGS. 13(a) through 13(c) schematically illustrate a process of a vacuum heating method which is applicable to the light-emitting device production method. As illustrated in FIGS. 13(a) through 13(c), a vacuuming bag 38a connected to a vacuum pump 38d is also usable for producing the light-emitting device 1a.

Specifically, first, the multiple cavity circuit board 10 on which the sealing resin sheet 20 and the surface molding release sheet 31 are stacked is contained in the vacuuming bag 38a, that is heat-resistant (see FIG. 13(a)).

Next, after one end of a tube 38b is airtightly connected to an opening of the vacuuming bag 38a (see FIG. 13(b)), the vacuuming bag 38a may be contained in a heating furnace 38c to be heated while an inner part of the vacuuming bag 38a is made vacuous by the vacuum pump 38d (see FIG. 13(c)).

The present embodiment discusses a method in which the sealing resin sheet 20 is stacked on the multiple cavity circuit board 10 and heated. In this case, a pair of through holes 12a may be provided at the bottom of each of the cavities 12.

FIGS. 14(a) through 14(c) each schematically illustrate a cavity 12 whose bottom is provided with the pair of through holes 12a. FIG. 14(a) is a vertical cross-sectional view of the cavity 12, FIG. 14(b) is a transverse cross-sectional view of the cavity 12 illustrated in FIGS. 14(a), and 14(c) is a plan view of the cavity 12 illustrated in FIG. 14(a).

In a case where the pair of through holes 12a is provided at the bottom of each of the cavities 12, air can be exhausted from the cavities 12 when an area around the multiple cavity circuit board 10 is in a vacuum state and the silicone resin of the sealing resin sheet 20 is in a melted state (see FIGS. 14(a) through 14(c)). Therefore, it is possible to prevent an air bubble from entering the melted silicone resin which is filled in the cavities 12. Furthermore, inner surfaces of each of the cavities 12 and the sealing resin 21 can be in closer in contact with each other.

For example, in a case where the cavities 12 each have (i) an opening having a rectangular shape of 3.0 mm×1.8 mm and (ii) a bottom having a rectangular shape of 2.2 mm×0.6 mm, the cavities 12 have a depth of 0.7 mm, and the bottom protrudes downward by 0.4 mm so as to correspond to a length of the through holes 12a, the pair of through holes 12a having a rectangular shape of 0.4 mm×0.6 mm is provided at either end in a longer-side direction of the bottom of each of the cavities 12 so as to be spaced from each other at intervals of 1.4 mm (see FIGS. 14(a) through 14(c)).

Note that in a case where the melted silicone resin may flow from the through holes 12a, it is only necessary that a highly releasable sheet or plate, for example be provided below the multiple cavity circuit board 10. According to this, even if the melted silicone resin flows from the through holes 12a, it is possible to easily take out the multiple cavity circuit board 10 from, for example, the heating furnace while preventing the multiple cavity circuit board 10 from being in close contact with, for example, the heating plate.

FIG. 15(a) is a cross-sectional view illustrating the cavity 12 whose bottom is provided with one through hole 12a, and FIG. 15(b) is a cross-sectional view illustrating the sealing resin sheet 20 provided with a through hole 20a. The bottom of each of the cavities 12 does not need to be provided with the pair of through holes 12a, but the bottom of each of the cavities 12 may be provided with the one through hole 12a (see FIG. 15(a)).

Note that the through hole 12a may be provided not only at the bottom but also on a side surface of each of the cavities 12. Furthermore, the through hole 12a may have a cross-section having not only a rectangular shape but also a circular shape a triangular shape, or the like.

Further, instead of a configuration in which the bottom of each of the cavities 12 is provided with the through hole 12a, the present embodiment may have a configuration in which a part of the sealing resin sheet 20 which part faces each of the cavities 12 is provided with a through hole 20a (see FIG. 15(b)). Also in this case, air can be exhausted from the cavities 12 via respective through holes 20a provided in the sealing resin sheet 20 when an area around the multiple cavity circuit board 10 is in a vacuum state and the silicone resin of the sealing resin sheet 20 is melted. Therefore, it is possible to prevent an air bubble from entering the melted silicone resin which is filled in the cavities 12. Furthermore, inner surfaces of each of the cavities 12 and the sealing resin 21 can be in closer in contact with each other.

The present embodiment discusses a method in which the light-emitting elements 13 are sealed with one sealing resin sheet 20. Alternatively, the light-emitting elements 13 may be sealed with a plurality of sealing resin sheets which are stacked and contain a fluorescent material in different amounts.

FIGS. 16(a) through 16(c) schematically illustrate a light-emitting device production method for sealing the light-emitting elements 13 by using two sealing resin sheets 20A and 20B which contain a fluorescent material in different amounts. The first sealing resin sheet 20A and the second sealing resin sheet 20B which contain the fluorescent material in different amounts may be stacked, as the sealing resin sheet 20, on the multiple cavity circuit board 10 (see FIG. 16(a)).

The first sealing resin sheet 20A and the second sealing resin sheet 20B are each identical in size to the multiple cavity circuit board 10 so as to cover all the cavities 12. The first sealing resin sheet 20A, which is fitted to the multiple cavity circuit board 10, is stacked on the multiple cavity circuit board 10.

After the second sealing resin sheet 20B is stacked on the first sealing resin sheet 20A, the surface molding release sheet 31 having a pearskin-finished surface is further stacked on the second sealing resin sheet 20B.

Next, the multiple cavity circuit board 10 on which the first sealing resin sheet 20A, the second sealing resin sheet 20B, and the surface molding release sheet 31 are stacked is set in the vacuum heat pressing apparatus 35 (see FIG. 16(b)). For example, a "vacuum laminate press" (trade name, manufactured by KITAGAWA SEIKI CO., LTD) is used as the vacuum heat pressing apparatus 35.

The vacuum heat pressing apparatus 35 includes (i) a heater stand 35a which is capable of carrying out heating and is positioned in a vacuum chamber 35c, and (ii) a press heater 35b which is capable of carrying out heating and can be brought into contact with and separated from the heater stand 35a. The multiple cavity circuit board 10 on which the first sealing resin sheet 20A, the second sealing resin sheet 20B, and the surface molding release sheet 31 are stacked is set on the heater stand 35a. While the multiple cavity circuit board 10 is set on the heater stand 35a, the vacuum chamber 35c is decompressed to be at a pressure of 10 torr.

Next, the press heater 35b heated is lowered, and the multiple cavity circuit board 10 set on the heater stand 35a, on which the first sealing resin sheet 20A, the second sealing resin sheet 20B, and the surface molding release sheet 31 are stacked, is heated by the press heater 35b at a temperature of approximately 100° C. while being pressurized at a pressure of 20 kg/cm$^2$ (see FIG. 16(c)). In this case, the heater stand 35a located on the underside of the multiple cavity circuit board 10 is not heated. After the press heater 35b carries out heat pressing, the press heater 35b is further heated to a temperature of approximately 150° C.

Then, a pressure in the vacuum chamber 35c is returned to a normal pressure by releasing a decompression state in the vacuum chamber 35c. Thereafter, the heat pressing by the press heater 35b is released, so that a vacuum heat pressing process carried out by the vacuum heat pressing apparatus 35 is ended.

During the vacuum heat pressing process carried out by the vacuum heat pressing apparatus 35, the first sealing resin sheet 20A and the second sealing resin sheet 20B are melted, and the melted silicone resin is filled in the cavities 12, so that the melted silicone resin is totally cured by the secondary cross-linking.

Thereafter, the light-emitting devices are obtained by dividing the multiple cavity circuit board 10 for each of the cavities 12 or every predetermined number of the cavities 12.

As described earlier, in a case where the first sealing resin sheet 20A and the second sealing resin sheet 20B which contain the fluorescent material in different amounts are stacked, it is possible to easily control a concentration at which the fluorescent material is dispersed in each of the cavities 12.

Note that a surface of the sealing resin 21 may have an uneven surface by directly spraying a releasing agent to a surface of the press heater 35b without using the surface molding release sheet 31.

Further, the vacuum heat pressing apparatus 35 may be replaced with a vacuum impregnating apparatus. In order to fill the cavities 12 with the melted silicone resin, the vacuum impregnating apparatus carries out pressurization by increasing a pressure in a chamber from a normal pressure. According to the vacuum impregnating apparatus, it is possible to easily carry out, in the impregnating apparatus, a process in which the melted silicone resin is filled in the cavities 12 by being heated under a high pressure. This allows an increase in operation efficiency.

The present embodiment discusses a method in which the surface molding release sheet 31 is positioned on the sealing resin sheet 20. Alternatively, the surface molding release sheet 31 may be replaced with a lens molding resin sheet 25.

Figure 18:
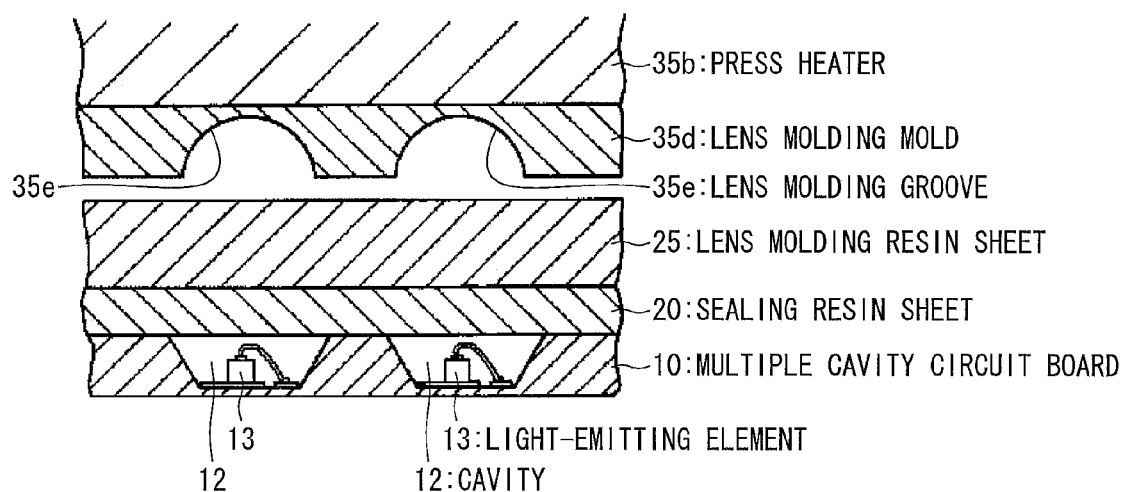
FIG. 18 is a cross-sectional view illustrating a press state in a vacuum heat pressing apparatus illustrated in FIG. 17(c).
Figure 19:
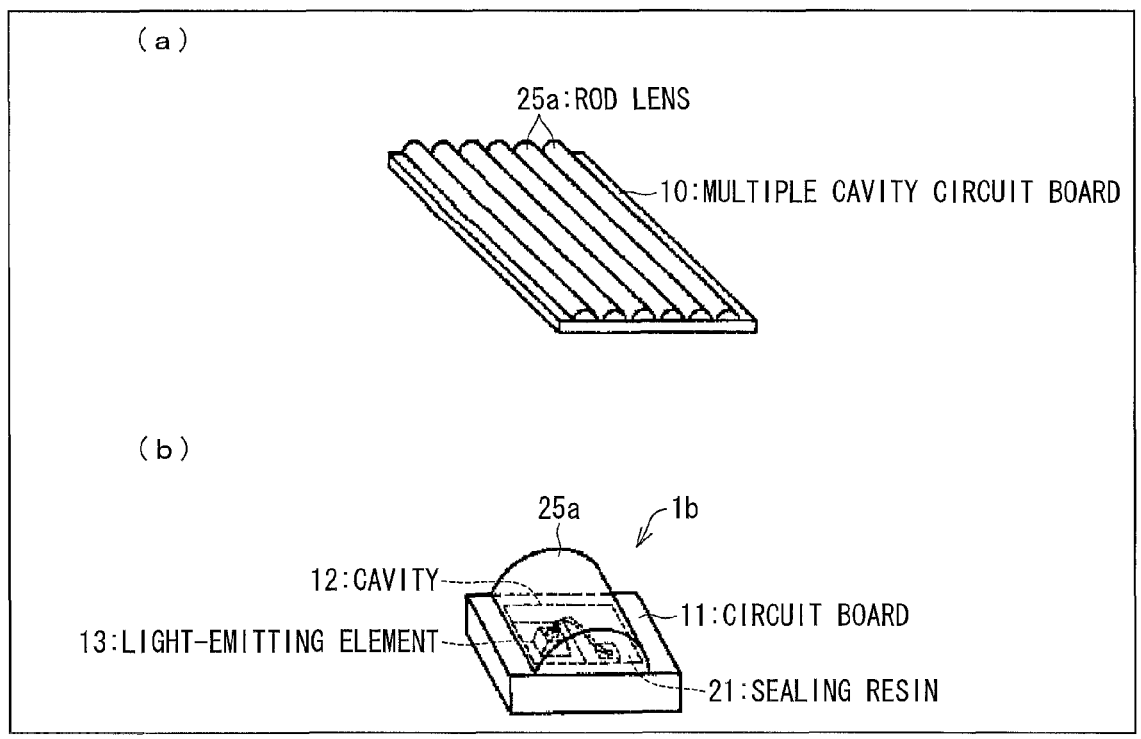
FIG. 19(a) is a perspective view illustrating a multiple cavity circuit board provided with rod lenses.
FIG. 19(b) is a perspective view illustrating a light-emitting device obtained by dividing the multiple cavity circuit board illustrated in FIG. 19(a).
Figure 20:
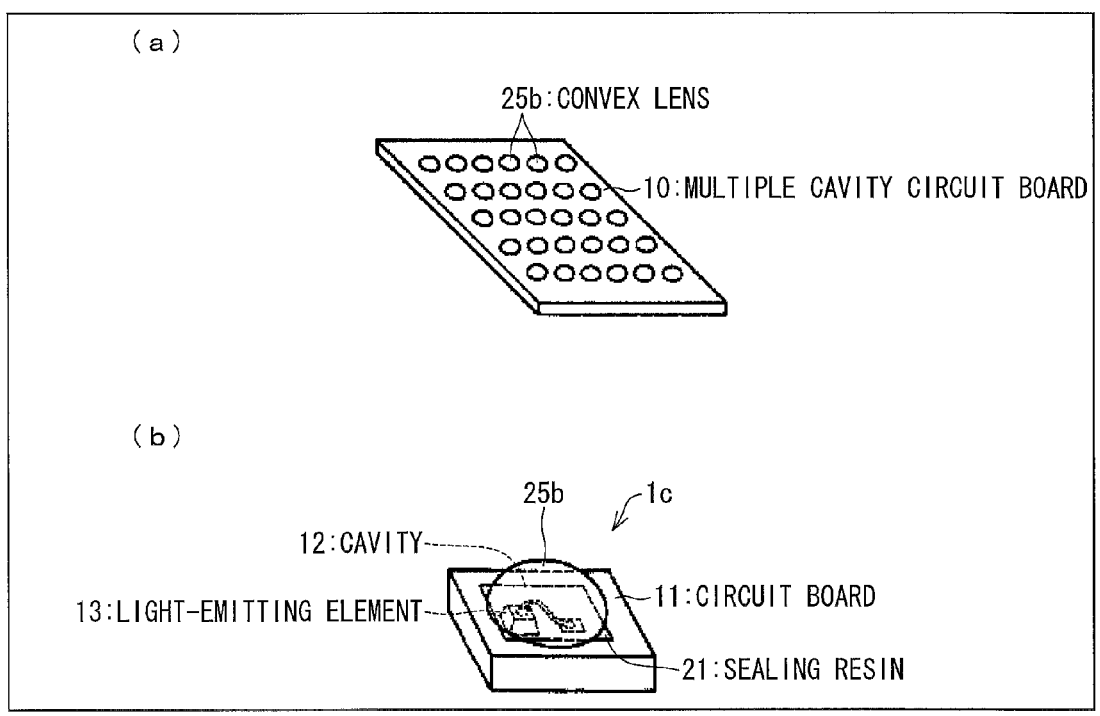
FIG. 20(a) is a perspective view illustrating a multiple cavity circuit board provided with a convex lens.
FIG. 20(b) is a perspective view illustrating a light-emitting device obtained by dividing the multiple cavity circuit board illustrated in FIG. 20(a).

FIGS. 17(a) through 17(c) schematically illustrate a method for producing a light-emitting device having a rod lens. FIG. 18 is a cross sectional view illustrating a press state in the vacuum heat pressing apparatus 35 illustrated in FIG. 17(c).

The multiple cavity circuit board 10 on which the sealing resin sheet 20 and the lens molding resin sheet 25 are stacked (see FIG. 17(a)) is set in the vacuum heat pressing apparatus 35 (see FIG. 17(b)). The lens molding resin sheet 25 is made of, for example, a high-molecular weight unsaturated polyester resin.

Note that, according to the present modification, the cavities 12 provided in the multiple cavity circuit board 10 has a depth of 0.6 mm, the sealing resin sheet 20 has a thickness of 0.5 mm, and the lens molding resin sheet 25 has a thickness of 1.0 mm.

The vacuum heat pressing apparatus 35 includes a lens molding mold 35d provided on an undersurface of the press heater 35b. For example, the lens molding mold 35d is configured such that a plurality of lens molding grooves (molding recesses: see FIG. 18) 35e having a semi-cylindrical shape and a radius of 0.9 mm are provided in parallel with each other so as to correspond to respective columns of the cavities 12 of the multiple cavity circuit board 10. While the multiple cavity circuit board 10 is set on the heater stand 35a of the vacuum heat pressing apparatus 35, the vacuum chamber 35c is decompressed to be at a pressure of 10 torr.

Next, the press heater 35b heated is lowered, and the sealing resin sheet 20 and the lens molding resin sheet 25 that are stacked on the multiple cavity circuit board 10 are heated by the press heater 35b at a temperature of approximately 100° C. while being pressurized at a pressure of 20 kg/cm$^2$ (see FIG. 17(c)). This causes the sealing resin sheet 20 and the lens molding resin sheet 25 to be in a melted state, so that the melted silicone resin of the sealing resin sheet 20 is filled in the cavities 12, and a melted lens molding resin of the lens molding resin sheet 25 is filled in the lens molding grooves 35e.

After carrying out the heat pressing as described above, the press heater 35b further heats the sealing resin sheet 20 and the lens molding resin sheet 25 to a temperature of 150° C.

Then, a pressure in the vacuum chamber 35c is returned to a normal pressure by releasing a decompression state in the vacuum chamber 35c. Thereafter, the heat pressing by the press heater 35b is released, so that a vacuum heat pressing process carried out by the vacuum heat pressing apparatus 35 is ended.

According to the press process, the silicone resin filled in the cavities 12 and the lens molding resin filled in the lens molding grooves 35e are each cross-linked to be cured.

FIG. 19(a) is a perspective view illustrating the multiple cavity circuit board 10 provided with rod lenses, and FIG. 19(b) is a perspective view illustrating a light-emitting device 1b obtained by dividing the multiple cavity circuit board 10 illustrated in FIG. 19(a).

In a case where the silicone resin filled in the cavities 12 and the lens molding resin filled in the lens molding grooves 35e are cured, a plurality of rod lenses 25a having a semi-cylindrical shape can be provided on the multiple cavity circuit board 10 (see FIG. 19(a)).

In a case where the multiple cavity circuit board 10 is divided for each of the cavities 12, it is possible to obtain the light-emitting device 1b in which the light-emitting element 13 mounted in the cavity 12 of the circuit board 11 is sealed with the sealing resin 21, on which a rod lens 25a having a semi-cylindrical shape is provided (see FIG. 19(b)).

Note that according to the present modification, in order to prevent an air bubble from entering the melted lens molding resin during formation of the rod lens 25a by melting the lens molding resin sheet 25 by use of the lens molding mold 35d, the lens molding resin sheet 25 preferably has a thickness larger than a radius of the rod lens 25a. Further, the lens molding mold 35d, which does not need to be provided to the press heater 35b, may be used while being placed on the lens molding resin sheet 25.

Note also that not only the rod lens 25a having a semi-cylindrical shape but also a convex lens 25b having a hemispherical shape can be formed on the sealing resin 21.

FIG. 20(a) is a perspective view illustrating the multiple cavity circuit board 10 provided with a convex lens, and FIG. 20(b) is a perspective view illustrating a light-emitting device 1c obtained by dividing the multiple cavity circuit board 10 illustrated in FIG. 20(a).

As illustrated in FIG. 20(a), convex lenses 25b having a hemispherical shape can be provided on the respective cavities 12 provided in the multiple cavity circuit board 10. In this case, the convex lenses 25b having a hemispherical shape can be formed by use of the lens molding mold 35d provided with, for example, a plurality of lens molding recesses 35f (see FIG. 22) having a hemispherical shape and a radius of 0.9 mm, instead of the lens molding grooves 35e having a semi-cylindrical shape.

According to this, in a case where the multiple cavity circuit board 10 is divided for each of the cavities 12, it is possible to obtain the light-emitting device 1c in which the light-emitting element 13 mounted in the cavity 12 of the circuit board 11 is sealed with the sealing resin 21, on which a convex lens 25b having a hemispherical shape is provided (see FIG. 20(b)).

The following description discusses, with reference to FIGS. 21 through 27, a second embodiment of a light-emitting device production method in accordance with the present invention. Note that for convenience, members having functions identical to those of the respective members illustrated in the first embodiment are given respective identical reference numerals, and a description of those members is omitted here.

The light-emitting device production method in accordance with the present embodiment differs from the light-emitting device production method in accordance with Embodiment 1 mainly in that the multiple circuit board 10 is replaced with a plane circuit board 60 having a plane surface.

Figure 21:
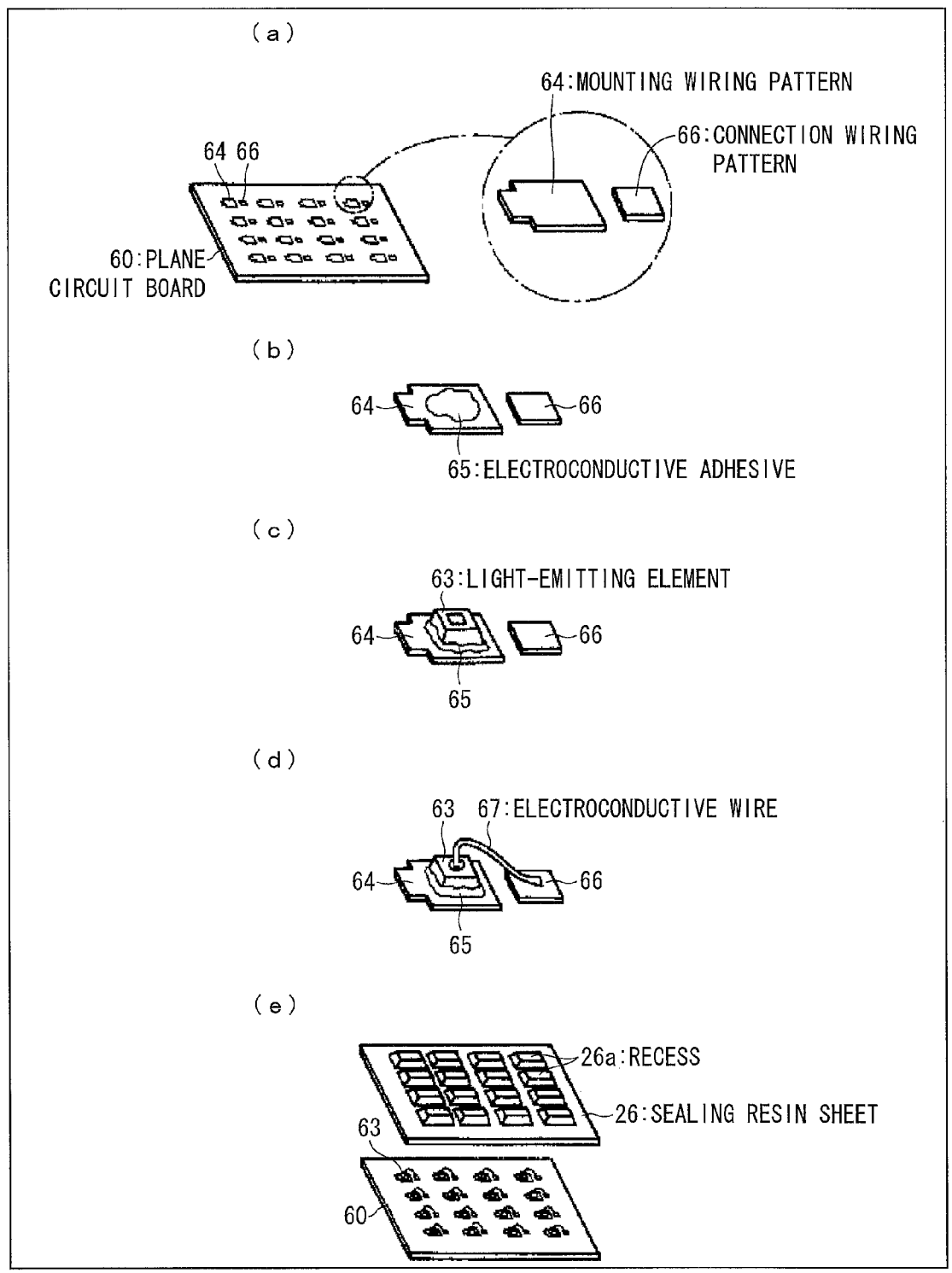
FIGS. 21(a) through 21(e) schematically illustrate a process in which a light-emitting element is mounted on a plane circuit board and which is included in a light-emitting device production process in accordance with Embodiment 2.
Figure 23:
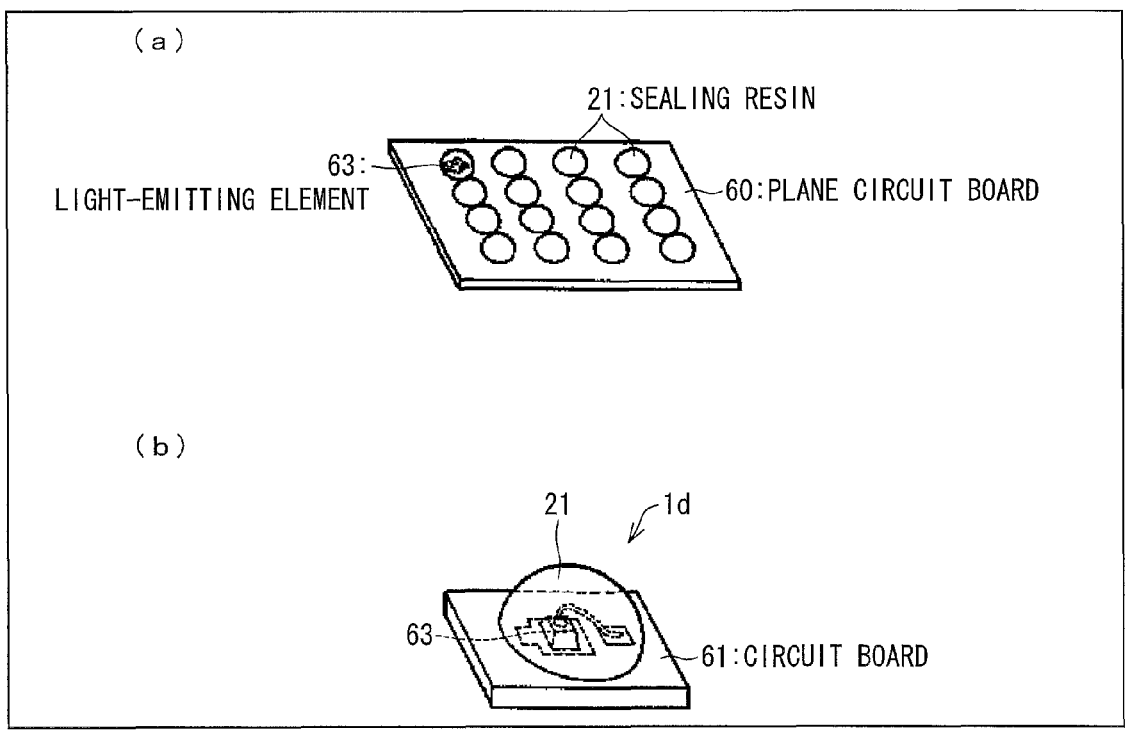
FIG. 23(a) is a perspective view of the plane circuit board subjected to the pressurized pressing illustrated in FIG. 22.
FIG. 23(b) is a perspective view illustrating a light-emitting device obtained by dividing the plane circuit board illustrated in FIG. 23(a).
Figure 24:
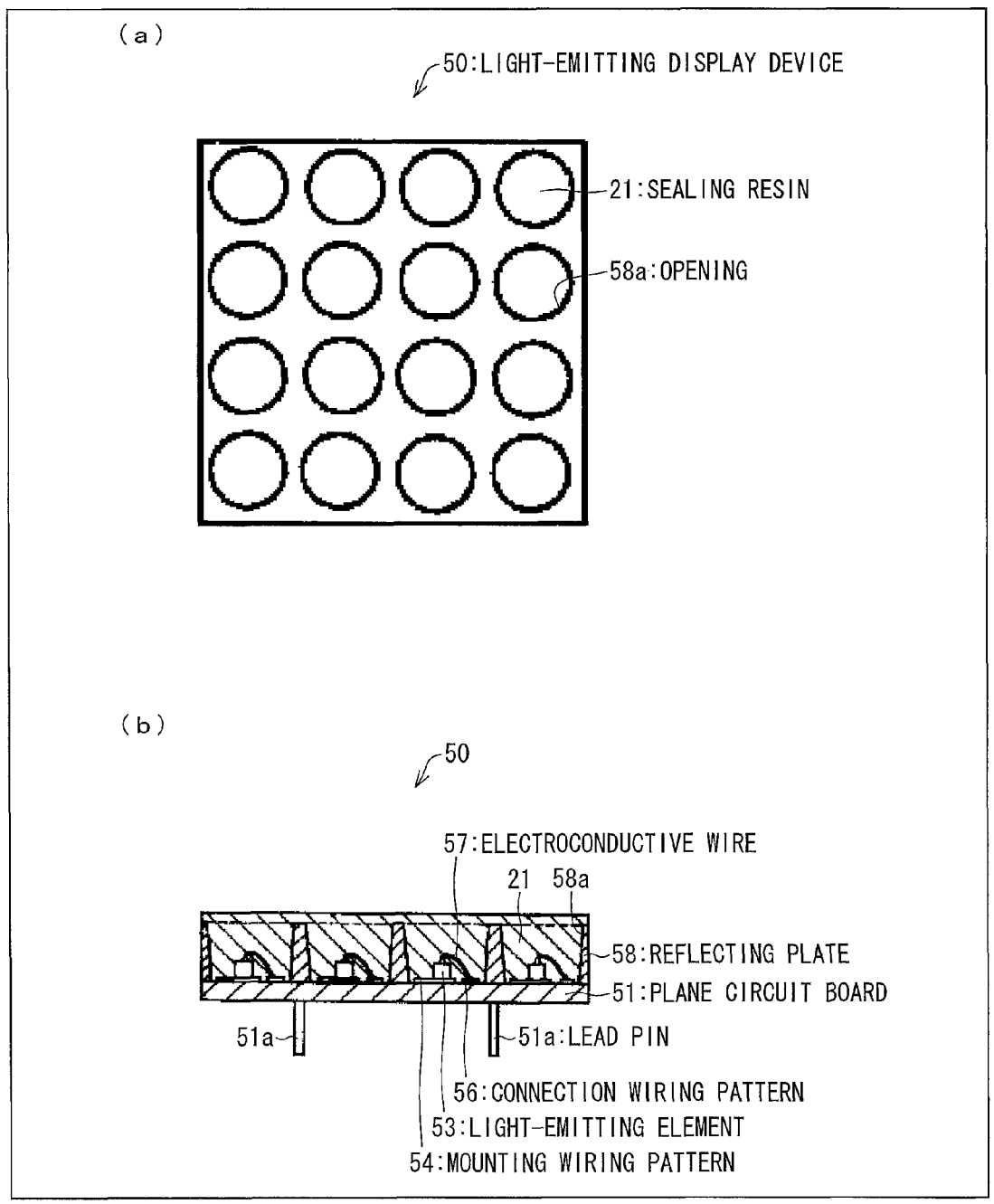
FIG. 24(a) is a plan view showing an example of a light-emitting display device of a dot matrix type.
FIG. 24(b) is a cross-sectional view of the light-emitting display device illustrated in (a) of FIG. 24.

First, the following description discusses, with reference to FIGS. 21 through 23, the light-emitting device production method in accordance with the present embodiment.

FIGS. 21(a) through 21(e) schematically illustrate a process in which a light-emitting element is mounted on the plane circuit board 60 and which is included in the light-emitting device production process in accordance with the present embodiment. First, pairs of mounting wiring patterns 64 and connection wiring patterns 66 are provided vertically and horizontally in a matrix pattern on the plane circuit board 60 having a plane surface (see FIG. 21(a)).

Next, an electroconductive adhesive 65 is applied to the mounting wiring patterns 64 provided on the plane circuit board 60 (see FIG. 21(b)).

Subsequently, a light-emitting element 63 is die-bonded to the electroconductive adhesive 65 (see FIG. 21(c)). (i) An upper surface of the light-emitting element 63 and (ii) a connection wiring pattern 66 which is paired with a mounting wiring pattern 64 on which the light-emitting element 63 is mounted are wire-bonded via an electroconductive wire 67 made of, for example, a gold wire (see FIG. 21(d)).

After the light-emitting element 13 is thus mounted on the plane circuit board 60 by die bonding and wire bonding (a mounting step), a sealing resin sheet 26 is stacked and positioned on the plane circuit board 60 as illustrated in FIG. 21(e) (a positioning step), the sealing resin sheet 26 being provided with recesses 26a which are formed by embossing and in which the respective light-emitting elements 63 each connected with a corresponding mounting wiring pattern 64 and a corresponding connection wiring pattern 66 can be contained.

The sealing resin sheet 26 is positioned on the plane circuit board 60 so that the sealing resin sheet 26 is not in contact with the light-emitting element 63 and the electroconductive wire 67 and so that the pairs of the mounting wiring patterns 64 and the connection wiring patterns 66 each provided on the plane circuit board 60 are contained in the respective recesses 26a (see FIG. 22). Further, an upper surface of the sealing resin sheet 26 is provided with protrusions that correspond to the respective recesses 26a. This allows the sealing resin sheet 26 to have a substantially constant thickness.

The sealing resin sheet 26 is made of a silicone resin having the viscosity characteristic shown in FIG. 4, and is obtained by kneading a fluorescent material with a semi-cured silicone resin obtained by primary cross-linking.

After the sealing resin sheet 26 is thus positioned on the plane circuit board 60, the plane circuit board 60 is set in a vacuum heat pressing apparatus 35 (see FIG. 16(b)).

FIG. 22 is a cross-sectional view illustrating a state of pressurization in the vacuum heat pressing apparatus 35. According to the present embodiment, a lens molding mold 35d provided with a plurality of lens molding recesses 35f having a hemispherical shape is provided on an undersurface of a press heater 35b (see FIG. 22).

While the plane circuit board 60 is set on a heater stand 35a of the vacuum heat pressing apparatus 35, a vacuum chamber is decompressed to be at a pressure of 10 torr. In such a state, the heated press heater 35b is lowered, and the plane circuit board 60, on which the sealing resin sheet 26 is stacked is heated by the heated press heater 35b at a temperature of approximately 100° C. while being pressurized at a pressure of 20 kg/cm². According to this, the silicone resin of the sealing resin sheet 26 is melted, so that the lens molding recesses 35f of the lens molding mold 35d can be filled with the silicone resin. Further, in a case where the plane circuit board 60 is further heated to a temperature of approximately 150° C., the silicone resin filled in the lens molding recesses 35f can be totally cured by secondary cross-linking.

After heat pressing is carried out by the vacuum heat pressing apparatus 35, a pressure in a vacuum chamber 35c is returned to a normal pressure by releasing a decompression state in the vacuum chamber 35c. Thereafter, the press heater 35b is raised, so that a vacuum heat pressing process carried out by the vacuum heat pressing apparatus 35 is ended.

FIG. 23(a) is a perspective view of the plane circuit board 60 subjected to the pressurized pressing illustrated in FIG. 22. FIG. 23(b) is a perspective view illustrating a light-emitting device 1d obtained by dividing the plane circuit board 60 illustrated in FIG. 23(a). On the plane circuit board 60 subjected to the vacuum heat pressing process, the light emitting elements 63 are sealed with respective sealing resins 21 having a hemispherical shape (see FIG. 23(a)).

In a case where the plane circuit board 60 is divided for each of the light emitting elements 63, it is possible to obtain a light-emitting device 1d in which a light-emitting element 63 mounted on a circuit board 61 is sealed with a sealing resin 21 of a convex lens type (see FIG. 23(b)).

As described earlier, a light-emitting device production method in accordance with the present embodiment includes: a mounting step of mounting a plurality of light-emitting devices 13 on the plane circuit board 60 having a plane surface; a positioning step of, in order that the light-emitting devices 63 are contained in a respective plurality of recesses 26a which are provided in the sealing resin sheet 26 and in which the respective light-emitting devices 63 can be contained, positioning the sealing resin sheet 26 on the plane circuit board 60; a heating step of heating the positioned sealing resin sheet 26 while pressurizing the sealing resin sheet 26 via the lens molding mold 35d provided with the lens molding recesses 35f which face the respective light-emitting elements 63 mounted on the plane circuit board 60; and a curing step of totally curing a melted silicone resin by secondary cross-linking in the lens molding recesses 35f.

The sealing resin sheet 26 used for the light-emitting device production method in accordance with the present embodiment is made of a silicone resin having the viscosity characteristic shown in FIG. 4, and is obtained by evenly dispersing the fluorescent material in the semi-cured silicone resin subjected to primary cross-linking.

Therefore, according to the present embodiment, it is possible to attain a light-emitting device production method that allows equalization, among light-emitting devices 1d, of a concentration of the fluorescent material contained in the sealing resin 21 of a convex lens type.

Next, the following description discusses, with reference to FIGS. 24 through 27, modifications of the light-emitting device production method in accordance with the present embodiment.

The present embodiment discusses a method in which the light-emitting device 1d sealed with the sealing resin 21 of a convex lens type is produced. However, a light-emitting display device 50 of a dot matrix type can be produced by use of the light-emitting device production method in accordance with the present invention.

FIG. 24(a) is a plan view showing an example of the light-emitting display device 50 of a dot matrix type, and FIG. 24(b) is a cross-sectional view of the light-emitting display device 50 illustrated in FIG. 24(a). As shown in FIGS. 24(a) and 24(b), pairs of mounting wiring patterns 54 and connection wiring patterns 56 are provided vertically and horizontally in a matrix pattern on a plane circuit board 51.

A light-emitting element 53 is die-bonded to a mounting wiring pattern 54 via an electroconductive adhesive (not illustrated), and the light-emitting element 53 and a connection wiring pattern 56 are wire-bonded via an electroconductive wire 57 made of, for example, a gold wire. Further, a plurality of lead pins 51a are provided on a back surface of the plane circuit board 51.

Further, the plane circuit board 51 is provided with a reflecting plate 58 provided with openings 58a having a circular cross section that surrounds (i) the mounting wiring pattern 54 on which the light-emitting element 53 is mounted and (ii) the connection wiring pattern 56 which is wire-bonded to the light-emitting element 53 via the electroconductive wire 57.

According to the reflecting plate 58, the openings 58a each have at least an inner surface which has a reflecting function. In each of the openings 58a of the reflecting plate 58, the light-emitting element 53, the mounting wiring pattern 54, and the connection wiring pattern 56 are contained. The openings 58a are sealed with the sealing resin 21 containing the fluorescent material.

Such a light-emitting display device 50 of a dot matrix type can be produced by the following method.

FIG. 25 schematically shows an example of a method for producing the light-emitting display device 50 illustrated in each of FIGS. 24(a) and 24(b). First, as shown in FIG. 25, the mounting wiring patterns 54 and the connection wiring patterns 56 are provided on the plane circuit board 51. Then, the light-emitting elements 53 are die-bonded to the respective mounting wiring patterns 54 via the electroconductive adhesive (not illustrated). Further, the light-emitting elements 53 are wire-bonded to the respective connection wiring patterns 56 via the electroconductive wire 57 made of, for example, a gold wire (the mounting step).

Next, the reflecting plate 58 is placed on the plane circuit board 51 so that the mounting wiring patterns 54 on which the respective light-emitting element 53 are mounted and the connection wiring patterns 56 are contained in the respective openings 58*a* (a placing step). The reflecting plate 58 is made of, for example, a resin molded article having a reflecting function.

Next, a sealing resin sheet 20 is positioned on the reflecting plate 58 so as to close all the openings 58*a* (the positioning step). The reflecting plate 58 and the sealing resin sheet 20 which are stacked on the plane circuit board 51 in this order are set in a vacuum heat pressing apparatus 35 (see FIG. 16(*b*)).

FIG. 26 is a cross-sectional view illustrating a state of pressurized pressing in the vacuum heat pressing apparatus 35. According to the vacuum heat pressing apparatus 35, a fixture 35*g* is placed on a heater stand 35*a* that is provided in a vacuum chamber 35*c*, and a pressing member 35*k* is provided to a lower surface of a press heater 35*b* located in an upper part of the vacuum heat pressing apparatus 35 (see FIG. 26). The fixture 35*g* has a fixture recess 35*h* provided in a central part thereof so as to fit therein the plane circuit board 51, on which the reflecting plate 58 and the sealing resin sheet 20 are stacked.

A bottom surface 35*n* of the fixture recess 35*h* is covered with release paper 35*m* in advance. The plane circuit board 51 is positioned in the fixture recess 35*h* in a state in which the plane circuit board 51 is upside down, that is, the sealing resin sheet 20 is located lower than the plane circuit board 51 so as to be closer to the bottom surface 35*n*. This causes the sealing resin sheet 20 to be in contact with the release paper 35*m*, so that the sealing resin sheet 20, the reflecting plate 58, and the plane circuit board 51 are stacked in the fixture recess 35*h* in this order from a lower part of the fixture recess 35*h*.

After the plane circuit board 51 has been positioned in the fixture recess 35*h*, the vacuum chamber 35*c* is decompressed to be at a pressure of 10 torr, and the heater stand 35*a* is heated to a temperature of approximately 100° C. Then, the press heater 35*b* is lowered, and the plane circuit board 51 positioned in the fixture recess 35*h* is pressurized in a state in which the pressing member 35*k* provided to the lower surface of the press heater 35*b* is provided between lead pins 59 provided on a back surface of the plane circuit board 51 (a melting step). In this case, the pressing member 35*k* carries out heat pressing with respect to the sealing resin sheet 20 while pressing the plane circuit board 51 at a pressure of 20 kg/cm². Note that the heater stand 35*a* is not heated in this case.

According to this, after the sealing resin sheet 20 is heated and the melted silicone resin is filled in all the openings 58*a* of the reflecting plate 58, the heater stand 35*a* is heated to a temperature of 150° C. (a curing step).

After the heat pressing is carried out, a pressure in the vacuum chamber 35*c* is returned to a normal pressure by releasing a decompression state in the vacuum chamber 35*c*. Thereafter, the heat pressing carried out by the pressing member 35*k* is released, so that the vacuum heat pressing process carried out by the vacuum heat pressing apparatus 35 is ended.

After such vacuum heat pressing is ended, the silicone resin covering the openings 58*a* is totally cured. This makes it possible to produce the light-emitting display device 50 which is of a dot matrix type and is illustrated in each of FIGS. 24(*a*) and 24(*b*).

According to the method for producing a light-emitting display device of a dot matrix type, it is only necessary to stack the sealing resin sheet 20 on the reflecting plate 58*a*, and it is unnecessary to carry out a special operation for fixing the reflecting plate 58.

The present embodiment discusses a method for producing a plurality of light-emitting devices 1*d* by mounting a plurality of light-emitting elements 63 on the plane circuit board 60 and simultaneously sealing the plurality of light-emitting elements 63. Alternatively, a single light-emitting device 1*e* may be produced by use of the light-emitting device production method in accordance with the present invention.

Figure 27:
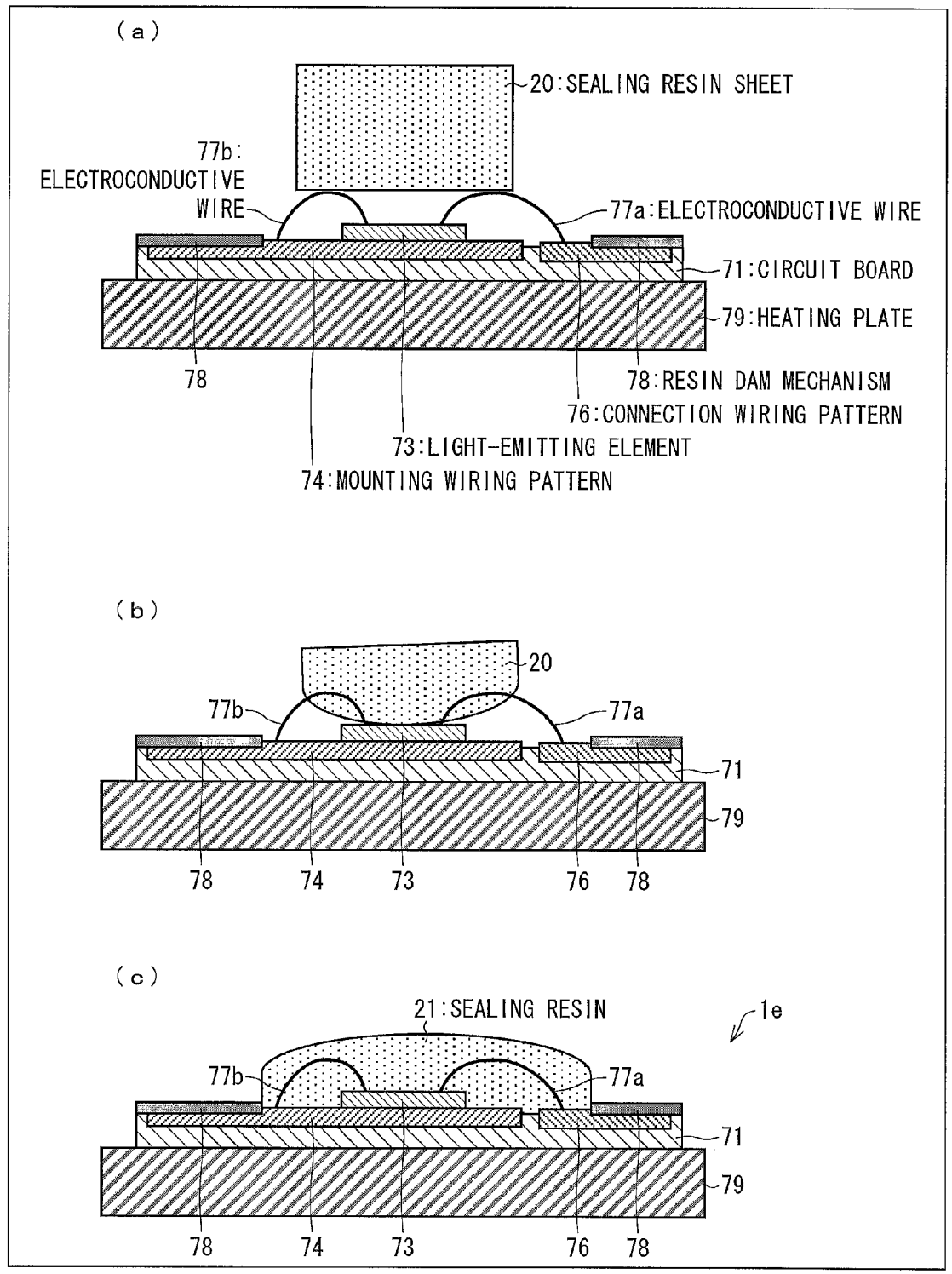
FIGS. 27(a) through 27(c) schematically illustrate a method for producing a single optical device.

FIGS. 27(*a*) through 27(*c*) schematically illustrate a method for producing the single light-emitting device 1*e*. First, a pair of a mounting wiring pattern 74 and a connection wiring pattern 76 is provided on a circuit board 71 having a plane surface, and a light-emitting element 73 is bonded to the mounting wiring pattern 74 (see FIG. 27(*a*)). Then, the light-emitting element 73 and the mounting wiring pattern 74 are wire-bonded via an electroconductive wire 77*b* made of, for example, a gold wire, and the light-emitting element 73 and the connection wiring pattern 76 are wire-bonded via an electroconductive wire 77*a* made of, for example, a gold wire (the mounting step). Further, the mounting wiring pattern 74 and the connection wiring pattern 76 are each provided with a resin dam mechanism 78 for the melted silicone resin to remain on an upper surface of the circuit board 71. Then, the circuit board 71 mounted with the light-emitting element 73 is set on a heating plate 79. A piece of the sealing resin sheet 20 which piece is obtained by dividing the sealing resin sheet 20 is positioned so as to face the upper surface of the light-emitting element 73 (the positioning step).

Next, as illustrated in FIG. 27(*b*), the circuit board 71 is heated from below by the heating plate 79 (the melting step) so as to melt the sealing resin sheet 20.

Next, while being in close contact with the upper surface and side surfaces of the light-emitting element 73, the melted silicone resin is further heated so as to be totally cured by secondary cross-linking, so that the sealing resin 21 is formed (the curing step) (see FIG. 27(*c*)).

As described earlier, according to the present modification, without using a mechanism for pressurization, it is possible to produce the light-emitting device 1*e* in a case where the piece of the sealing resin sheet 20 which piece is obtained by dividing the sealing resin sheet 20 is positioned so as to face the upper surface of the light-emitting element 73 with which the circuit board 71 is mounted, and the piece is heated.

Note that, in order to adjust a light distribution characteristic of the light-emitting device 1*e*, it is possible to appropriately form, on the sealing resin 21, a transparent resin layer that is, for example, dome-shaped or lens-shaped and contains no fluorescent material (such a transparent resin layer may be made of (i) a single silicone resin of which the sealing resin sheet 20 is made or (ii) another resin material).

Figure 2:
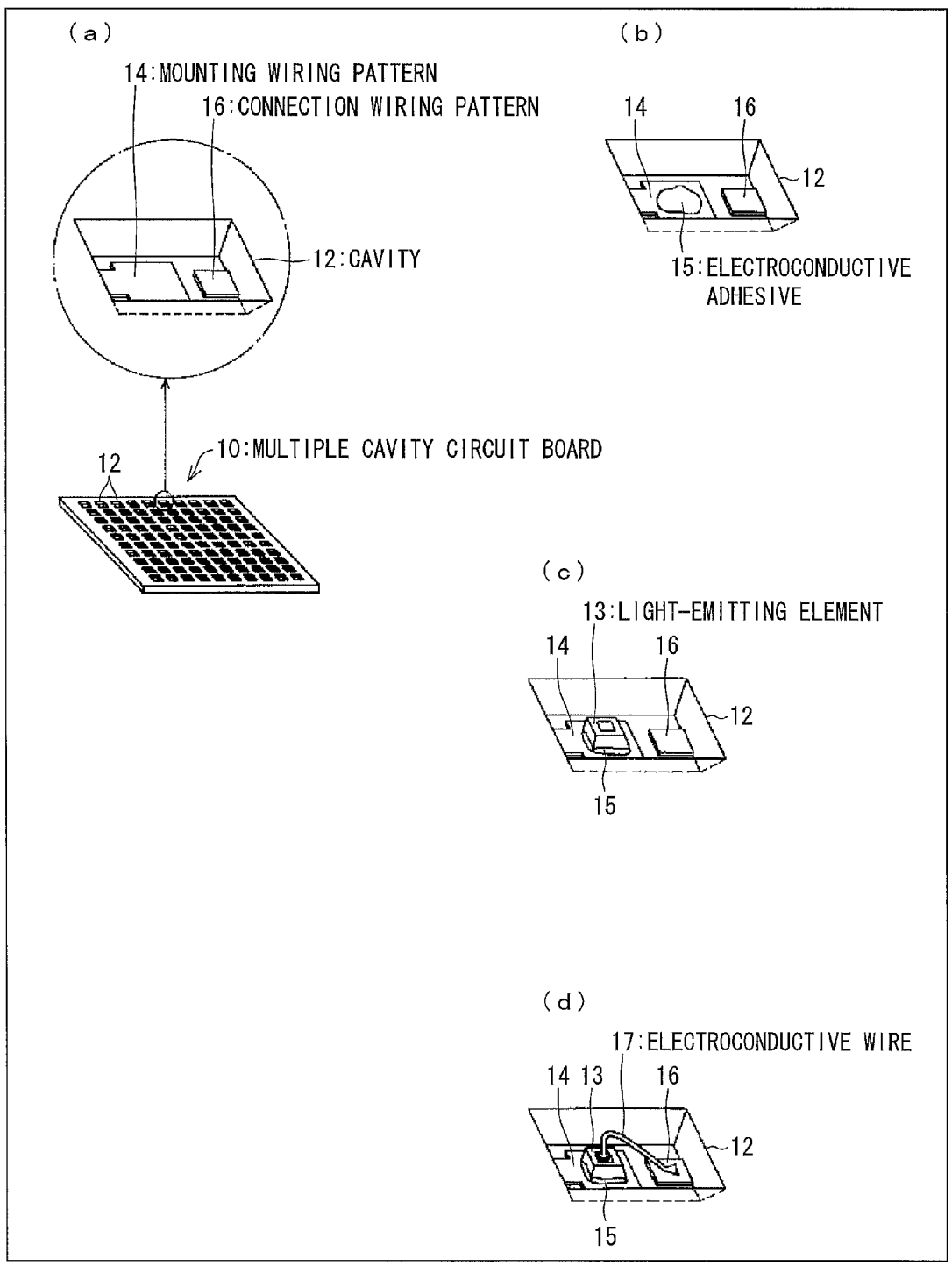
FIGS. 2(a) through 2(d) schematically illustrate a process in which light-emitting elements are mounted in respective cavities and which is included in a process for producing the light-emitting device illustrated in FIG. 1.
Figure 3:
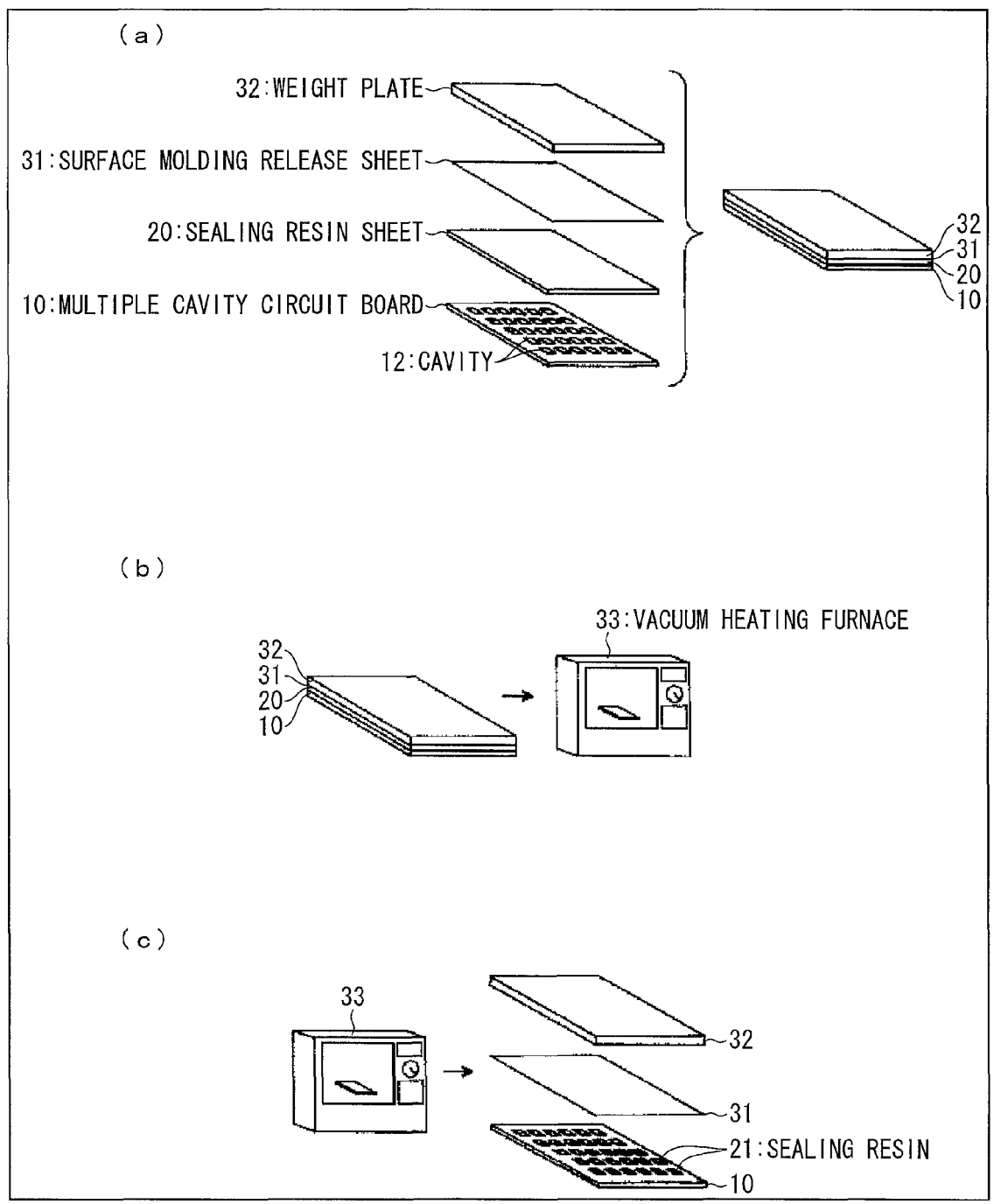
FIGS. 3(a) through 3(c) schematically illustrate a process in which the cavity is sealed with a sealing resin and which is included in the process for producing the light-emitting device illustrated in FIG. 1.

Note also that it is possible to seal, with the piece of the sealing resin sheet 20 which piece is obtained by dividing the sealing resin sheet 20, the light-emitting elements 13 mounted in the respective cavities 12 provided in the multiple cavity circuit board 10 illustrated in FIG. 2(*a*). Also in this case, it is possible to equalize the concentration of the fluorescent material among light-emitting devices by use of the pieces of the sealing resin sheet 20 which pieces are obtained by dividing the sealing resin sheet 20 in which the fluorescent material is evenly dispersed, the pieces having an equal size.

The following description discusses, with reference to FIGS. 28 through 31, a third embodiment of a light-emitting device production method in accordance with the present invention. Note that for convenience, members having functions identical to those of the respective members illustrated in the first and second embodiments are given respective identical reference numerals, and a description of those members is omitted here.

The light-emitting device production method in accordance with the present embodiment differs from the light-emitting device production method in accordance with Embodiment 1 mainly in that the sealing resin sheet 20 is replaced with sealing mixed powder (a sealing member) 120 in which (i) powder of a silicone resin used for the sealing resin sheet 20 and (ii) the fluorescent material are mixed.

Figure 28:
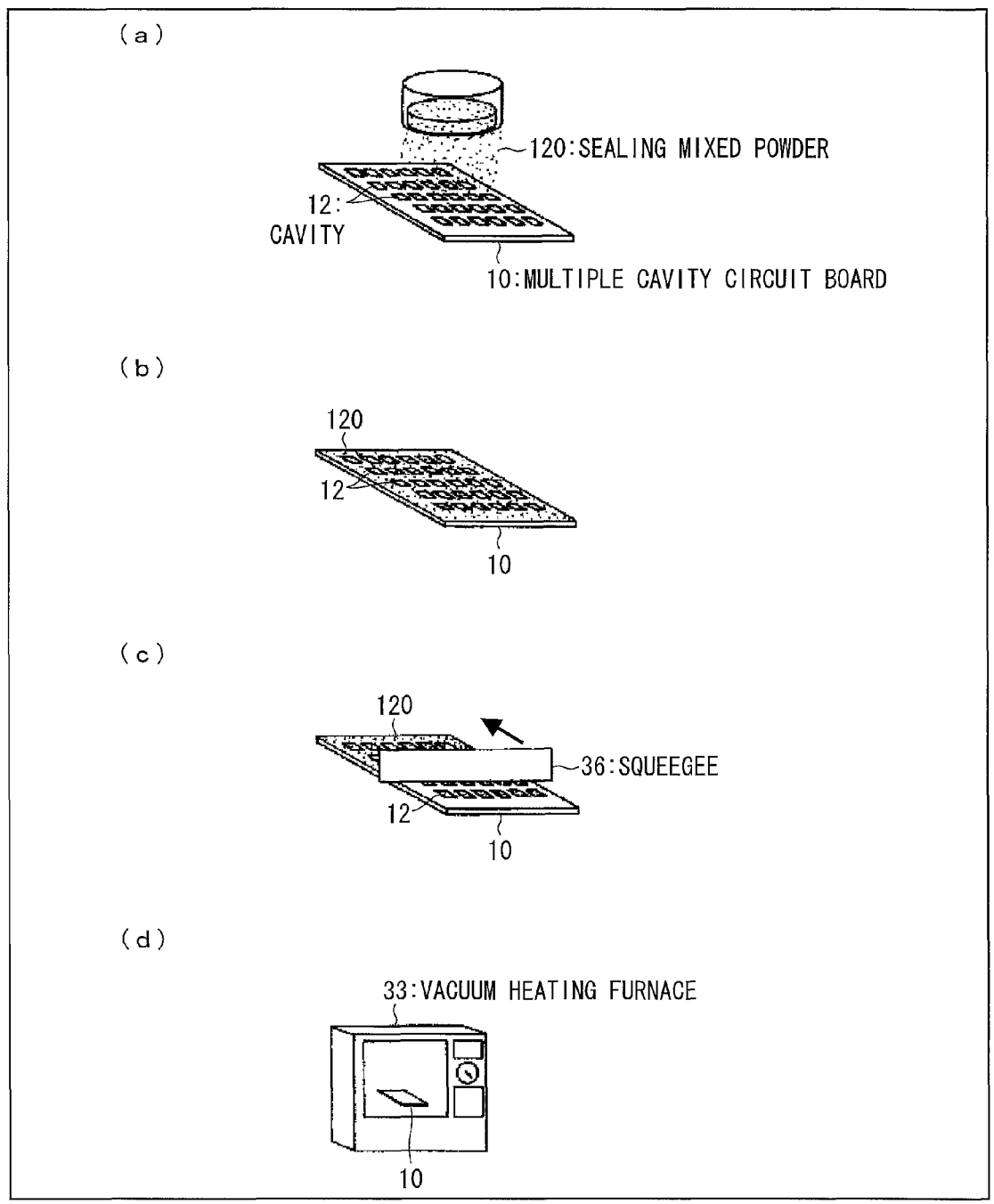
FIGS. 28(a) through 28(d) schematically illustrate a light-emitting device production method in accordance with Embodiment 3.

FIGS. 28(*a*) through 28(*d*) schematically illustrate a light-emitting device production method in accordance with the present embodiment. First, the sealing mixed powder 120 in which powder of the silicone resin and the fluorescent material are mixed is sprinkled over (or applied to) an entire surface of a multiple cavity circuit board 10 mounted with light-emitting elements 13 (see FIG. 28(*a*)), so that the entire surface of the multiple cavity circuit board 10 is covered with the sealing mixed powder 120 (see FIG. 28(*b*)) (a positioning step).

The sealing mixed powder 120, which is made of the silicone resin having the viscosity characteristic shown in FIG. 4, is obtained by sufficiently mixing (i) powder of the silicone resin which has been subjected to primary cross-linking and is in a semi-cured state and (ii) the fluorescent material until the fluorescent material is evenly dispersed. A method for pulverizing the silicone resin is not particularly limited, but can be exemplified by, for example, a method in which a jet mill having a cooling function is used at a low temperature to grind the silicone resin into pieces having a diameter of approximately 10 μm.

Further, during preparation of the sealing mixed powder 120 by mixing (i) powder of the silicone resin subjected to a primary cross-linking reaction and (ii) the fluorescent material, powder of the silicone resin subjected to a secondary cross-linking reaction may further be mixed. The silicone resin subjected to the secondary cross-linking reaction maintains a totally cured state also during the heating in, for example, a curing step. Therefore, in a case where powder of the silicone resin subjected to the secondary cross-linking reaction is mixed in the sealing mixed powder 120, it is possible to prevent precipitation of the fluorescent material, which precipitation may occur when the sealing mixed powder 120 filled in cavities 12 is heated, so that the silicone resin subjected to the primary cross-linking reaction is in a melted state.

Next, the sealing mixed powder 120 attached to the surface of the multiple cavity circuit board 10 is removed by causing a squeegee 36 to move along the surface of the multiple cavity circuit board 10 while the squeegee 36 is in contact with the multiple cavity circuit board 10 (see FIG. 28(*c*)). This causes the cavities 12 provided in the multiple cavity circuit board 10 to be full of the sealing mixed powder 120. In this case, an amount of the fluorescent material contained in the sealing mixed powder 120 which is filled (positioned) in the cavities 12 is substantially equalized. Note that the sealing mixed powder 120 removed from the surface of the multiple cavity circuit 10 is a non-cured resin which has been subjected to the primary cross-linking reaction and has not been subjected to the secondary cross-linking reaction. Therefore, the sealing mixed powder 120 can be collected to be reused.

After the sealing mixed powder 120 is filled in the cavities 12, the multiple cavity circuit board 10 is provided in a vacuum heating furnace 33 to be heated (see FIG. 28(*d*)). When the sealing mixed powder 120 is heated to a temperature of approximately 100° C. by the vacuum heating furnace 33, powder of the silicone resin in the cavities 12 is melted, and the silicone resin thus melted is deaerated in a case where an inner part of the vacuum heating furnace 33 is made vacuous (a melting step). Thereafter, when the silicone resin is further heated to a high temperature of approximately 150° C. by the vacuum heating furnace 33, the silicone resin is cured by secondary cross-linking (the curing step).

Thereafter, the multiple cavity circuit board 10 is divided for each of the cavities 12, it is possible to obtain a light-emitting device in which a light-emitting element 13 in a cavity 12 is sealed with a sealing resin 21.

As compared with the method that uses the piece of the sealing resin sheet 20 which piece is obtained by dividing the sealing resin sheet 20 and that is illustrated in FIGS. 27(*a*) through (*c*), the light-emitting device production method in accordance with the present embodiment more easily improves evenness with which the fluorescent material is dispersed in the sealing resin 21.

This is because of the following reason. According to the light-emitting device production method in accordance with the present embodiment, since the silicone resin in a powdered state and the florescent material are mixed, the fluorescent material can be sufficiently dispersed without being influenced by a viscosity of the silicone resin, so that the fluorescent material can be more evenly dispersed in the sealing mixed powder 120.

FIG. 29 is a chart showing data on the light-emitting device production method in accordance with the present embodiment. FIG. 29 also shows, as comparative examples, data shown in FIG. 8 and obtained by the conventional casting sealing method and by the sheet resin method of Embodiment 1.

As shown in FIG. 29, chromaticity distribution widths for the conventional casting sealing method and the sheet resin method of Embodiment 1 are 15 ranks and 3 ranks, respectively, whereas a chromaticity distribution width for a powder application method of the present embodiment is 1 rank, which shows a great improvement in variation in chromaticity value. This is because of the following reason. According to the powder application method of the present embodiment, in the step of filling the sealing mixed powder 120 in the cavities 12 (the positioning step), the sealing mixed powder 120 which is unnecessary and is attached to the surface, between the respective cavities 12, of the multiple cavity circuit board 10 can be removed without having much influence on a concentration and the amount of the fluorescent material contained in the sealing mixed powder 120 filled in the cavities 12. Therefore, as compared with the other methods, the powder application method of the present embodiment makes it possible to more securely control an amount of the sealing mixed powder 120 to be filled in the cavities 12.

Note that in order to allow a further improvement in chromaticity distribution width, it is preferable that a silicone resin powder particle and a fluorescent material particle differ in particle size. According to this, an air gap is less likely to be made between powder of the silicone resin and the fluorescent material while the sealing mixed powder 120 is being filled in the cavities 12. This allows the silicone resin obtained after the heating to have a smaller degree of volume shrinkage.

The above description thus shows that, as compared with the light-emitting devices produced by the conventional casting sealing method and the sheet resin method of Embodiment 1, a light-emitting device produced by the powder application method of the present embodiment has smaller X and Y values, and a smaller value of the rank (division), so that light-emitting devices mass-produced by the powder application method much less vary in chromaticity value.

Amounts of a waste resin and a waste fluorescent material for the conventional casting sealing method and the sheet resin method of Embodiment 1 are 50 parts and 10 parts, respectively, whereas an amount of a waste resin and a waste fluorescent material for the powder application method of the present embodiment is zero in principle. This is because according to the powder application method of the present embodiment, a surplus of the sealing mixed powder 120 which surplus overflows from the cavities 12 in the step of filling the sealing mixed powder 120 in the cavities 12 can be collected and reused.

As described earlier, according to the powder application method of the present embodiment, the amount of the waste resin and the waste fluorescent material is zero in principle. This shows that the powder application method of the present embodiment is extremely economical.

As described earlier, according to the light-emitting device production method in accordance with the present embodiment, the light-emitting elements 13 in the respective cavities 12 are sealed in a case where the sealing mixed powder 120 in which powder of the silicone resin and the fluorescent material are mixed is heated in the positioning step in a state in which the sealing mixed powder 120 is filled in the cavities 12 in which the respective light-emitting elements 13 are mounted.

According to the light-emitting device production method in accordance with the present embodiment, in a case where powder of the silicone resin and the fluorescent material are sufficiently mixed until the fluorescent material is evenly dispersed, it is possible to substantially equalize the amount of fluorescent material contained in the sealing mixed powder 120, which is positioned in the cavities 12 in the positioning step.

Therefore, according to the present embodiment, it is possible to attain a light-emitting device production method that allows equalization of a concentration of a fluorescent material among light-emitting devices.

Figure 30:
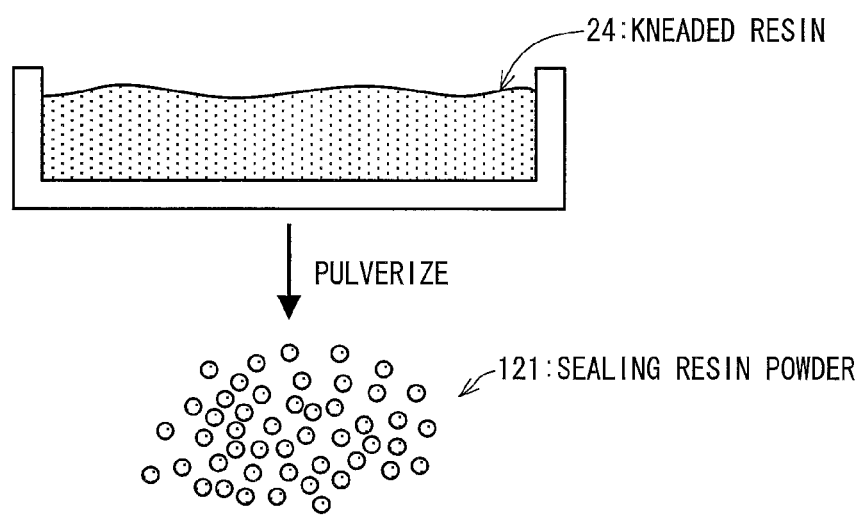
FIG. 30 schematically illustrates a process for producing sealing resin powder which is powder of a silicone resin containing a fluorescent material.
Figure 31:
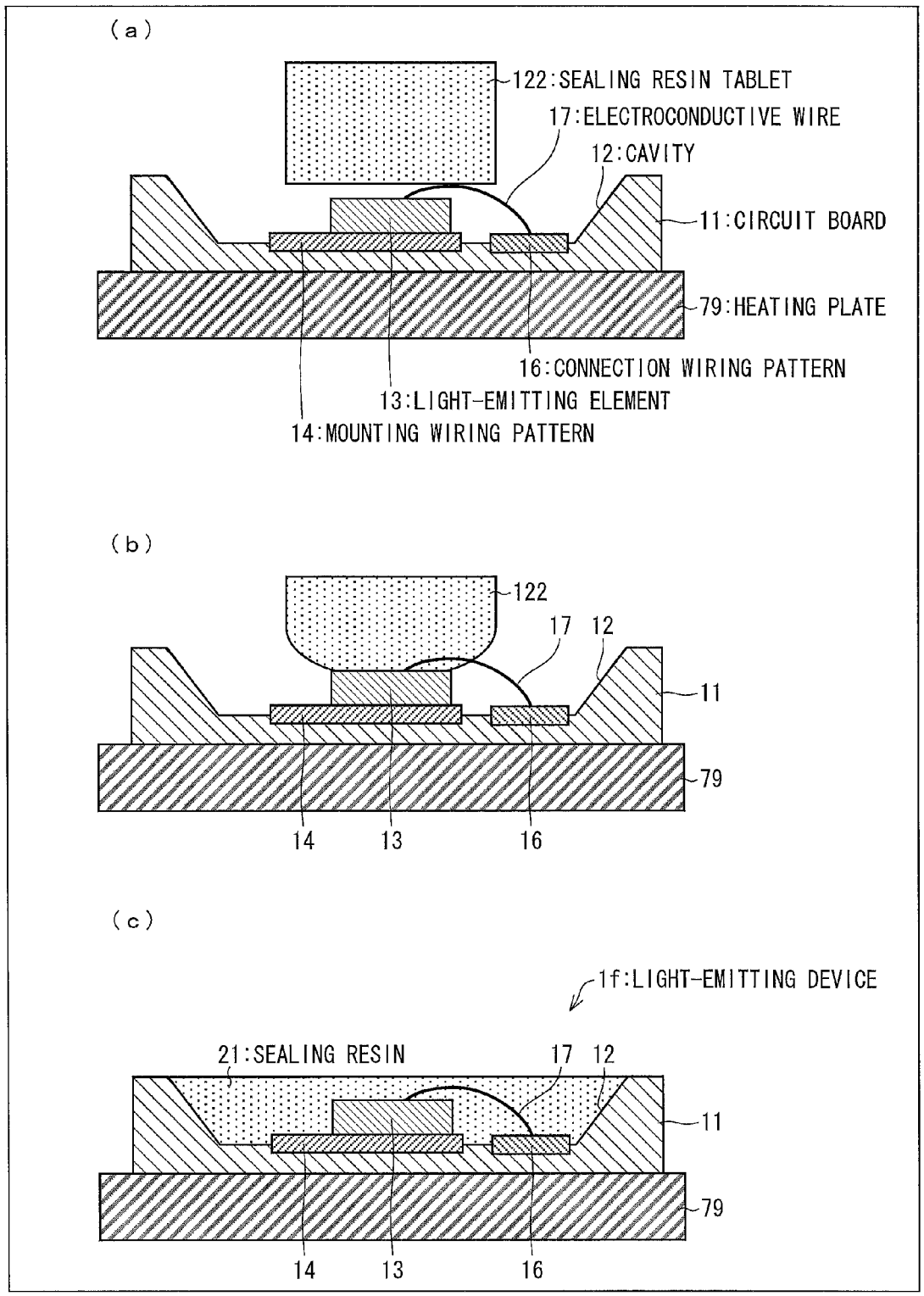
FIGS. 31(a) through 31(c) schematically illustrate a method for producing a light-emitting device in which a sealing resin tablet is used.

Next, the following description discusses, with reference to FIGS. 30 and 31, modifications of the light-emitting device production method in accordance with the present embodiment.

The present embodiment discusses a method that uses the sealing mixed powder 120 in which powder of the silicone resin powder and the fluorescent material are mixed. Alternatively, the sealing mixed powder 120 may be replaced with sealing resin powder 121 (the sealing member) made of powder of the silicone resin containing the fluorescent material.

FIG. 30 schematically illustrates a process for producing the sealing resin powder 121 which is powder of the silicone resin containing the fluorescent material.

The sealing resin powder 121 is powder obtained by evenly dispersing the fluorescent material in the silicone resin having the viscosity characteristic shown in FIG. 4. As illustrated in FIG. 30, the sealing resin powder 121 is obtained in a case where a jet mill having a cooling function is used at a low temperature to grind, into pieces having a diameter of approximately 25 μm, a kneaded resin 24, which is a silicone resin 22 in which the fluorescent material is evenly dispersed (see FIG. 9(c)).

Also in a case where the sealing mixed powder 120 is replaced with the sealing resin powder 121, the amount of the fluorescent material contained in the sealing resin powder 121 which is filled in cavities 12 is substantially equalized. Therefore, it is possible to attain a light-emitting device production method that allows equalization of a concentration of a fluorescent material among light-emitting devices.

A cavity 12 may be sealed with a sealing resin tablet (the sealing member) 122 which is molded into a tablet by compressing the sealing mixed powder 120 or the sealing resin powder 121.

FIGS. 31(a) through 31(c) schematically illustrate a method for producing a light-emitting device in which the sealing resin tablet 122 is used. In this case, as illustrated in FIG. 31(a), the sealing resin tablet 122 is positioned in the cavity 12 provided in a circuit board 11 (the positioning step). The sealing resin tablet 122 is molded into a tablet by compressing the sealing mixed powder 120 illustrated in FIG. 28(a) or the sealing resin powder 121 illustrated in FIG. 30.

Note that heating may be carried out at a low temperature in a step of compressing the sealing mixed powder 120 or the sealing resin powder 121 into a tablet. This allows a closer contact between powder of the silicone resin and the fluorescent material and among powder particles of the silicone resin containing the fluorescent material. Therefore, the sealing mixed powder 120 or the sealing resin powder 121 can be easily integrated (formed into a tablet).

Next, as illustrated in FIG. 31(b), the sealing resin tablet 122 is melted in a case where the circuit board 11 is heated from below by a heating plate 79 in a state in which the sealing resin tablet 122 is positioned in the cavity 12 (the melting step).

Next, while being in close contact with an upper surface and side surfaces of a light-emitting element 13, a melted silicone resin is further heated to a secondary cross-linking temperature $T_1$ so as to be totally cured by secondary cross-linking (the curing step) (see FIG. 31(c)). This allows formation of the sealing resin 21 and production of a light-emitting device 1f.

As described earlier, according to the present modification, without using a mechanism for vacuumization, it is possible to produce the light-emitting device 1f by heating the sealing resin tablet 122 positioned in the cavity 12.

As compared with a method in which the sealing mixed powder 120 or the sealing resin powder 121 is used as it is, the light-emitting device production method in accordance with the present modification is less likely to make a gap between powder of the silicone resin and the fluorescent material and among powder particles of the silicone resin containing the fluorescent material. This allows the silicone resin obtained after the heating to have a smaller degree of volume shrinkage. Therefore, the sealing can be carried out in accordance with a size of the cavity 12, and it is possible to reduce a variation in chromaticity value among light-emitting devices 1f.

Further, according to the light-emitting device production method in accordance with the present modification, it is possible to increase handleability of the sealing mixed powder 120 and the sealing resin powder 121.

The cavity 12 may be sealed with a sealing mixed powder sheet (the sealing resin sheet, the sealing member) 123 which is molded into a sheet by compressing the sealing mixed powder 120.

FIGS. 32(a) through 32(e) schematically illustrate a method for producing the sealing mixed powder sheet 123 obtained by forming, into a sheet, the sealing mixed powder 120 illustrated in FIG. 28(a).

Figure 32:
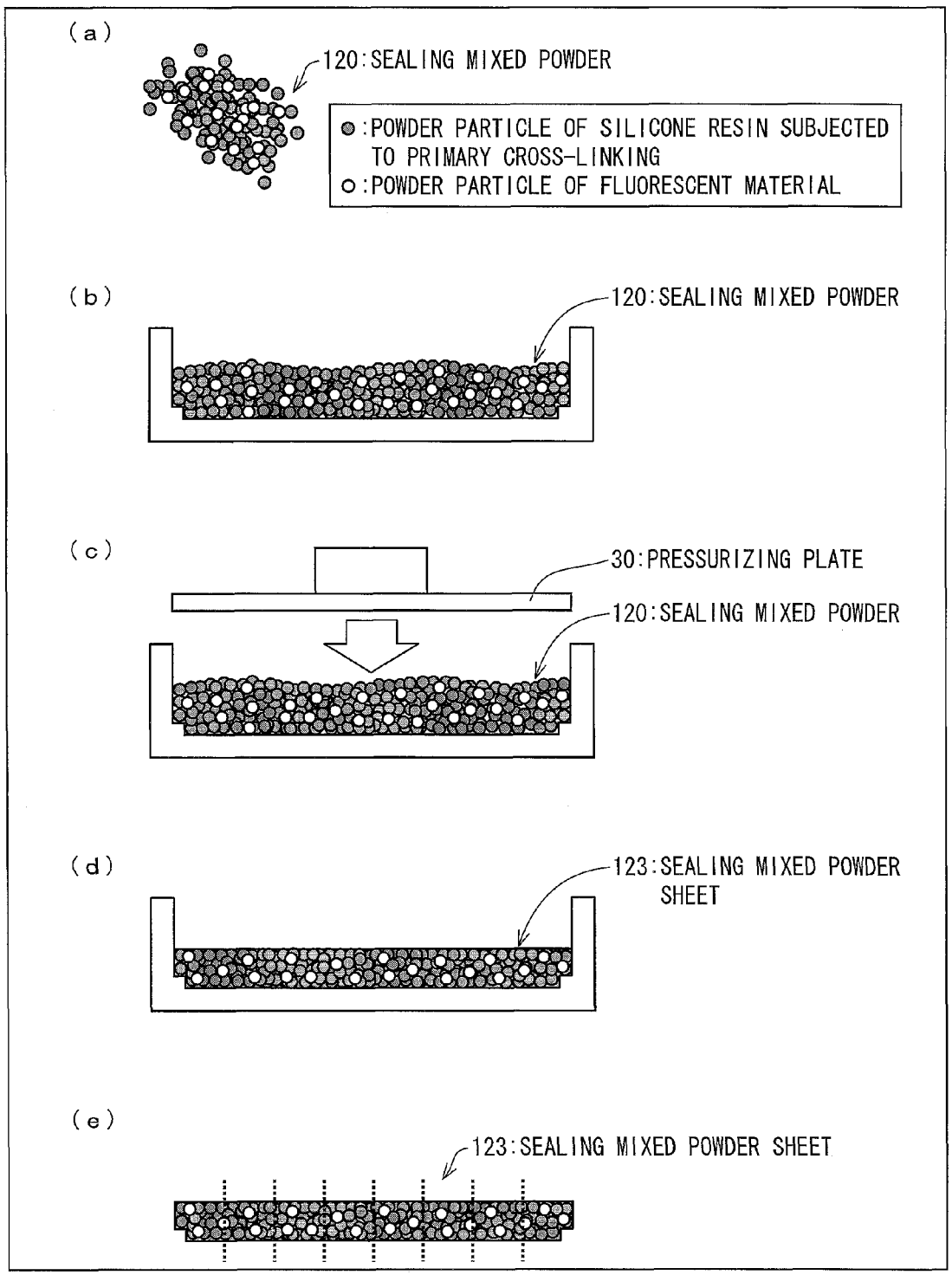
FIGS. 32(a) through 32(e) schematically illustrate a method for producing a sealing mixed powder sheet obtained by forming, into a sheet, sealing mixed powder illustrated in FIG. 28(a).
Figure 33:
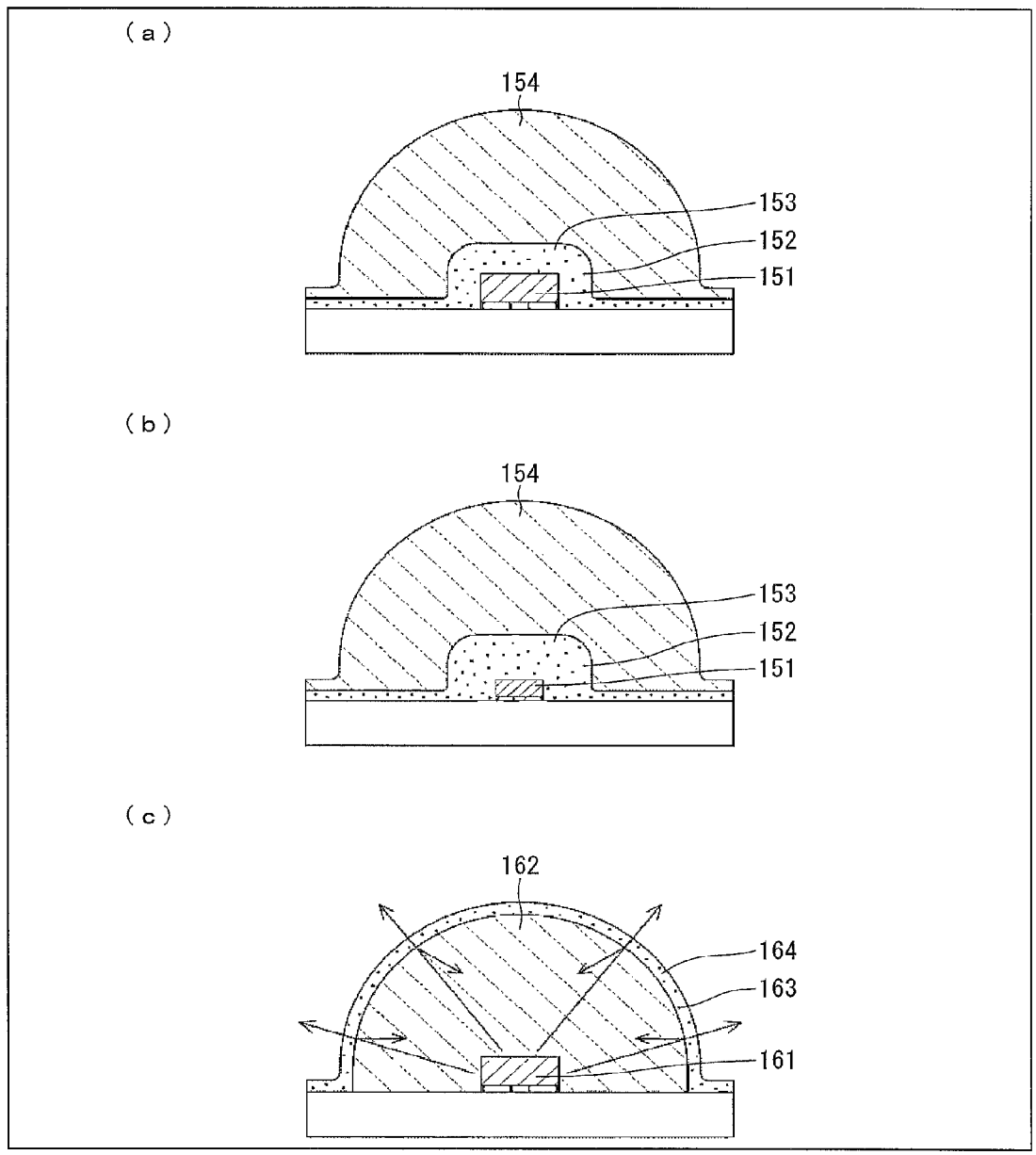
FIG. 33 is a cross-sectional view illustrating a configuration of a conventional light-emitting device.

First, the sealing mixed powder 120 is obtained by sufficiently mixing (i) powder of the silicone resin which has been subjected to primary cross-linking and is in a semi-cured state and (ii) the fluorescent material until the fluorescent material is evenly dispersed (see FIG. 32(a)).

Next, the sealing mixed powder 120 is introduced into a mold (see FIG. 32(b)), and the sealing mixed powder 120 is molded into a sheet by compression molding by use of a pressurizing plate 30 (see FIG. 32(c)).

This makes it possible to produce the sealing mixed powder sheet 123 which is molded by compressing the sealing mixed powder 120 into a sheet (see FIG. 32(d)).

According to such a method as described above for producing the sealing mixed powder sheet 123 (a dry blending method), no expensive kneading equipment is used that is essential to the light-emitting device production method as illustrated in FIGS. 9(a) through 9(e) of for producing the sealing resin sheet 20 by forming the kneaded resin 24 into a sheet and that has (i) a temperature regulating function for adjusting a viscosity of the silicone resin during the kneading and (ii) abrasion resistance to the fluorescent material. Therefore, it is possible to produce the sealing mixed powder sheet 123 at a low cost and in a short time.

The sealing mixed powder sheet 123 thus produced can replace the sealing resin sheet 20 illustrated in FIG. 3(a).

Note that, it is preferable that powder of the silicone resin totally cured by secondary cross-linking be further mixed in the sealing mixed powder 120 which is used for producing the sealing mixed powder sheet 123. The silicone resin subjected to secondary cross-linking maintains a totally cured state also during the heating in each of the melting step and the curing step. Therefore, in a case where the sealing mixed powder 120 in which powder of the silicone resin subjected to secondary cross-linking is mixed is formed into a sheet, it is possible to produce the sealing mixed powder sheet 123 that can prevent precipitation of the fluorescent material during the heating in, for example, the curing step.

Note also that the light-emitting elements 13 may be individually sealed with pieces of the sealing mixed powder sheet 123 which pieces are obtained by dividing the sealing mixed powder sheet 123 (see FIG. 32(e)).

As described earlier, a light-emitting device production method in accordance with the present invention includes: a mounting step of mounting at least one light-emitting element on a substrate; a positioning step of positioning a sealing member so that the sealing member faces an upper surface of the at least one light-emitting element mounted in the mounting step, the sealing member at least containing a silicone resin semi-cured by primary cross-linking and a fluorescent material; a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature.

According to the light-emitting device production method, a sealing member is positioned so that the sealing member faces an upper surface of the at least one light-emitting element mounted on the substrate, the sealing member at least containing a silicone resin semi-cured by primary cross-linking and a fluorescent material.

Note here that the silicone resin decreases in viscosity reversibly in a temperature region between a room temperature and the temperature lower than the secondary cross-linking temperature, and is totally cured non-reversibly in a temperature region equal to or higher than the secondary cross-linking temperature. Therefore, a viscosity of the silicone resin can be repeatedly controlled by changing a temperature in the temperature region between the room temperature and the temperature lower than the secondary cross-linking temperature.

Accordingly, for example, in a case where the viscosity of the silicone resin is controlled (reduced), during kneading of the fluorescent material with the silicone resin, to an extent that the kneaded fluorescent material is not precipitated, the fluorescent material can be evenly dispersed in the silicone resin.

Hence, according to the light-emitting device production method, it is possible to obtain a sealing member in which the fluorescent material is evenly dispersed in the silicone resin. Therefore, in a case where a light-emitting element is sealed with the sealing member, it is possible to attain a light-emitting device production method that allows (i) equalization of a concentration of a fluorescent material among light-emitting devices and (ii) a smaller variation in chromaticity value which variation is caused by a fluorescent material concentration and a fluorescent material contained amount.

The light-emitting device production method in accordance with the present invention is preferably arranged such that the sealing member positioned in the positioning step is sealing mixed powder in which powder of the silicone resin subjected to primary cross-linking and the fluorescent material are at least mixed.

According to the light-emitting device production method, in a case where powder of the silicone resin subjected to primary cross-linking and the fluorescent material are sufficiently mixed, the fluorescent material is evenly dispersed in the sealing mixed powder.

Therefore, according to the light-emitting device production method, in a case where the sealing mixed powder is positioned in a fixed amount in the positioning step, it is possible to equalize a concentration of a fluorescent material among light-emitting devices.

The light-emitting device production method in accordance with the present invention is preferably arranged such that powder of the silicone resin totally cured by secondary cross-linking is further mixed in the sealing mixed powder.

According to the light-emitting device production method, powder of the silicone resin totally cured by secondary cross-linking is further mixed in the sealing mixed powder. The silicone resin subjected to secondary cross-linking maintains a totally cured state also during the heating in each of the melting step and the curing step. Therefore, in a case where powder of the silicone resin subjected to secondary cross-linking is contained in the sealing mixed powder, it is possible to prevent precipitation of the fluorescent material in each of the melting step and the curing step.

Therefore, according to the light-emitting device production method, the fluorescent material can improve in state of dispersion in a light-emitting device.

The light-emitting device production method in accordance with the present invention is preferably arranged such that the sealing member positioned in the positioning step is a sealing resin sheet which is made of a sheet containing the fluorescent material and which at least contains the silicone resin subjected to primary cross-linking.

The light-emitting device production method in accordance with the present invention is preferably arranged such that the sealing resin sheet is obtained by forming, into a sheet, a kneaded resin obtained by kneading the fluorescent material with the silicone resin subjected to primary cross-linking and heated at the temperature lower than the secondary cross-linking temperature.

According to the light-emitting device production method, in a case where the fluorescent material is kneaded with the silicone resin while the viscosity of the silicone resin is controlled to an extent that the fluorescent material is not precipitated, it is possible to obtain a kneaded resin in which the fluorescent material is evenly dispersed in the silicone resin.

Accordingly, in a case where the sealing resin sheet obtained by forming the kneaded resin into a sheet is positioned in the positioning step, it is possible to equalize a concentration of a fluorescent material among light-emitting devices.

The light-emitting device production method in accordance with the present invention is preferably arranged such that the sealing resin sheet is obtained by compressing, into a sheet, sealing mixed powder in which powder of the silicone resin subjected to primary cross-linking and the fluorescent material are at least mixed.

According to the light-emitting device production method, the sealing resin sheet is obtained by compressing, into a sheet, sealing mixed powder in which powder of the silicone resin subjected to primary cross-linking and the fluorescent material are at least mixed. Therefore, it is possible to easily produce a sealing resin sheet without using expensive kneading equipment that is essential to the light-emitting device production method for producing the sealing resin sheet by forming the kneaded resin into a sheet and that has (i) a temperature regulating function for adjusting a viscosity of the silicone resin during the kneading and (ii) abrasion resistance to the fluorescent material.

Therefore, according to the light-emitting device production method, it is possible to produce a sealing resin sheet at a low cost and in a short time.

The light-emitting device production method in accordance with the present invention is preferably arranged such that powder of the silicone resin totally cured by secondary cross-linking is further mixed in the sealing mixed powder.

According to the light-emitting device production method, powder of the silicone resin totally cured by secondary cross-linking is further mixed in the sealing mixed powder. The silicone resin subjected to secondary cross-linking maintains a totally cured state also during the heating in, for example, the curing step. Therefore, in a case where the sealing mixed powder in which powder of the silicone resin subjected to secondary cross-linking is mixed is formed into a sheet, it is possible to produce a sealing resin sheet that can prevent precipitation of the fluorescent material during the heating in, for example, the curing step.

Therefore, according to the light-emitting device production method, the fluorescent material can improve in state of dispersion in a light-emitting device.

The light-emitting device production method in accordance with the present invention is preferably arranged such that the sealing member positioned in the positioning step is sealing resin powder which is made of powder of the silicone resin subjected to primary cross-linking and which contains the fluorescent material.

The light-emitting device production method in accordance with the present invention is preferably arranged such that the sealing resin powder is obtained by pulverizing a kneaded resin obtained by kneading the fluorescent material with the silicone resin subjected to primary cross-linking and heated at the temperature lower than the secondary cross-linking temperature.

According to the light-emitting device production method, in a case where the fluorescent material is kneaded with the silicone resin while the viscosity of the silicone resin is controlled to an extent that the fluorescent material is not precipitated, it is possible to obtain a kneaded resin in which the fluorescent material is evenly dispersed in the silicone resin.

Accordingly, in a case where the sealing resin powder obtained by pulverizing the kneaded resin is positioned in a fixed amount in the positioning step, it is possible to equalize a concentration of a fluorescent material among light-emitting devices.

The light-emitting device production method in accordance with the present invention is preferably arranged such that: in the mounting step, the at least one light-emitting element is mounted in a respective plurality of cavities which are provided in the substrate so as to open upward; in the positioning step, the sealing resin sheet is stacked, as the sealing member, on the substrate so as to cover all the plurality of cavities provided in the substrate; in the melting step, the melted sealing member is pressurized so as to be filled in the plurality of cavities; and in the curing step, the silicone resin subjected to primary cross-linking and contained in the sealing member which has been filled in the plurality of cavities is totally cured.

According to the light-emitting device production method, the sealing resin sheet that is stacked, as the sealing member, on the substrate so as to cover all the plurality of cavities provided in the substrate is heated while the melted sealing member (silicone resin) is pressurized so as to be filled in the plurality of cavities. Therefore, the melted sealing member can be simultaneously filled in the plurality of cavities. Then, in a case where the silicone resin subjected to primary cross-linking and contained in the sealing member which has been filled in the plurality of cavities is totally cured, the at least one light-emitting element mounted in the respective plurality of cavities can be simultaneously sealed.

Therefore, as compared with a method for separately filling cavities with a sealing member for each of the cavities, the light-emitting device production method allows the sealing member that is filled in the plurality of cavities to less vary in characteristic and/or amount for each of the plurality of cavities. This can prevent a variation in characteristic among light-emitting devices.

Further, the light-emitting device production method allows the melted sealing member to be simultaneously filled in the plurality of cavities without using a special dispenser, a molding machine, or the like for causing the melted sealing member to be filled in the plurality of cavities. This allows a remarkable increase in production efficiency of the light-emitting devices.

The light-emitting device production method in accordance with the present invention is preferably arranged such that the plurality of cavities provided in the substrate are provided with respective through holes.

According to the light-emitting device production method, the plurality of cavities provided in the substrate are provided with respective through holes. This promotes exhaust of air from the plurality of cavities.

The light-emitting device production method in accordance with the present invention is preferably arranged such that the sealing resin sheet is provided with through holes which face the respective plurality of cavities.

According to the light-emitting device production method, the sealing resin sheet is provided with through holes which face the respective plurality of cavities. This promotes exhaust of air from the plurality of cavities.

The light-emitting device production method in accordance with the present invention is preferably arranged such that: in the positioning step, a surface molding release sheet having a surface provided with pearskin-finished unevenness is further stacked and positioned on the sealing resin sheet; and in the curing step, the silicone resin subjected to primary cross-linking and contained in the sealing member is totally cured while the surface molding release sheet is in contact with a surface of the sealing member which has been filled in the plurality of cavities.

According to the light-emitting device production method, in the positioning step, a surface molding release sheet having a surface provided with pearskin-finished unevenness is stacked and positioned on the sealing resin sheet; and in the curing step, the silicone resin subjected to primary cross-linking and contained in the sealing member is totally cured while the surface molding release sheet is in contact with a surface of the sealing member which has been filled in the plurality of cavities.

Therefore, according to the light-emitting device production method, the sealing member that is totally cured has a surface provided with pearskin-finished unevenness. Therefore, this unevenness allows an increase in light extraction efficiency of the light-emitting devices.

Further, in a case where a surface molding release sheet having a porous paper quality is used as the surface molding release sheet of the present invention, it is possible to smoothly exhaust air from the plurality of cavities.

The light-emitting device production method in accordance with the present invention is preferably arranged such that: in the positioning step, a lens molding resin sheet made of a light-transmissive resin is further stacked and positioned on the sealing resin sheet; and in the melting step, the lens molding resin sheet is pressurized against the sealing resin sheet via a lens molding mold provided with at least one lens molding recess which faces the at least one light-emitting element mounted on the substrate.

According to the light-emitting device production method, a lens molding resin sheet made of a light-transmissive resin is further stacked and positioned on the sealing resin sheet. Then, the lens molding resin sheet is pressurized against the sealing resin sheet via a lens molding mold provided with at least one lens molding recess which faces the respective plurality of cavities. This allows the at least one lens molding recess to be filled with a melted resin of the lens molding resin sheet.

Therefore, according to the light-emitting device production method, in a case where a resin of the lens molding resin sheet is cured while the resin is filled in the at least one lens molding recess, it is possible to simultaneously produce a plurality of light-emitting devices each further including a lens.

The light-emitting device production method in accordance with the present invention is preferably arranged such that: in the mounting step, a plurality of light-emitting elements included in the at least one light-emitting element are mounted on the substrate which has a plane surface; in the positioning step, the sealing resin sheet which is provided with a plurality of recesses in which the respective plurality of light-emitting elements mounted on the substrate can be contained is positioned, as the sealing member, on the substrate so that the plurality of light-emitting elements are contained in the respective plurality of recesses; in the melting step, the sealing resin sheet is pressurized, via a lens molding mold provided with lens molding recesses which face the respective plurality of light-emitting elements mounted on the substrate, so as to be filled in the lens molding recesses; and in the curing step, the silicone resin subjected to primary cross-linking and contained in the sealing member which has been filled in the lens molding recesses is totally cured.

According to the light-emitting device production method, a plurality of light-emitting elements included in the at least one light-emitting element are mounted on the substrate which has a plane surface; and the sealing resin sheet (sealing member) which is provided with a plurality of recesses in which the respective plurality of light-emitting elements mounted on the substrate can be contained is stacked and positioned on the substrate so that the plurality of light-emitting elements are contained in the respective plurality of recesses. Then, the sealing resin sheet is pressurized against the substrate via a lens molding mold provided with lens molding recesses which face the respective plurality of light-emitting elements mounted on the substrate. This allows the melted sealing member to be filled in the lens molding recesses, so that the silicone resin subjected to primary cross-linking and contained in the sealing member can be totally cured by secondary cross-linking in the lens molding recesses.

Therefore, according to the light-emitting device production method, it is possible to simultaneously produce a plurality of light-emitting devices in each of which the sealing member is molded to be lens-shaped.

The light-emitting device production method in accordance with the present invention is preferably arranged to further include: a placing step of placing a reflecting plate which is provided with a plurality of openings in which the at least one light-emitting elements can be contained, the plurality of openings each having at least an inner surface which has a reflecting function, wherein: in the mounting step, a plurality of light-emitting elements included in the at least one light-emitting element are mounted on the substrate which has a plane surface; in the placing step, the reflecting plate is placed on the substrate so that the plurality of light-emitting elements mounted on the substrate are contained in the respective plurality of openings; in the positioning step, the sealing resin sheet is positioned, as the sealing member, on the reflecting plate so as to cover all the plurality of openings provided in the reflecting plate placed on the substrate; in the melting step, the melted sealing member is pressurized so as to be filled in the plurality of openings; and in the curing step, the silicone resin subjected to primary cross-linking and contained in the sealing member which has been filled in the plurality of openings is totally cured.

According to the light-emitting device production method, the sealing resin sheet serving as the sealing member is positioned on the reflecting plate so as to cover all the plurality of openings provided in the reflecting plate. Then, the melted sealing member is heated while being pressurized so as to be filled in the plurality of openings, and the silicone resin subjected to primary cross-linking and contained in the sealing member which has been filled in the plurality of openings is totally cured. This allows the melted sealing member to be simultaneously filled in the plurality of openings, so that the plurality of light-emitting elements mounted in the respective plurality of openings can be simultaneously sealed.

Therefore, according to the light-emitting device production method, it is possible to simultaneously produce a plurality of light-emitting devices each of which has a reflecting function and has increased in efficiency with which light from a light-emitting element is used.

Further, as compared with a method for separately filling openings with a sealing member for each of the openings, the light-emitting device production method allows the sealing member that is filled in the plurality of openings to less vary in characteristic and/or amount for each of the plurality of openings. This can prevent a variation in characteristic among light-emitting devices.

The light-emitting device production method in accordance with the present invention is preferably arranged such that in the melting step, the sealing resin sheet is pressurized against the substrate with vacuum pressure.

According to the light-emitting device production method, the sealing resin sheet is heated while being pressurized against the substrate with vacuum pressure. This allows air to be exhausted from the plurality of cavities without fail, and allows prevention of air from entering the melted silicone resin.

The light-emitting device production method in accordance with the present invention is preferably arranged such that a vacuum heat pressing apparatus is used to heat and pressurize the sealing resin sheet.

According to the light-emitting device production method, a process for heating the sealing resin sheet under vacuum can be easily carried out in the vacuum heat pressing apparatus. This allows an increase in operation efficiency.

The light-emitting device production method in accordance with the present invention is preferably arranged such that the sealing resin sheet positioned in the positioning step includes sealing resin sheets which are stacked and contain the fluorescent material in different amounts.

According to the light-emitting device production method, a plurality of sealing resin sheets which contain the fluorescent material in different amounts are stacked. Therefore, a change in combination of sealing resin sheets makes it possible to easily control a concentration at which the fluorescent material is dispersed.

The light-emitting device production method in accordance with the present invention is preferably arranged such that a vacuum impregnating apparatus is used to heat and pressurize the sealing resin sheet.

According to the light-emitting device production method, a process for heating the sealing resin sheet at a high pressure can be easily carried out in the vacuum impregnating apparatus. This allows an increase in operation efficiency.

The light-emitting device production method in accordance with the present invention is preferably arranged such that: in the mounting step, the at least one light-emitting element is mounted in at least one cavity which is provided in the substrate so as to open upward; and in the positioning step, the sealing mixed powder is positioned, as the sealing member, in the at least one cavity in which the at least one light-emitting element is mounted.

According to the light-emitting device production method, in the positioning step, the sealing mixed powder is positioned, as the sealing member, in the at least one cavity in which the at least one light-emitting element is mounted. This makes it possible to easily equalize a concentration of a fluorescent material among light-emitting devices.

The light-emitting device production method in accordance with the present invention is preferably arranged such that the sealing mixed powder is compressed into a tablet.

As compared with a method in which the sealing mixed powder is used as it is, the light-emitting device production method is less likely to make a gap between powder of the silicone resin and the fluorescent material. This allows the silicone resin obtained after the heating to have a smaller degree of volume shrinkage.

Therefore, according to the light-emitting device production method, it is possible to further reduce a variation in chromaticity value among light-emitting devices and to increase handleability of the sealing mixed powder.

The light-emitting device production method in accordance with the present invention is preferably arranged such that: in the mounting step, the at least one light-emitting element is mounted in at least one cavity which is provided in the substrate so as to open upward; and in the positioning step, the sealing resin powder is positioned, as the sealing member, in the at least one cavity in which the at least one light-emitting element is mounted.

According to the light-emitting device production method, in the positioning step, the sealing resin powder is positioned, as the sealing member, in the at least one cavity in which the at least one light-emitting element is mounted. This makes it possible to easily equalize a concentration of a fluorescent material among light-emitting devices.

The light-emitting device production method in accordance with the present invention is preferably arranged such that the sealing resin powder is compressed into a tablet.

As compared with a method in which the sealing resin powder is used as it is, the light-emitting device production method is less likely to make a gap between silicone resins containing a fluorescent material. This allows the silicone resin obtained after the heating to have a smaller degree of volume shrinkage.

Therefore, according to the light-emitting device production method, it is possible to further reduce a variation in chromaticity value among light-emitting devices and to increase handleability of the sealing resin powder.

The light-emitting device production method in accordance with the present invention is preferably arranged such that in the melting step, the silicone resin is melted under a vacuum environment.

According to the light-emitting device production method, in the melting step, the silicone resin is melted under a vacuum environment. This allows deaeration of the silicone resin melted in the cavity 12.

Therefore, the light-emitting device production method allows an inner surface of the cavity and the totally cured silicone resin to be in closer contact to each other.

The present invention is not limited to the description of the embodiments above, but may be altered by a skilled person within the scope of the claims. An embodiment based on a proper combination of technical means disclosed in different embodiments is encompassed in the technical scope of the present invention.

For example, the present invention can be suitably used to produce light-emitting devices for use in, for example, (i) a display device and a lighting apparatus each including an LED as a light source; (ii) a backlight of, for example, a display; (iii) a signal; and (iv) a large display and an advertising sign each being used outside.

Reference Signs List
- 1*a* Light-emitting device
- 1*b* Light-emitting device
- 1*c* Light-emitting device
- 1*d* Light-emitting device
- 1*e* Light-emitting device
- 1*f* Light-emitting device
- 10 Multiple cavity circuit board (Substrate)
- 11 Circuit board (Substrate)
- 12 Cavity
- 12*a* Through hole
- 13 Light-emitting element
- 14, 54, 64, 74 Mounting wiring pattern
- 15, 65 Electroconductive adhesive
- 16, 56, 66, 76 Connection wiring pattern
- 17, 57, 67, 77*a*, 77*b* Electroconductive wire
- 20 Sealing resin sheet (Sealing member)

20a Through hole
20A First sealing resin sheet (Sealing resin sheet, Sealing member)
20B Second sealing resin sheet (Sealing resin sheet, Sealing member)
21 Sealing resin
24 Kneaded resin
25 Lens molding resin sheet
26 Sealing resin sheet (Sealing member)
26a Recess
31 Surface molding release sheet
32 Weight plate
33 Vacuum heating furnace
35 Vacuum heat pressing apparatus
35a Heater stand
35b Press heater
35e Lens molding groove (Lens molding recess)
35h Fixture recess
38a Vacuuming bag
38c Heating furnace
38d Vacuum pump
40 Vacuum heating apparatus
41 Upper chamber
42 Lower chamber
43 Diaphragm rubber
44, 79 Heating plate
50 Light-emitting display device (Light-emitting device)
53 Plane circuit board (Substrate)
58 Light-emitting element
58a Reflecting plate
58a Opening
60 Plane circuit board (Substrate)
61 Circuit board (Substrate)
63, 73 Light-emitting element
120 Sealing mixed powder (Sealing member)
121 Sealing resin powder (Sealing member)
122 Sealing resin tablet (Sealing mixed powder, Sealing resin powder, Sealing member)
123 Sealing mixed powder sheet (Sealing resin sheet, Sealing member)
132a Opening
$T_o$ Room Temperature
$T_1$ Secondary cross-linking temperature

The invention claimed is:

1. A light-emitting device production method comprising:
a mounting step of mounting, by wire bonding, at least one light-emitting element on a substrate;
a positioning step of positioning a sealing member so that the sealing member faces an upper surface of the at least one light-emitting element mounted in the mounting step, the sealing member being solid, maintaining a predetermined shape, and at least containing a silicone resin semi-cured by primary cross-linking and a fluorescent material;
a melting step of melting, by heating at a temperature lower than a secondary cross-linking temperature at which the silicone resin subjected to primary cross-linking is totally cured by secondary cross-linking, the sealing member being solid and positioned in the positioning step; and
a curing step of, while the sealing member melted in the melting step is in close contact with at least the upper surface of the at least one light-emitting element, heating the sealing member at a temperature equal to or higher than the secondary cross-linking temperature,
the silicone resin decreasing in viscosity reversibly in a temperature region between a room temperature and the temperature lower than the secondary cross-linking temperature, and being totally cured non-reversibly in a temperature region equal to or higher than the secondary cross-linking temperature.

2. A light-emitting device production method comprising:
a mounting step of mounting at least one light-emitting element on a substrate;
a positioning step of positioning a sealing member so that the sealing member faces an upper surface of the at least one light-emitting element mounted in the mounting step, the sealing member at least containing a silicone resin semi-cured by primary cross-linking and a fluorescent material;
a melting step of melting, by heating at a temperature lower than a secondary cross-linking temperature at which the silicone resin subjected to primary cross-linking is totally cured by secondary cross-linking, the sealing member positioned in the positioning step; and
a curing step of, while the sealing member melted in the melting step is in close contact with at least the upper surface of the at least one light-emitting element, heating the sealing member at a temperature equal to or higher than the secondary cross-linking temperature,
the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:
the sealing member positioned in the positioning step is sealing mixed powder in which powder of the silicone resin subjected to primary cross-linking and the fluorescent material are at least mixed.

3. The light-emitting device production method as set forth in claim 2, wherein powder of the silicone resin totally cured by secondary cross-linking is further mixed in the sealing mixed powder.

4. The light-emitting device production method as set forth in claim 1, wherein the sealing member positioned in the positioning step is a sealing resin sheet which is made of a sheet containing the fluorescent material and which at least contains the silicone resin subjected to primary cross-linking.

5. A light-emitting device production method comprising:
a mounting step of mounting at least one light-emitting element on a substrate;
a positioning step of positioning a sealing member so that the sealing member faces an upper surface of the at least one light-emitting element mounted in the mounting step, the sealing member at least containing a silicone resin semi-cured by primary cross-linking and a fluorescent material;
a melting step of melting, by heating at a temperature lower than a secondary cross-linking temperature at which the silicone resin subjected to primary cross-linking is totally cured by secondary cross-linking, the sealing member positioned in the positioning step; and
a curing step of, while the sealing member melted in the melting step is in close contact with at least the upper surface of the at least one light-emitting element, heating the sealing member at a temperature equal to or higher than the secondary cross-linking temperature,
the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is a sealing resin sheet which is made of a sheet containing the fluorescent material and which at least contains the silicone resin subjected to primary cross-linking; and the sealing resin sheet is obtained by forming, into a sheet, a kneaded resin obtained by kneading the fluorescent material with the silicone resin subjected to primary cross-linking and heated at the temperature lower than the secondary cross-linking temperature.

6. A light-emitting device production method comprising:

a mounting step of mounting at least one light-emitting element on a substrate;

a positioning step of positioning a sealing member so that the sealing member faces an upper surface of the at least one light-emitting element mounted in the mounting step, the sealing member at least containing a silicone resin semi-cured by primary cross-linking and a fluorescent material;

a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is a sealing resin sheet which is made of a sheet containing the fluorescent material and which at least contains the silicone resin subjected to primary cross-linking; and the sealing resin sheet is obtained by compressing, into a sheet, sealing mixed powder in which powder of the silicone resin subjected to primary cross-linking and the fluorescent material are at least mixed.

7. The light-emitting device production method as set forth in claim 6, wherein powder of the silicone resin totally cured by secondary cross-linking is further mixed in the sealing mixed powder.

8. A light-emitting device production method comprising:

a mounting step of mounting at least one light-emitting element on a substrate;

a positioning step of positioning a sealing member so that the sealing member faces an upper surface of the at least one light-emitting element mounted in the mounting step, the sealing member at least containing a silicone resin semi-cured by primary cross-linking and a fluorescent material;

a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is sealing resin powder which is made of powder of the silicone resin subjected to primary cross-linking and which contains the fluorescent material.

9. The light-emitting device production method as set forth in claim 8, wherein the sealing resin powder is obtained by pulverizing a kneaded resin obtained by kneading the fluorescent material with the silicone resin subjected to primary cross-linking and heated at the temperature lower than the secondary cross-linking temperature.

10. The light-emitting device production method as set forth in claim 4, wherein:

in the mounting step, the at least one light-emitting element is mounted in a respective plurality of cavities which are provided in the substrate so as to open upward;

in the positioning step, the sealing resin sheet is stacked, as the sealing member, on the substrate so as to cover all the plurality of cavities provided in the substrate;

in the melting step, the melted sealing member is pressurized so as to be filled in the plurality of cavities; and in the curing step, the silicone resin subjected to primary cross-linking and contained in the sealing member which has been filled in the plurality of cavities is totally cured.

11. The light-emitting device production method as set forth in claim 10, wherein the plurality of cavities provided in the substrate are provided with respective through holes.

12. A light-emitting device production method comprising:

a mounting step of mounting at least one light-emitting element on a substrate;

a positioning step of positioning a sealing member so that the sealing member faces an upper surface of the at least one light-emitting element mounted in the mounting step, the sealing member at least containing a silicone resin semi-cured by primary cross-linking and a fluorescent material;

a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is a sealing resin sheet which is made of a sheet containing the fluorescent material and which at least contains the silicone resin subjected to primary cross-linking;

in the mounting step, the at least one light-emitting element is mounted in a respective plurality of cavities which are provided in the substrate so as to open upward;

in the positioning step, the sealing resin sheet is stacked on the substrate so as to cover all the plurality of cavities provided in the substrate;

in the melting step, the melted sealing member is pressurized so as to be filled in the plurality of cavities;

in the curing step, the silicone resin subjected to primary cross-linking and contained in the sealing member which has been filled in the plurality of cavities is totally cured; and the sealing resin sheet is provided with through holes which face the respective plurality of cavities.

13. A light-emitting device production method comprising:

a mounting step of mounting at least one light-emitting element on a substrate;

positioning step of positioning a sealing member so that the sealing member faces an upper surface of the at least one light-emitting element mounted in the mounting step, the sealing member at least containing a silicone resin semi-cured by primary cross-linking and a fluorescent material;

a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is a sealing resin sheet which is made of a sheet containing the fluorescent material and which at least contains the silicone resin subjected to primary cross-linking;

in the mounting step, the at least one light-emitting element is mounted in a respective plurality of cavities which are provided in the substrate so as to open upward;

in the positioning step, the sealing resin sheet is stacked on the substrate so as to cover all the plurality of cavities provided in the substrate, and a surface molding release sheet having a surface provided with pearskin-finished unevenness is further stacked and positioned on the sealing resin sheet;

in the melting step, the melted sealing member is pressurized so as to be filled in the plurality of cavities; and in the curing step, the silicone resin subjected to primary cross-linking and contained in the sealing member is totally cured while the surface molding release sheet is in contact with a surface of the sealing member which has been filled in the plurality of cavities.

14. The light-emitting device production method as set forth in claim 10, wherein:

in the positioning step, a lens molding resin sheet made of a light-transmissive resin is further stacked and positioned on the sealing resin sheet; and in the melting step, the lens molding resin sheet is pressurized against the sealing resin sheet via a lens molding mold provided with at least one lens molding recess which faces the at least one light-emitting element mounted on the substrate.

15. A light-emitting device production method comprising:

a mounting step of mounting at least one light-emitting element on a substrate;

a positioning step of positioning a sealing member so that the sealing member faces an upper surface of the at least one light-emitting element mounted in the mounting step, the sealing member at least containing a silicone resin semi-cured by primary cross-linking and a fluorescent material;

a melting step of melting, by heating at a temperature lower than a secondary cross-linking temperature at which the silicone resin subjected to primary cross-linking is totally cured by secondary cross-linking, the sealing member positioned in the positioning step; and a curing step of, while the sealing member melted in the melting step is in close contact with at least the upper surface of the at least one light-emitting element, heating the sealing member at a temperature equal to or higher than the secondary cross-linking temperature, the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:

the sealing member positioned in the positioning step is a sealing resin sheet which is made of a sheet containing the fluorescent material and which at least contains the silicone resin subjected to primary cross-linking;

in the mounting step, a plurality of light-emitting elements included in the at least one light-emitting element are mounted on the substrate which has a plane surface;

in the positioning step, the sealing resin sheet which is provided with a plurality of recesses in which the respective plurality of light-emitting elements mounted on the substrate can be contained is positioned on the substrate so that the plurality of light-emitting elements are contained in the respective plurality of recesses;

in the melting step, the sealing resin sheet is pressurized, via a lens molding mold provided with lens molding recesses which face the respective plurality of light-emitting elements mounted on the substrate, so as to be filled in the lens molding recesses; and in the curing step, the silicone resin subjected to primary cross-linking and contained in the sealing member which has been filled in the lens molding recesses is totally cured.

16. The light-emitting device production method as set forth in claim 4, further comprising:

a placing step of placing a reflecting plate which is provided with a plurality of openings in which the at least one light-emitting elements can be contained, the plurality of openings each having at least an inner surface which has a reflecting function, wherein:

in the mounting step, a plurality of light-emitting elements included in the at least one light-emitting element are mounted on the substrate which has a plane surface;

in the placing step, the reflecting plate is placed on the substrate so that the plurality of light-emitting elements mounted on the substrate are contained in the respective plurality of openings;

in the positioning step, the sealing resin sheet is positioned, as the sealing member, on the reflecting plate so as to cover all the plurality of openings provided in the reflecting plate placed on the substrate;

in the melting step, the melted sealing member is pressurized so as to be filled in the plurality of openings; and
in the curing step, the silicone resin subjected to primary cross-linking and contained in the sealing member which has been filled in the plurality of openings is totally cured.

17. The light-emitting device production method as set forth in claim 10, wherein in the melting step, the sealing resin sheet is pressurized against the substrate with vacuum pressure.

18. The light-emitting device production method as set forth in claim 17, wherein a vacuum heat pressing apparatus is used to heat and pressurize the sealing resin sheet.

19. A light-emitting device production method comprising:
a mounting step of mounting at least one light-emitting element on a substrate;
a positioning step of positioning a sealing member so that the sealing member faces an upper surface of the at least one light-emitting element mounted in the mounting step, the sealing member at least containing a silicone resin semi-cured by primary cross-linking and a fluorescent material;
a melting step of melting, by heating at a temperature lower than a secondary cross-linking temperature at which the silicone resin subjected to primary cross-linking is totally cured by secondary cross-linking, the sealing member positioned in the positioning step; and
a curing step of, while the sealing member melted in the melting step is in close contact with at least the upper surface of the at least one light-emitting element, heating the sealing member at a temperature equal to or higher than the secondary cross-linking temperature,
the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:
the sealing member positioned in the positioning step is a sealing resin sheet which is made of a sheet containing the fluorescent material and which at least contains the silicone resin subjected to primary cross-linking; and
the sealing resin sheet positioned in the positioning step includes sealing resin sheets which are stacked and contain the fluorescent material in different amounts.

20. A light-emitting device production method comprising:
a mounting step of mounting at least one light-emitting element on a substrate;
a positioning step of positioning a sealing member so that the sealing member faces an upper surface of the at least one light-emitting element mounted in the mounting step, the sealing member at least containing a silicone resin semi-cured by primary cross-linking and a fluorescent material;
a melting step of melting, by heating at a temperature lower than a secondary cross-linking temperature at which the silicone resin subjected to primary cross-linking is totally cured by secondary cross-linking, the sealing member positioned in the positioning step; and
a curing step of, while the sealing member melted in the melting step is in close contact with at least the upper surface of the at least one light-emitting element, heating the sealing member at a temperature equal to or higher than the secondary cross-linking temperature,
the silicone resin decreasing in viscosity reversibly in a temperature region between a room temperature and the temperature lower than the secondary cross-linking temperature, and being totally cured non-reversibly in a temperature region equal to or higher than the secondary cross-linking temperature, wherein:
in the melting step, the sealing resin sheet is pressurized against the substrate with vacuum pressure; and
a vacuum impregnating apparatus is used to heat and pressurize the sealing resin sheet.

21. The light-emitting device production method as set forth in claim 2, wherein:
in the mounting step, the at least one light-emitting element is mounted in at least one cavity which is provided in the substrate so as to open upward; and
in the positioning step, the sealing mixed powder is positioned, as the sealing member, in the at least one cavity in which the at least one light-emitting element is mounted.

22. The light-emitting device production method as set forth in claim 21, wherein the sealing mixed powder is compressed into a tablet.

23. The light-emitting device production method as set forth in claim 8, wherein:
in the mounting step, the at least one light-emitting element is mounted in at least one cavity which is provided in the substrate so as to open upward; and
in the positioning step, the sealing resin powder is positioned, as the sealing member, in the at least one cavity in which the at least one light-emitting element is mounted.

24. The light-emitting device production method as set forth in claim 23, wherein the sealing resin powder is compressed into a tablet.

25. The light-emitting device production method as set forth in claim 21, wherein in the melting step, the silicone resin is melted under a vacuum environment.

* * * * *